US011024608B2

(12) United States Patent
Meitl et al.

(10) Patent No.: US 11,024,608 B2
(45) Date of Patent: Jun. 1, 2021

(54) STRUCTURES AND METHODS FOR ELECTRICAL CONNECTION OF MICRO-DEVICES AND SUBSTRATES

(71) Applicant: X Display Company Technology Limited, Dublin (IE)

(72) Inventors: Matthew Meitl, Durham, NC (US); Brook Raymond, Cary, NC (US); Ronald S. Cok, Rochester, NY (US); Christopher Andrew Bower, Raleigh, NC (US); Salvatore Bonafede, Chapel Hill, NC (US); Erich Radauscher, Raleigh, NC (US); Carl Ray Prevatte, Jr., Raleigh, NC (US); António José Marques Trindade, Cork (IE); Tanya Yvette Moore, Hurdle Mills, NC (US)

(73) Assignee: X Display Company Technology Limited, Dublin (IE)

( * ) Notice: Subject to any disclaimer, the term of this patent is extended or adjusted under 35 U.S.C. 154(b) by 221 days.

(21) Appl. No.: 16/039,191

(22) Filed: Jul. 18, 2018

(65) Prior Publication Data
US 2018/0323178 A1 Nov. 8, 2018

Related U.S. Application Data

(63) Continuation-in-part of application No. 15/937,450, filed on Mar. 27, 2018.
(Continued)

(51) Int. Cl.
*H01L 25/075* (2006.01)
*H01L 33/00* (2010.01)
(Continued)

(52) U.S. Cl.
CPC ...... *H01L 25/0753* (2013.01); *H01L 21/6835* (2013.01); *H01L 33/62* (2013.01);
(Continued)

(58) Field of Classification Search
CPC .......... H01L 21/6835; H01L 21/67144; H01L 25/0753; H01L 2221/68354;
(Continued)

(56) References Cited

U.S. PATENT DOCUMENTS 4,322,735 A    3/1982 Sadamasa et al.
4,330,329 A    5/1982 Hayashi et al.
(Continued)

FOREIGN PATENT DOCUMENTS

EP    1548571 A1    6/2005
GB    2 496 183 A   5/2013
(Continued)

OTHER PUBLICATIONS

Chesterfield, R. J. et al., 63.3:Multinozzle Printing: A Cost-effective Process for OLED Display Fabrication, SID 2009 Digest, vol. XL:Book II, 951-954.
(Continued)

*Primary Examiner* — David Sample
*Assistant Examiner* — Donald M Flores, Jr.
(74) *Attorney, Agent, or Firm* — Michael D. Schmitt; William R. Haulbrook; Choate, Hall & Stewart LLP

(57) ABSTRACT

An exemplary micro-device and substrate structure includes a destination substrate and one or more contact pads disposed thereon, a micro-device disposed on or over the destination substrate, and a layer of cured adhesive disposed on the destination substrate. The micro-device comprises at least one electrical contact. The at least one electrical contact is in direct electrical contact with the one or more contact pads. The adhesive layer adheres the micro-device to the
(Continued)

destination substrate and is in contact with the one or more contact pads. An exemplary method of making a micro-device and substrate structure includes providing a destination substrate and one or more contact pads disposed thereon, coating a layer of curable adhesive, disposing a micro-device comprising at least one electrical contact on the layer and curing the layer thereby directly electrically contacting the at least one electrical contact with the one or more contact pads.

19 Claims, 46 Drawing Sheets

Related U.S. Application Data

(60) Provisional application No. 62/477,834, filed on Mar. 28, 2017.

(51) Int. Cl.
*H01L 33/62* (2010.01)
*H01L 21/683* (2006.01)
*H01L 25/00* (2006.01)
*H01L 25/04* (2014.01)
*H01L 25/07* (2006.01)

(52) U.S. Cl.
CPC .......... *H01L 25/041* (2013.01); *H01L 25/072* (2013.01); *H01L 25/50* (2013.01); *H01L 33/0093* (2020.05); *H01L 33/0095* (2013.01); *H01L 2221/68354* (2013.01); *H01L 2221/68368* (2013.01); *H01L 2221/68381* (2013.01); *H01L 2933/0066* (2013.01)

(58) Field of Classification Search
CPC ... H01L 2221/68368; H01L 2221/6835; H01L 33/62; H01L 2221/68318; H01L 2221/68363; H01L 2221/68381; H01L 2933/0066; B65G 47/91; B32B 37/025; B32B 2457/14; Y10T 428/24
See application file for complete search history.

(56) References Cited

U.S. PATENT DOCUMENTS

| | | | |
|---|---|---|---|
| 4,591,659 A | 5/1986 | Leibowitz | |
| 5,173,759 A | 12/1992 | Anzaki et al. | |
| 5,550,066 A | 8/1996 | Tang et al. | |
| 5,563,470 A | 10/1996 | Li | |
| 5,621,555 A | 4/1997 | Park | |
| 5,625,202 A | 4/1997 | Chai | |
| 5,629,132 A | 5/1997 | Suzuki et al. | |
| 5,686,790 A | 11/1997 | Curtin et al. | |
| 5,739,800 A | 4/1998 | Lebby et al. | |
| 5,748,161 A | 5/1998 | Lebby et al. | |
| 5,780,933 A | 7/1998 | Ohmori et al. | |
| 5,815,303 A | 9/1998 | Berlin | |
| 5,821,571 A | 10/1998 | Lebby et al. | |
| 5,994,722 A | 11/1999 | Averbeck et al. | |
| 6,025,730 A | 2/2000 | Akram et al. | |
| 6,084,579 A | 7/2000 | Hirano | |
| 6,087,680 A | 7/2000 | Gramann et al. | |
| 6,142,358 A | 11/2000 | Cohn et al. | |
| 6,143,672 A | 11/2000 | Ngo et al. | |
| 6,169,294 B1 | 1/2001 | Biing-Jye et al. | |
| 6,184,477 B1 | 2/2001 | Tanahashi | |
| 6,278,242 B1 | 8/2001 | Cok et al. | |
| 6,392,292 B1 | 5/2002 | Morishita | |
| 6,392,340 B2 | 5/2002 | Yoneda et al. | |
| 6,403,985 B1 | 6/2002 | Fan et al. | |
| 6,410,942 B1 | 6/2002 | Thibeault et al. | |
| 6,422,716 B2 | 7/2002 | Henrici et al. | |
| 6,424,028 B1 | 7/2002 | Dickinson | |
| 6,466,281 B1 | 10/2002 | Huang et al. | |
| 6,504,180 B1 | 1/2003 | Heremans et al. | |
| 6,537,854 B1 * | 3/2003 | Chang | H01L 21/563 |
| | | | 257/737 |
| 6,577,367 B2 | 6/2003 | Kim | |
| 6,660,457 B1 | 12/2003 | Imai et al. | |
| 6,703,780 B2 | 3/2004 | Shiang et al. | |
| 6,717,560 B2 | 4/2004 | Cok et al. | |
| 6,756,576 B1 | 6/2004 | McElroy et al. | |
| 6,812,637 B2 | 11/2004 | Cok et al. | |
| 6,825,559 B2 | 11/2004 | Mishra et al. | |
| 6,828,724 B2 | 12/2004 | Burroughes | |
| 6,853,411 B2 | 2/2005 | Freidhoff et al. | |
| 6,897,855 B1 | 5/2005 | Matthies et al. | |
| 6,933,532 B2 | 8/2005 | Arnold et al. | |
| 6,936,855 B1 | 8/2005 | Harrah | |
| 6,969,624 B2 | 11/2005 | Iwafuchi et al. | |
| 6,975,369 B1 | 12/2005 | Burkholder | |
| 7,009,220 B2 | 3/2006 | Oohata | |
| 7,012,382 B2 | 3/2006 | Cheang et al. | |
| 7,091,523 B2 | 8/2006 | Cok et al. | |
| 7,098,589 B2 | 8/2006 | Erchak et al. | |
| 7,127,810 B2 | 10/2006 | Kasuga et al. | |
| 7,129,457 B2 | 10/2006 | McElroy et al. | |
| 7,169,652 B2 | 1/2007 | Kimura | |
| 7,195,733 B2 | 3/2007 | Rogers et al. | |
| 7,259,391 B2 | 8/2007 | Liu et al. | |
| 7,288,753 B2 | 10/2007 | Cok | |
| 7,394,194 B2 | 7/2008 | Cok | |
| 7,402,951 B2 | 7/2008 | Cok | |
| 7,420,221 B2 | 9/2008 | Nagai | |
| 7,466,075 B2 | 12/2008 | Cok et al. | |
| 7,479,731 B2 | 1/2009 | Udagawa | |
| 7,521,292 B2 | 4/2009 | Rogers et al. | |
| 7,557,367 B2 | 7/2009 | Rogers et al. | |
| 7,586,497 B2 | 9/2009 | Boroson et al. | |
| 7,605,053 B2 | 10/2009 | Couillard et al. | |
| 7,605,452 B2 | 10/2009 | Yamanaka et al. | |
| 7,622,367 B1 | 11/2009 | Nuzzo et al. | |
| 7,662,545 B2 | 2/2010 | Nuzzo et al. | |
| 7,687,812 B2 | 3/2010 | Louwsma et al. | |
| 7,704,684 B2 | 4/2010 | Rogers et al. | |
| 7,791,271 B2 | 9/2010 | Cok et al. | |
| 7,799,699 B2 | 9/2010 | Nuzzo et al. | |
| 7,816,856 B2 | 10/2010 | Cok et al. | |
| 7,834,541 B2 | 11/2010 | Cok | |
| 7,893,612 B2 | 2/2011 | Cok | |
| 7,919,342 B2 | 4/2011 | Cok | |
| 7,927,976 B2 | 4/2011 | Menard | |
| 7,932,123 B2 | 4/2011 | Rogers et al. | |
| 7,943,491 B2 | 5/2011 | Nuzzo et al. | |
| 7,969,085 B2 | 6/2011 | Cok | |
| 7,972,875 B2 | 7/2011 | Rogers et al. | |
| 7,982,296 B2 | 7/2011 | Nuzzo et al. | |
| 7,990,058 B2 | 8/2011 | Cok et al. | |
| 7,999,454 B2 | 8/2011 | Winters et al. | |
| 8,029,139 B2 | 10/2011 | Ellinger et al. | |
| 8,039,847 B2 | 10/2011 | Nuzzo et al. | |
| 8,198,621 B2 | 6/2012 | Rogers et al. | |
| 8,207,547 B2 | 6/2012 | Lin | |
| 8,243,027 B2 | 8/2012 | Hotelling et al. | |
| 8,261,660 B2 | 9/2012 | Menard | |
| 8,288,843 B2 | 10/2012 | Kojima et al. | |
| 8,309,385 B2 | 11/2012 | Matsunaga et al. | |
| 8,334,545 B2 | 12/2012 | Levermore et al. | |
| 8,367,539 B2 | 2/2013 | Sakurai | |
| 8,394,706 B2 | 3/2013 | Nuzzo et al. | |
| 8,440,546 B2 | 5/2013 | Nuzzo et al. | |
| 8,450,927 B2 | 5/2013 | Lenk et al. | |
| 8,470,701 B2 | 6/2013 | Rogers et al. | |
| 8,502,192 B2 | 8/2013 | Kwak et al. | |
| 8,506,867 B2 | 8/2013 | Menard | |
| 8,519,543 B1 | 8/2013 | Song et al. | |
| 8,531,642 B2 | 9/2013 | Kiryuschev et al. | |
| 8,558,243 B2 | 10/2013 | Bibl et al. | |
| 8,605,452 B2 | 12/2013 | Tang | |
| 8,664,699 B2 | 3/2014 | Nuzzo et al. | |
| 8,686,447 B2 | 4/2014 | Tomoda et al. | |

(56) References Cited

U.S. PATENT DOCUMENTS

| | | |
|---|---|---|
| 8,722,458 B2 | 5/2014 | Rogers et al. |
| 8,735,932 B2 | 5/2014 | Kim et al. |
| 8,754,396 B2 | 6/2014 | Rogers et al. |
| 8,766,970 B2 | 7/2014 | Chien et al. |
| 8,791,474 B1 | 7/2014 | Bibl et al. |
| 8,794,501 B2 | 8/2014 | Bibl et al. |
| 8,803,857 B2 | 8/2014 | Cok |
| 8,817,369 B2 | 8/2014 | Daiku |
| 8,835,940 B2 | 9/2014 | Hu et al. |
| 8,854,294 B2 | 10/2014 | Sakariya |
| 8,859,335 B2 | 10/2014 | Lee et al. |
| 8,860,051 B2 | 10/2014 | Fellows et al. |
| 8,877,648 B2 | 11/2014 | Bower et al. |
| 8,884,844 B2 | 11/2014 | Yang et al. |
| 8,889,485 B2 | 11/2014 | Bower |
| 8,895,406 B2 | 11/2014 | Rogers et al. |
| 8,902,152 B2 | 12/2014 | Bai et al. |
| 8,941,215 B2 | 1/2015 | Hu et al. |
| 8,946,760 B2 | 2/2015 | Kim |
| 8,987,765 B2 | 3/2015 | Bibl et al. |
| 9,048,407 B2 | 6/2015 | Koyama et al. |
| 9,105,714 B2 | 8/2015 | Hu et al. |
| 9,105,813 B1 | 8/2015 | Chang |
| 9,142,468 B2 | 9/2015 | Bower et al. |
| 9,153,171 B2 | 10/2015 | Sakariya et al. |
| 9,161,448 B2 | 10/2015 | Menard et al. |
| 9,178,123 B2 | 11/2015 | Sakariya et al. |
| 9,202,996 B2 | 12/2015 | Orsley et al. |
| 9,217,541 B2 | 12/2015 | Bathurst et al. |
| 9,308,649 B2 | 4/2016 | Golda et al. |
| 9,331,042 B2 | 5/2016 | Sakurai et al. |
| 9,355,854 B2 | 5/2016 | Meitl et al. |
| 9,358,775 B2 | 6/2016 | Bower et al. |
| 9,368,683 B1 | 6/2016 | Meitl et al. |
| 9,437,782 B2 | 9/2016 | Bower et al. |
| 9,444,015 B2 | 9/2016 | Bower et al. |
| 9,478,583 B2 | 10/2016 | Hu et al. |
| 9,484,504 B2 | 11/2016 | Bibl et al. |
| 9,496,155 B2 | 11/2016 | Menard et al. |
| 9,520,537 B2 | 12/2016 | Bower et al. |
| 9,537,069 B1 | 1/2017 | Bower et al. |
| 9,555,644 B2 | 1/2017 | Rogers et al. |
| 9,601,356 B2 | 3/2017 | Bower et al. |
| 9,626,908 B2 | 4/2017 | Sakariya et al. |
| 9,640,715 B2 | 5/2017 | Bower et al. |
| 9,741,785 B2 | 8/2017 | Bower et al. |
| 9,761,754 B2 | 9/2017 | Bower et al. |
| 9,765,934 B2 | 9/2017 | Rogers et al. |
| 9,865,832 B2 | 1/2018 | Bibl et al. |
| 9,899,329 B2 | 2/2018 | Bower |
| 9,899,465 B2 | 2/2018 | Bower et al. |
| 10,008,465 B2 | 6/2018 | Bower |
| 10,224,231 B2 | 3/2019 | Bower et al. |
| 10,395,966 B2 | 8/2019 | Bower et al. |
| 10,431,487 B2 | 10/2019 | Bower et al. |
| 10,468,398 B2 | 11/2019 | Bower et al. |
| 10,600,671 B2 | 3/2020 | Bower et al. |
| 10,784,177 B2 | 9/2020 | Sato |
| 2001/0022564 A1 | 9/2001 | Youngquist et al. |
| 2002/0096994 A1 | 7/2002 | Iwafuchi et al. |
| 2003/0211649 A1 | 11/2003 | Hirai et al. |
| 2004/0180476 A1 | 9/2004 | Kazlas et al. |
| 2004/0212296 A1 | 10/2004 | Nakamura et al. |
| 2004/0227704 A1 | 11/2004 | Wang et al. |
| 2004/0252933 A1 | 12/2004 | Sylvester et al. |
| 2005/0006657 A1 | 1/2005 | Terashita |
| 2005/0012076 A1 | 1/2005 | Morioka |
| 2005/0110161 A1 | 5/2005 | Naito et al. |
| 2005/0116324 A1 | 6/2005 | Yamaguchi |
| 2005/0116621 A1 | 6/2005 | Bellmann et al. |
| 2005/0140275 A1 | 6/2005 | Park |
| 2005/0168987 A1 | 8/2005 | Tamaoki et al. |
| 2005/0202595 A1 | 9/2005 | Yonehara et al. |
| 2005/0264472 A1 | 12/2005 | Rast |
| 2005/0275615 A1 | 12/2005 | Kahen et al. |
| 2005/0285246 A1 | 12/2005 | Haba et al. |
| 2006/0051900 A1 | 3/2006 | Shizuno |
| 2006/0055864 A1 | 3/2006 | Matsumura et al. |
| 2006/0063309 A1 | 3/2006 | Sugiyama et al. |
| 2006/0116046 A1 | 6/2006 | Morley et al. |
| 2007/0035340 A1 | 2/2007 | Kimura |
| 2007/0077349 A1 | 4/2007 | Newman et al. |
| 2007/0201056 A1 | 8/2007 | Cok et al. |
| 2007/0235849 A1 | 10/2007 | Othieno et al. |
| 2008/0006843 A1 | 1/2008 | Dai et al. |
| 2008/0108171 A1 | 5/2008 | Rogers et al. |
| 2008/0211734 A1 | 9/2008 | Huitema et al. |
| 2008/0224153 A1 | 9/2008 | Tomoda |
| 2008/0224254 A1 | 9/2008 | Couillard et al. |
| 2009/0023243 A1 | 1/2009 | Koyanagi |
| 2009/0053498 A1 | 2/2009 | Matsuura et al. |
| 2009/0085052 A1 | 4/2009 | Ko et al. |
| 2009/0194856 A1 | 8/2009 | Gomez |
| 2009/0278141 A1 | 11/2009 | Coe-Sullivan et al. |
| 2009/0278142 A1 | 11/2009 | Watanabe et al. |
| 2009/0315054 A1 | 12/2009 | Kim et al. |
| 2010/0060553 A1 | 3/2010 | Zimmerman et al. |
| 2010/0078670 A1 | 4/2010 | Kim et al. |
| 2010/0123134 A1 | 5/2010 | Nagata |
| 2010/0123268 A1 | 5/2010 | Menard |
| 2010/0148198 A1 | 6/2010 | Sugizaki et al. |
| 2010/0186883 A1 | 7/2010 | Tomoda |
| 2010/0190293 A1 | 7/2010 | Maeda et al. |
| 2010/0207852 A1 | 8/2010 | Cok |
| 2010/0214247 A1 | 8/2010 | Tang et al. |
| 2010/0248484 A1 | 9/2010 | Bower et al. |
| 2010/0252855 A1 | 10/2010 | Kamei |
| 2010/0258710 A1 | 10/2010 | Wiese et al. |
| 2010/0264816 A1 | 10/2010 | Cok |
| 2010/0289115 A1 | 11/2010 | Akiyama et al. |
| 2010/0315319 A1 | 12/2010 | Cok et al. |
| 2010/0317132 A1 | 12/2010 | Rogers et al. |
| 2011/0043435 A1 | 2/2011 | Hebenstreit et al. |
| 2011/0067911 A1 | 3/2011 | Ishikawa et al. |
| 2011/0108800 A1 | 5/2011 | Pan |
| 2011/0133324 A1 | 6/2011 | Fan et al. |
| 2011/0147715 A1 | 6/2011 | Rogers et al. |
| 2011/0211348 A1 | 9/2011 | Kim |
| 2011/0244225 A1 | 10/2011 | Hattori et al. |
| 2011/0315956 A1 | 12/2011 | Tischler et al. |
| 2012/0009738 A1 | 1/2012 | Crawford et al. |
| 2012/0080692 A1 | 4/2012 | Ohtorii |
| 2012/0119249 A1 | 5/2012 | Kim et al. |
| 2012/0141799 A1 | 6/2012 | Kub et al. |
| 2012/0223636 A1 | 9/2012 | Shin et al. |
| 2012/0223875 A1 | 9/2012 | Lau et al. |
| 2012/0228669 A1 | 9/2012 | Bower et al. |
| 2012/0256163 A1 | 10/2012 | Yoon et al. |
| 2012/0313241 A1 | 12/2012 | Bower |
| 2012/0314388 A1 | 12/2012 | Bower et al. |
| 2012/0319563 A1 | 12/2012 | Ishihara et al. |
| 2012/0320581 A1 | 12/2012 | Rogers et al. |
| 2013/0015483 A1 | 1/2013 | Shimokawa et al. |
| 2013/0036928 A1 | 2/2013 | Rogers et al. |
| 2013/0069275 A1 | 3/2013 | Menard et al. |
| 2013/0088416 A1 | 4/2013 | Smith et al. |
| 2013/0093103 A1 | 4/2013 | Kim et al. |
| 2013/0196474 A1 | 8/2013 | Meitl et al. |
| 2013/0207964 A1 | 8/2013 | Fleck et al. |
| 2013/0221355 A1 | 8/2013 | Bower et al. |
| 2013/0249138 A1 | 9/2013 | DeSimone et al. |
| 2013/0273695 A1 | 10/2013 | Menard et al. |
| 2013/0309792 A1 | 11/2013 | Tischler et al. |
| 2013/0328190 A1 | 12/2013 | Wu et al. |
| 2013/0333094 A1 | 12/2013 | Rogers et al. |
| 2014/0015072 A1 | 1/2014 | Kang |
| 2014/0104243 A1 | 4/2014 | Sakariya et al. |
| 2014/0138543 A1 | 5/2014 | LaVeigne |
| 2014/0146273 A1 | 5/2014 | Kim et al. |
| 2014/0159043 A1 | 6/2014 | Sakariya et al. |
| 2014/0159065 A1* | 6/2014 | Hu .............. H01L 33/0093 257/88 |
| 2014/0175498 A1 | 6/2014 | Lai |
| 2014/0183446 A1 | 7/2014 | Nago et al. |

(56) References Cited

U.S. PATENT DOCUMENTS

| | | | |
|---|---|---|---|
| 2014/0217448 A1 | 8/2014 | Kim et al. | |
| 2014/0231839 A1 | 8/2014 | Jeon et al. | |
| 2014/0231851 A1 | 8/2014 | Tsai et al. | |
| 2014/0264763 A1 | 9/2014 | Meitl et al. | |
| 2014/0267683 A1 | 9/2014 | Bibl et al. | |
| 2014/0306248 A1 | 10/2014 | Ahn et al. | |
| 2014/0319486 A1 | 10/2014 | Hong | |
| 2014/0339495 A1* | 11/2014 | Bibl | H01L 33/504 257/13 |
| 2014/0340900 A1 | 11/2014 | Bathurst et al. | |
| 2014/0367633 A1 | 12/2014 | Bibl et al. | |
| 2014/0367705 A1 | 12/2014 | Bibl et al. | |
| 2015/0008389 A1 | 1/2015 | Hu et al. | |
| 2015/0135525 A1 | 5/2015 | Bower | |
| 2015/0137153 A1 | 5/2015 | Bibl et al. | |
| 2015/0169011 A1 | 6/2015 | Bibl et al. | |
| 2015/0263066 A1 | 9/2015 | Hu et al. | |
| 2015/0280066 A1 | 10/2015 | Fujimura et al. | |
| 2015/0280089 A1 | 10/2015 | Obata et al. | |
| 2015/0371585 A1 | 12/2015 | Bower et al. | |
| 2015/0371974 A1 | 12/2015 | Bower et al. | |
| 2015/0372051 A1 | 12/2015 | Bower et al. | |
| 2015/0372052 A1 | 12/2015 | Bower et al. | |
| 2015/0372053 A1 | 12/2015 | Bower et al. | |
| 2015/0372187 A1 | 12/2015 | Bower et al. | |
| 2015/0372393 A1 | 12/2015 | Bower et al. | |
| 2015/0373793 A1 | 12/2015 | Bower et al. | |
| 2016/0005721 A1 | 1/2016 | Bower et al. | |
| 2016/0018094 A1 | 1/2016 | Bower et al. | |
| 2016/0064363 A1 | 3/2016 | Bower et al. | |
| 2016/0066789 A1 | 3/2016 | Rogers et al. | |
| 2016/0086855 A1 | 3/2016 | Bower et al. | |
| 2016/0093600 A1 | 3/2016 | Bower et al. | |
| 2016/0308103 A1 | 10/2016 | Hu et al. | |
| 2017/0025593 A1 | 1/2017 | Bower et al. | |
| 2017/0047393 A1 | 2/2017 | Bower et al. | |
| 2017/0187976 A1 | 6/2017 | Cok | |
| 2017/0206845 A1 | 7/2017 | Sakariya et al. | |
| 2017/0210117 A1 | 7/2017 | Rogers et al. | |
| 2017/0213803 A1 | 7/2017 | Bower | |
| 2017/0250167 A1 | 8/2017 | Bower et al. | |
| 2017/0256521 A1 | 9/2017 | Cok et al. | |
| 2017/0287789 A1 | 10/2017 | Bower et al. | |
| 2017/0309698 A1 | 10/2017 | Bower et al. | |
| 2017/0338374 A1 | 11/2017 | Zou et al. | |
| 2018/0130751 A1 | 5/2018 | Bower | |
| 2018/0138071 A1 | 5/2018 | Bower et al. | |
| 2018/0151664 A1 | 5/2018 | Bower et al. | |
| 2018/0226287 A1 | 8/2018 | Bower et al. | |
| 2018/0277504 A1 | 9/2018 | Bower | |
| 2018/0286734 A1 | 10/2018 | Meitl et al. | |
| 2019/0088526 A1 | 3/2019 | Bower et al. | |
| 2019/0123032 A1 | 4/2019 | Higginson et al. | |
| 2019/0221552 A1 | 7/2019 | Bower et al. | |
| 2019/0326149 A1 | 10/2019 | Bower et al. | |
| 2019/0385886 A1 | 12/2019 | Bower et al. | |
| 2020/0303294 A1 | 9/2020 | Chang et al. | |

FOREIGN PATENT DOCUMENTS

| | | |
|---|---|---|
| JP | H11-142878 A | 5/1999 |
| JP | 2011066130 A | 3/2011 |
| WO | WO-2006/027730 A1 | 3/2006 |
| WO | WO-2006/099741 A1 | 9/2006 |
| WO | WO-2008/103931 A2 | 8/2008 |
| WO | WO-2010/032603 A1 | 3/2010 |
| WO | WO-2010/102310 A2 | 9/2010 |
| WO | WO-2010/111601 A2 | 9/2010 |
| WO | WO-2010/132552 A1 | 11/2010 |
| WO | WO-2013/064800 A1 | 5/2013 |
| WO | WO-2013/165124 A1 | 11/2013 |
| WO | WO-2014/121635 A1 | 8/2014 |
| WO | WO-2014/149864 A1 | 9/2014 |
| WO | WO-2016/046283 A2 | 3/2016 |
| WO | WO-2017/144573 A1 | 8/2017 |
| WO | WO-2018/091459 A1 | 5/2018 |

OTHER PUBLICATIONS

Choi, H. W. et al., Efficient GaN-based Micro-LED Arrays, Mat. Res. Soc. Symp. Proc., 743:L6.28.1-L6.28.6 (2003).

Cok, R. S. et al., AMOLED displays with transfer-printed integrated circuits, Journal of the SID, 19(4):335-341, (2011).

Cok, R. S. et al., Inorganic light-emitting diode displays using micro-transfer printing, Journal of the SID, 25(10):589-609, (2017).

Elenius, Peter, Flip-Chip and Wire-Bond Interconnection Technologies, Chip Scale Review, Jul./Aug.:81-87 (2000).

Hamer et al., 63.2: AMOLED Displays Using Transfer-Printed Integrated Circuits, SID 09 Digest, 40(2):947-950 (2009).

Lee, M. S. et al., Optimization of copper pillar bump design for fine pitch flip-chip packages, Microsystems, Packaging, Assembly and Circuits Technology Conference 2009, IMPACT 2009, 4th International, pp. 128-131.

Lee, S. H. etal, Laser Lift-Off of GaN Thin Film and its Application to the Flexible Light Emitting Diodes, Proc. of SPIE 8460:846011-1-846011-6 (2012).

Lu, N. et al., Bio-Integrated Electronics, IEEE International Conference on IC Design & Technology, DOI: 10.1109/ICICDT.2014.6838615, IEEE May 28, 2014, [retrieved on Jun. 17, 2014] pp. 1-5 (2014).

Ohno, Y. and Ohzeki, Y., Development of Ultrathin Bonding Wire for Fine Pitch Bonding, Nippon Steel Technical Report 59:1-5 (1993).

Poher, V. et al., Micro-LED arrays: a tool for two-dimensional neuron stimulation, J. Phys. D: Appl. Phys. 41:094014 (2008).

Roscher, H., VCSEL Arrays with Redundant Pixel Designs for 10Gbits/s 2-D Space-Parallel MMF Transmission, Annual Report, optoelectronics Department, (2005).

Yaniv et al., A 640 x 480 Pixel Computer Display Using Pin Diodes with Device Redundancy, 1988 International Display Research Conference, IEEE, CH-2678-1/88:152-154 (1988).

Bower, C. A. et al., Micro-Transfer-Printing: Heterogeneous Integration of Microscale Semiconductor Devices using Elastomer Stamps, 2014 IEEE Sensors, 3 pages and 1 page IEEE Xplore abstract, date of conference: Nov. 2-5, 2014.

Bower, C. A. et al., Transfer Printing: An Approach for Massively Parallel Assembly of Microscale Devices, IEEE, Electronic Components and Technology Conference, 2008, pp. 1105-1109.

Cok, R. S. et al., 60.3: AMOLED Displays Using Transfer-Printed Integrated Circuits, Society for Information Display, 10:902-904, (2010).

Feng, X. et al., Competing Fracture in Kinetically Controlled Transfer Printing, Langmuir, 23(25):12555-12560, (2007).

Gent, A.N., Adhesion and Strength of Viscoelastic Solids. Is There a Relationship between Adhesion and Bulk Properties?, American Chemical Society, Langmuir, 12(19):4492-4496, (1996).

Kim, Dae-Hyeong et al., Optimized Structural Designs for Stretchable Silicon Integrated Circuits, Small, 5(24):2841-2847, (2009).

Kim, Dae-Hyeong et al., Stretchable and Foldable Silicon Integrated Circuits, Science, 320:507-511, (2008).

Kim, S. et al., Microstructural elastomeric surfaces with reversible adhesion and examples of their use in deterministic assembly by transfer printing, PNAS, 107(40):17095-17100 (2010).

Kim, T. et al., Kinetically controlled, adhesiveless transfer printing using microstructured stamps, Applied Physics Letters, 94(11):113502-1-113502-3, (2009).

Meitl, M. A. et al., Transfer printing by kinetic control of adhesion to an elastomeric stamp, Nature Material, 5:33-38, (2006).

Michel, B. et al., Printing meets lithography: Soft approaches to high-resolution patterning, J. Res. & Dev. 45(5):697-708, (2001).

Trindade, A.J. et al., Precision transfer printing of ultra-thin AlInGaN micron-size light-emitting diodes, Crown, pp. 217-218, (2012).

(56) References Cited

OTHER PUBLICATIONS

Non Final Rejection issued in U.S. Appl. No. 16/532,591, filed Aug. 6, 25 pages, (dated Oct. 9, 2020).

* cited by examiner

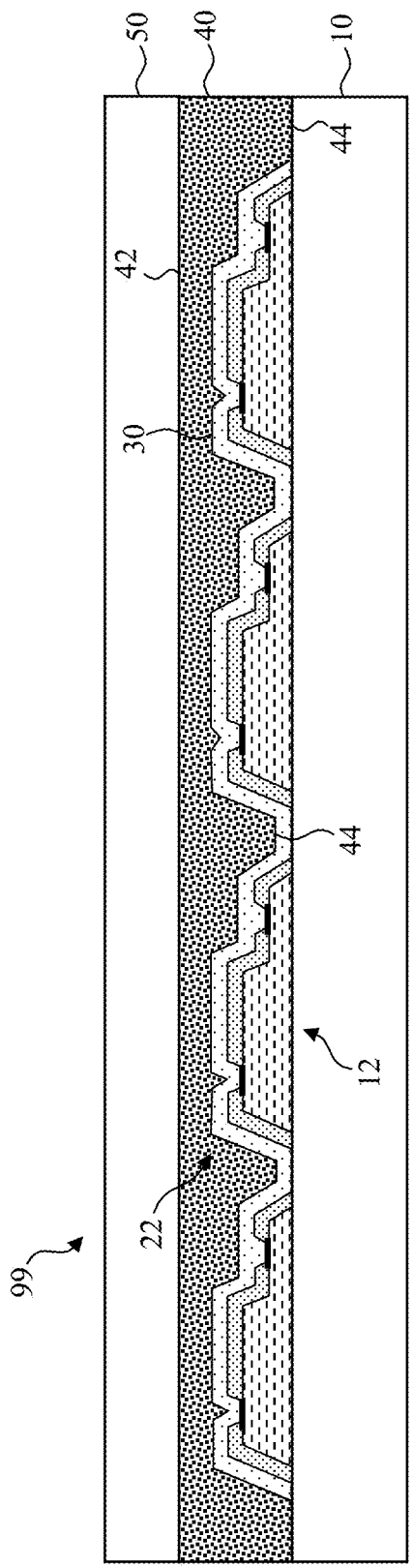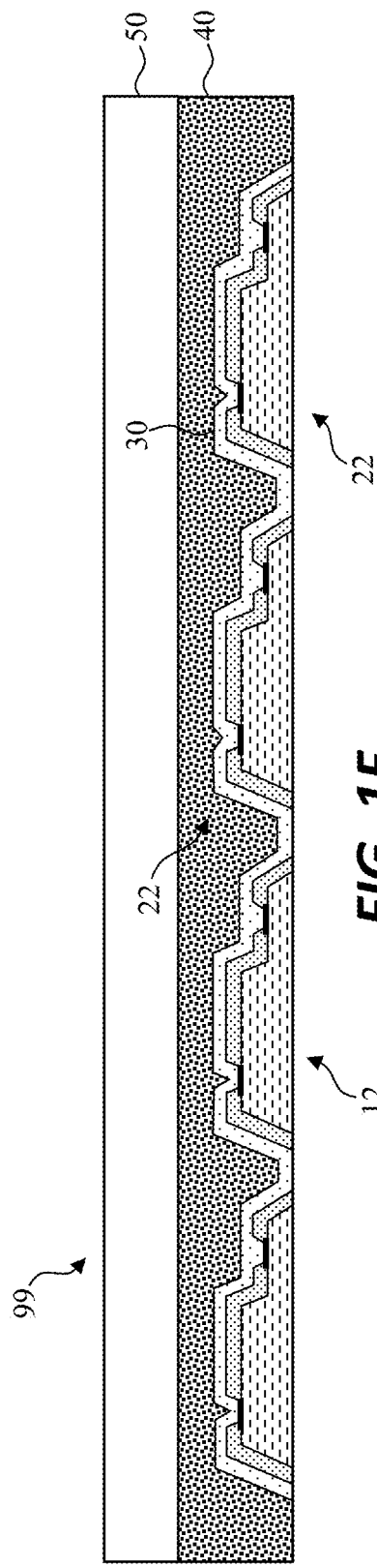

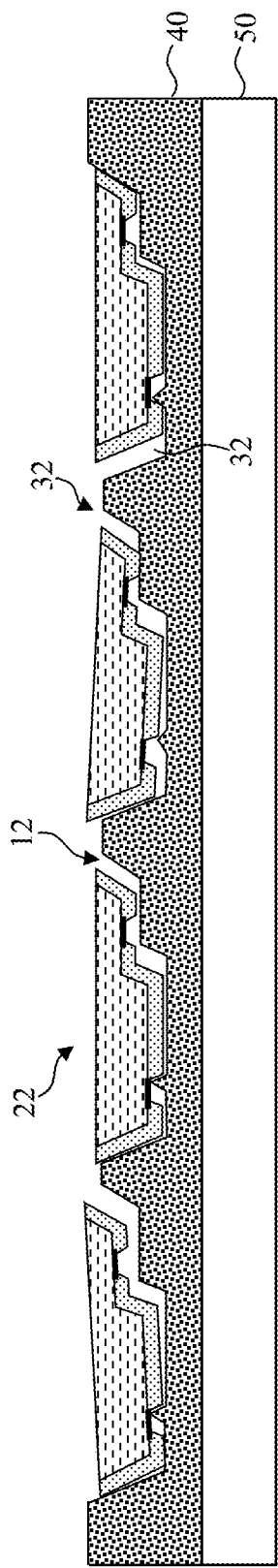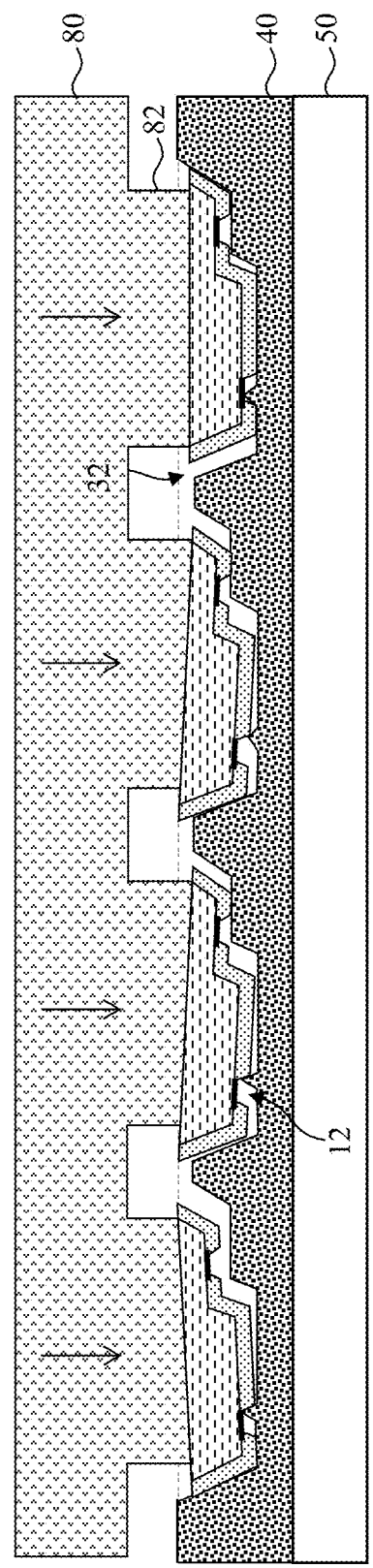

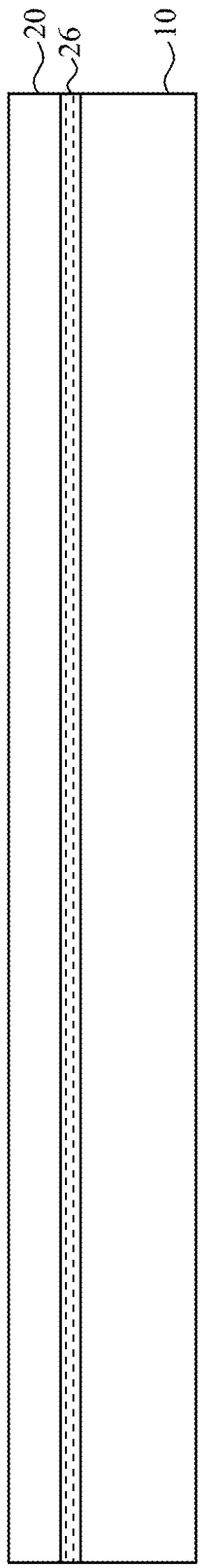
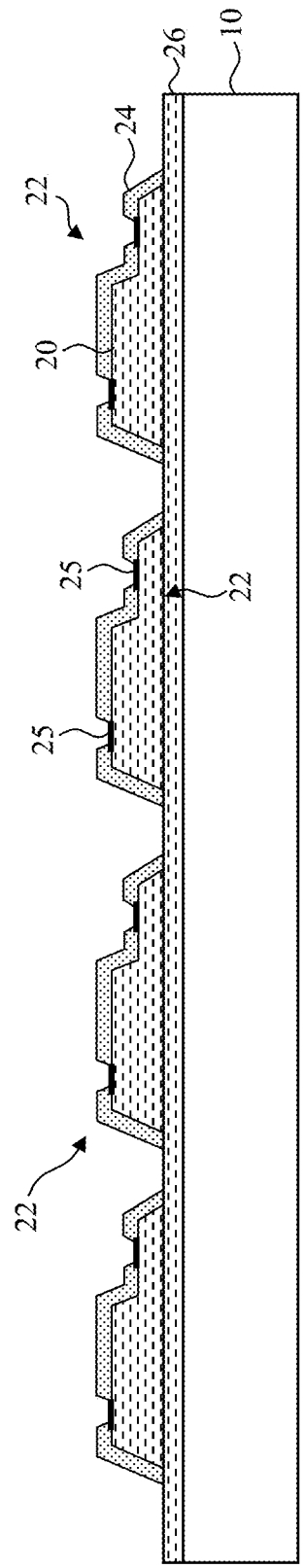

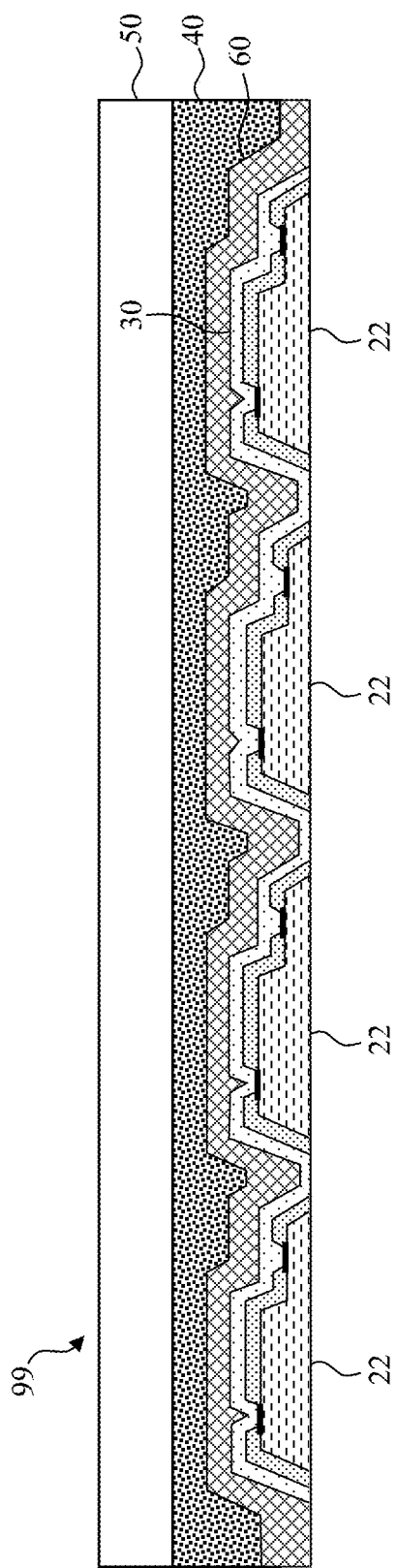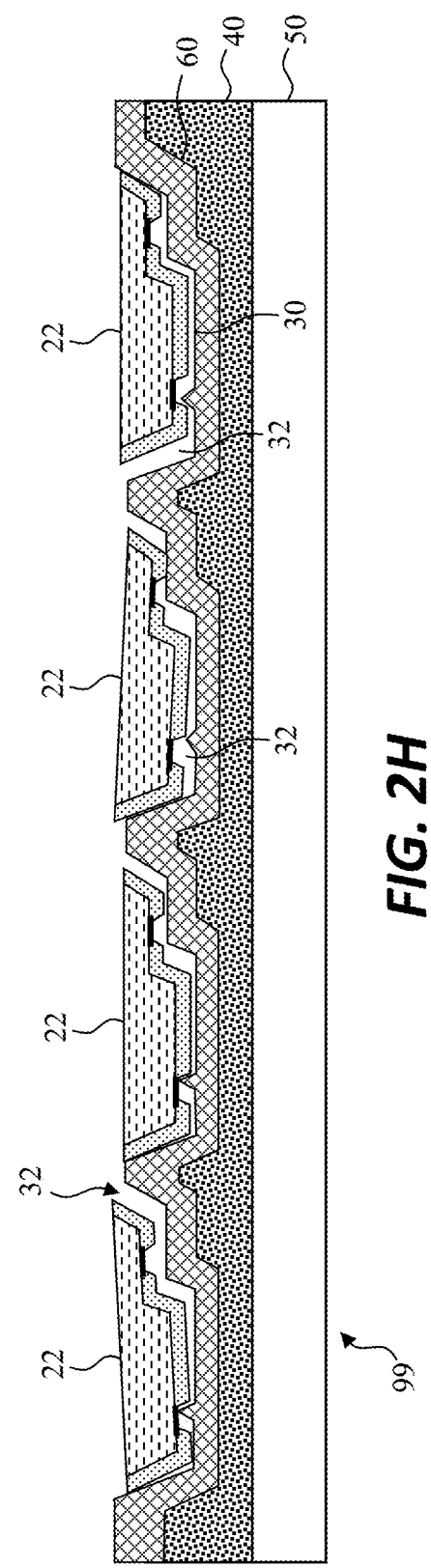

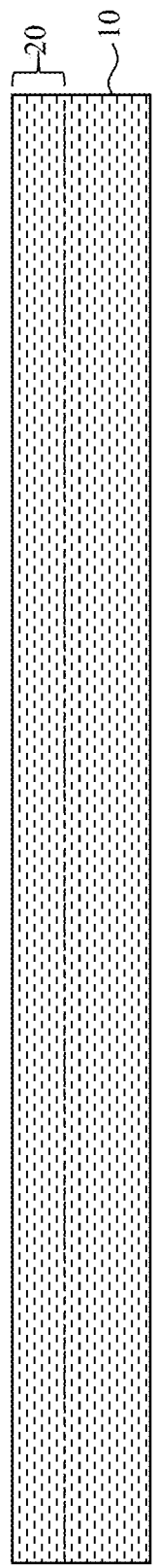
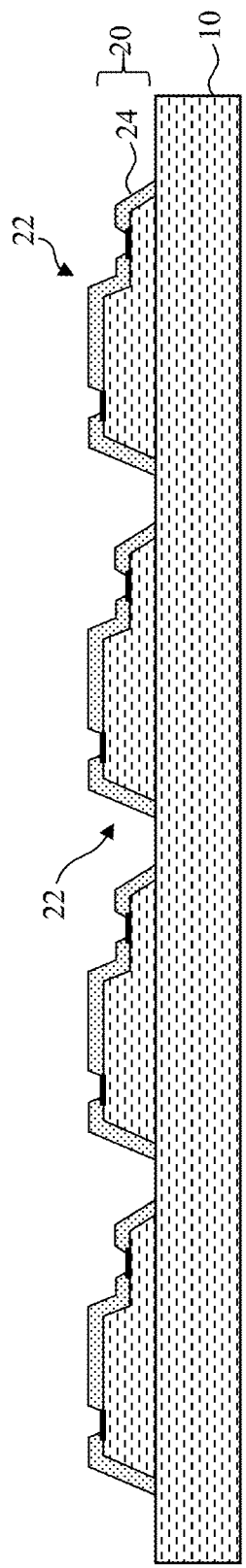

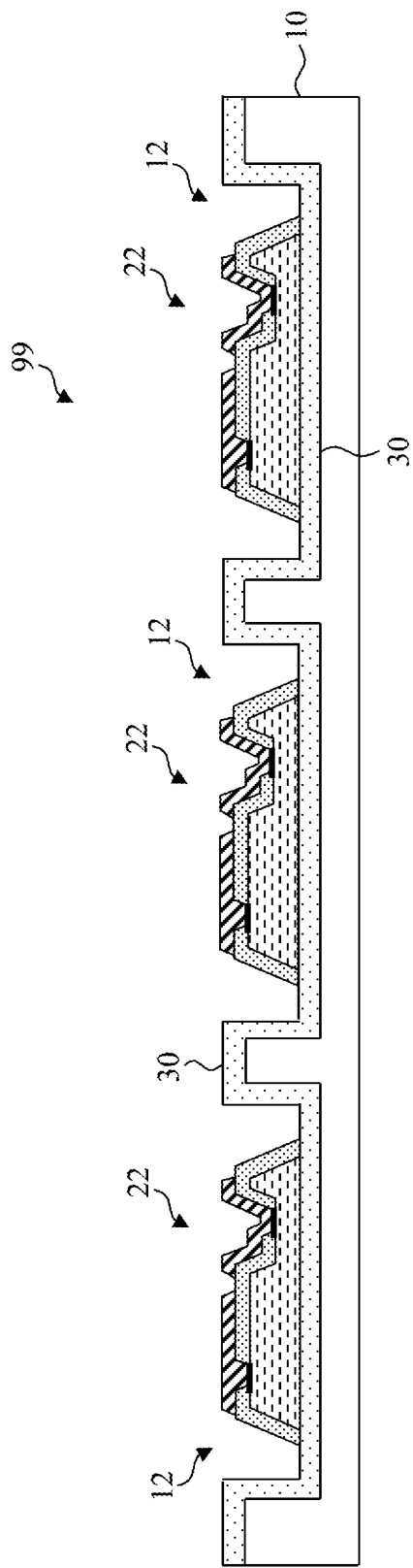
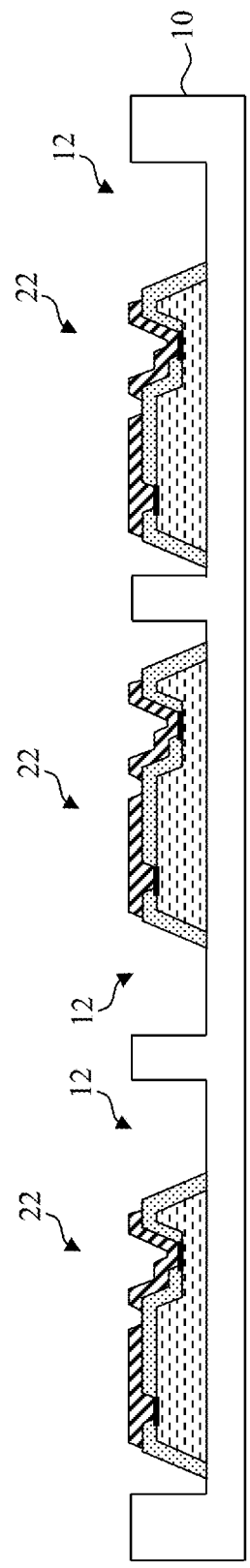
FIG. 8A
FIG. 8B

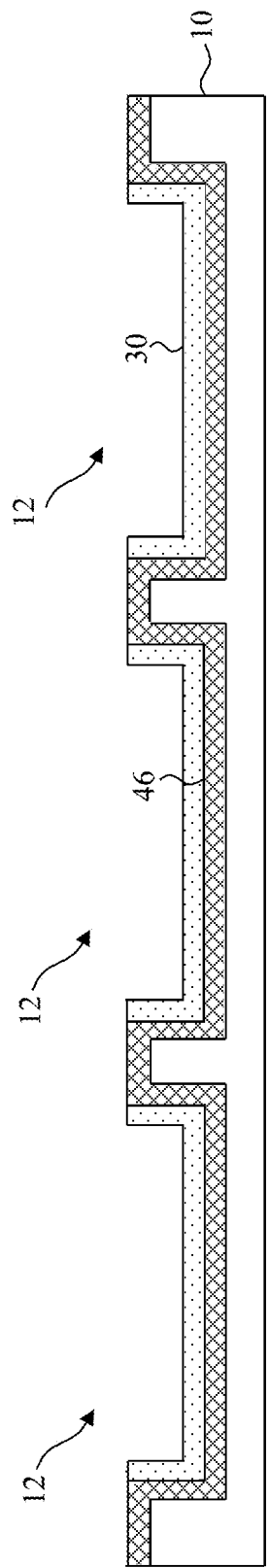
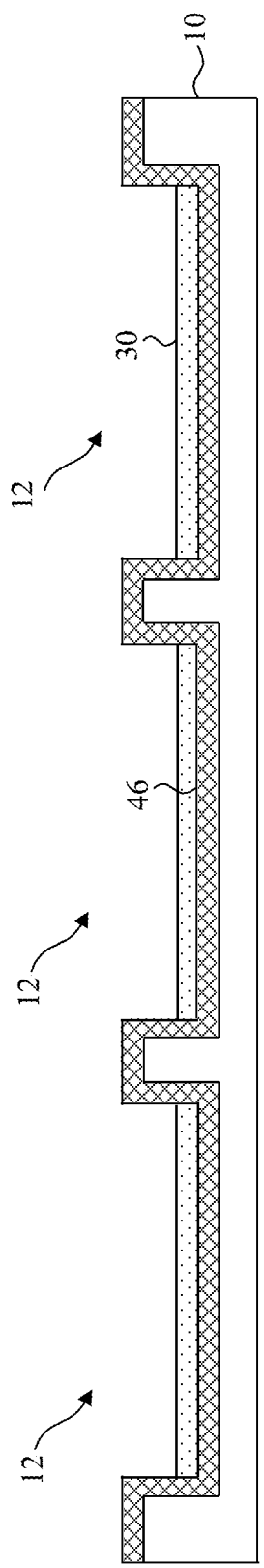
FIG. 9A
FIG. 9B

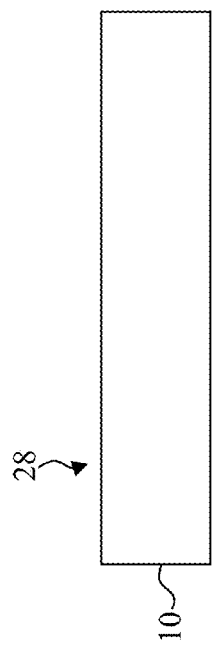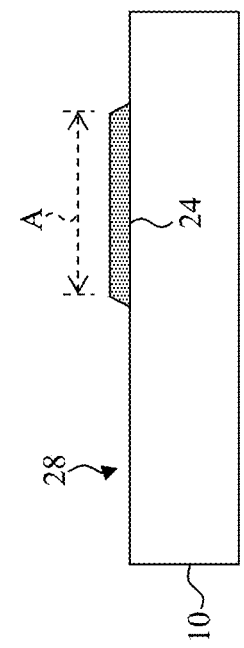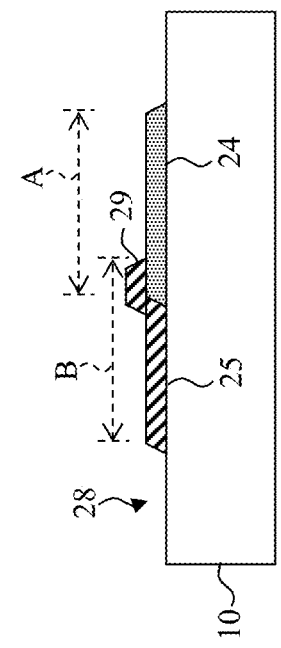

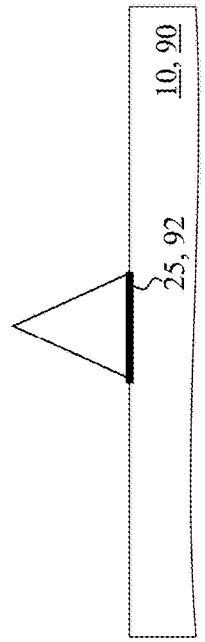
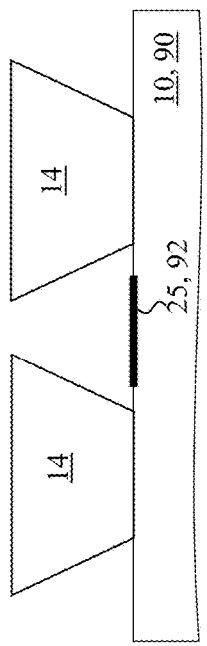 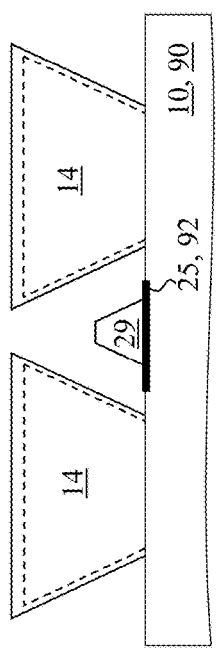 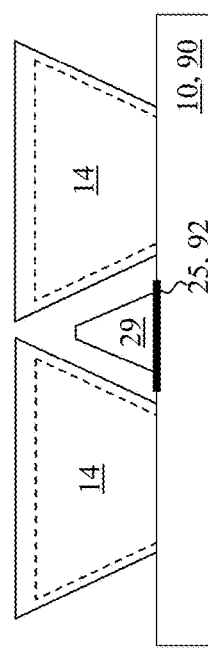 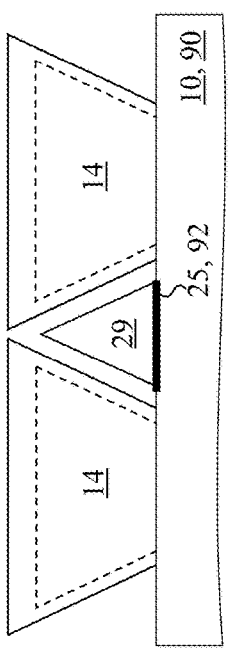

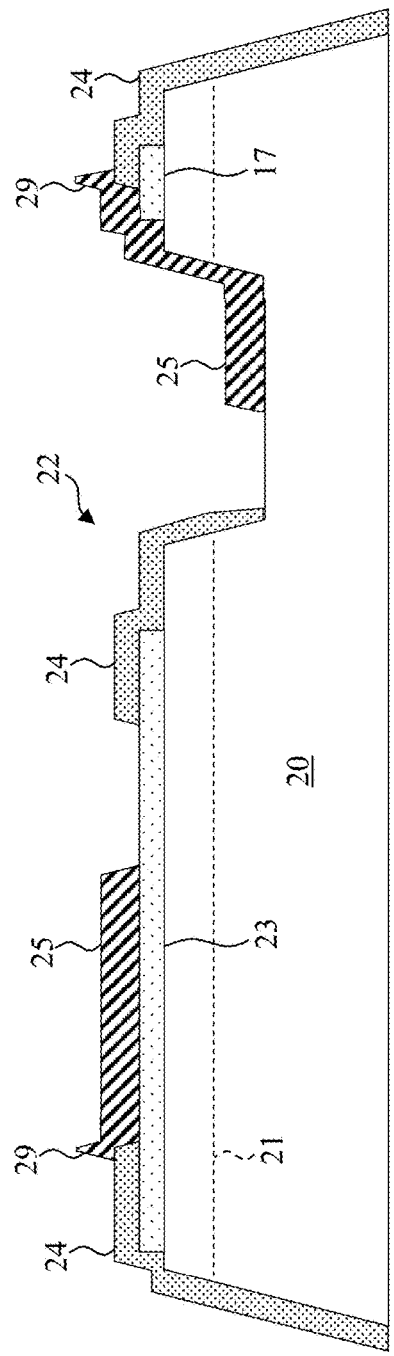
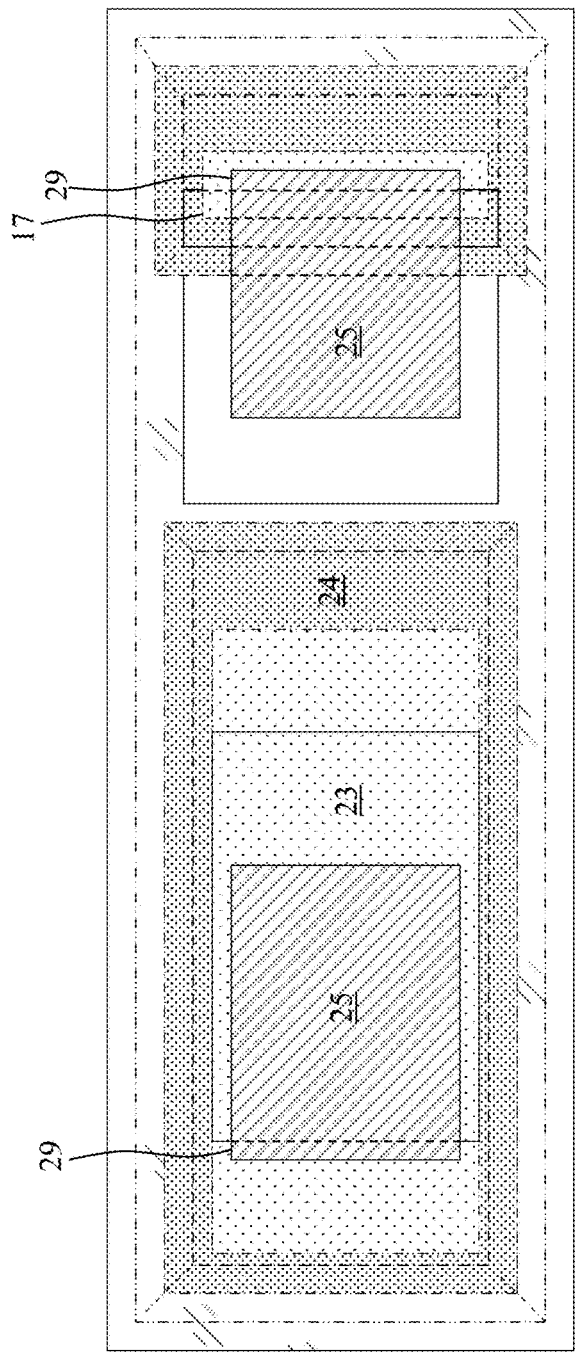
FIG. 14A
FIG. 14B

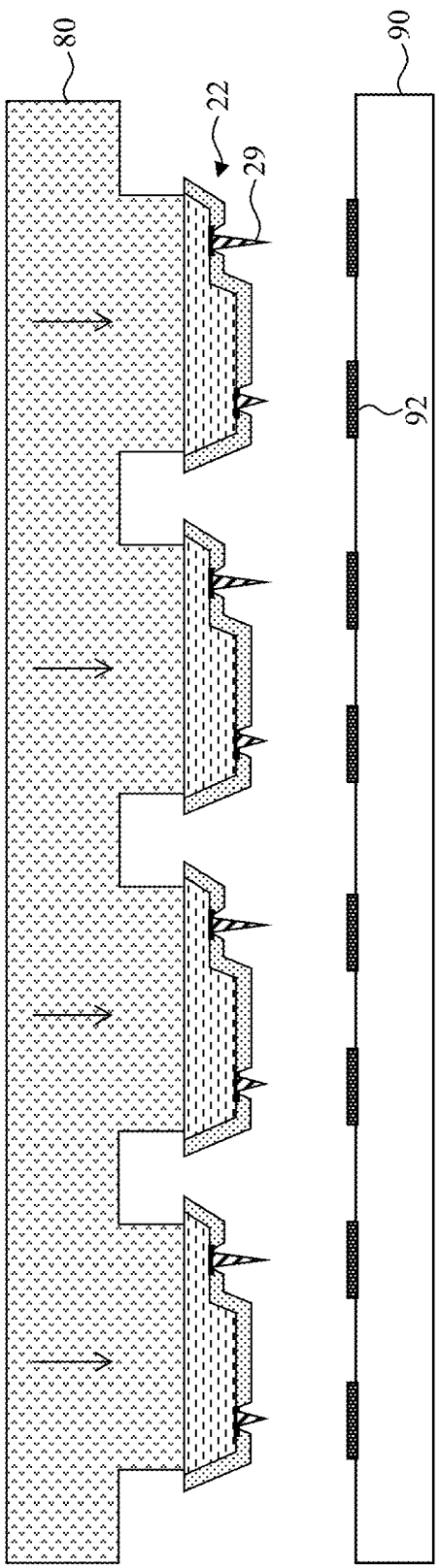
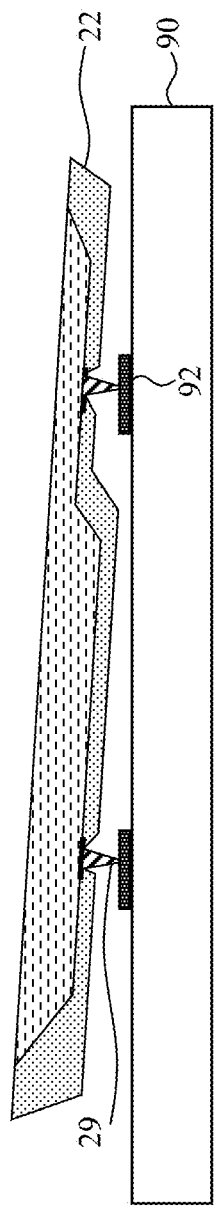

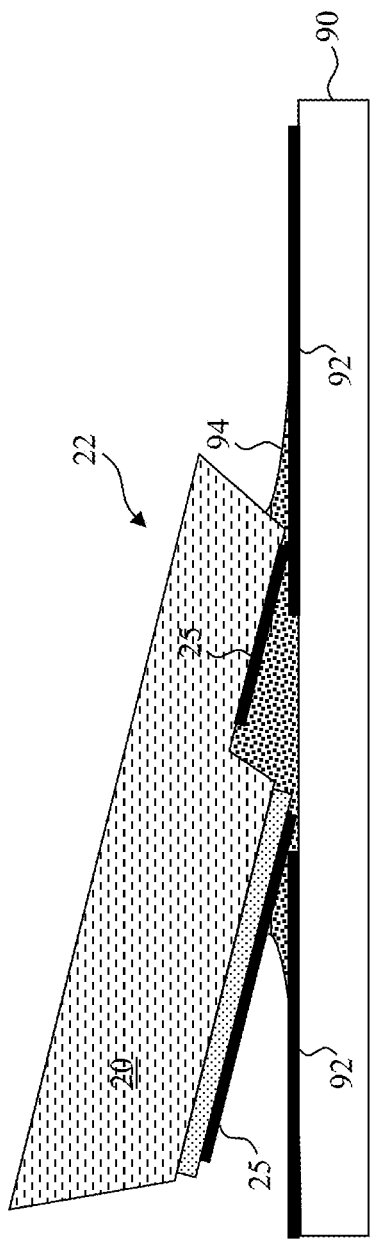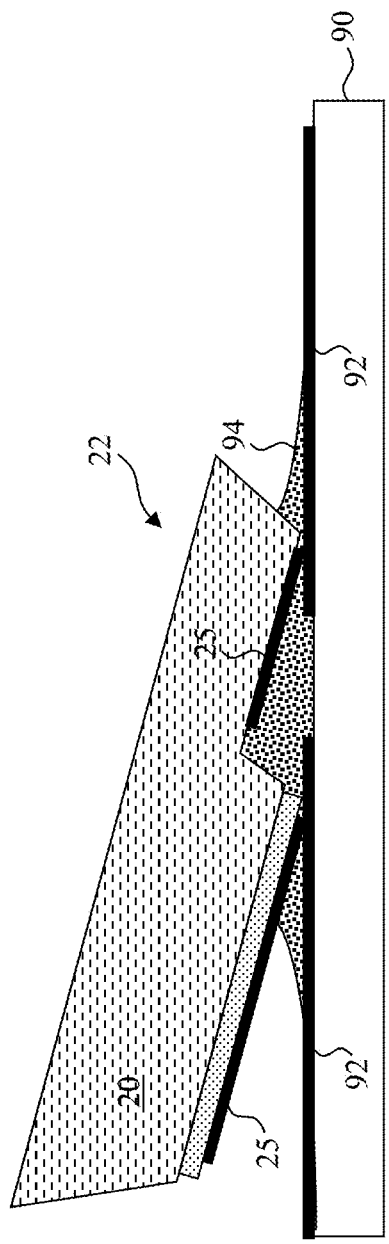
FIG. 18E
FIG. 18F

STRUCTURES AND METHODS FOR ELECTRICAL CONNECTION OF MICRO-DEVICES AND SUBSTRATES

CROSS REFERENCE TO RELATED APPLICATIONS

This application is a continuation-in-part of U.S. patent application Ser. No. 15/937,450, filed on Mar. 27, 2018, entitled Micro-Device Pockets for Transfer Printing, the disclosure of which is hereby incorporated by reference herein in its entirety. U.S. patent application Ser. No. 15/937,450 (and this application) claims the benefit of U.S. Provisional Patent Application No. 62/477,834, filed Mar. 28, 2017, entitled Micro-Device Pocket for Transfer Printing, pp. 4-57 of which are hereby incorporated by reference.

Reference is made to U.S. Provisional Patent Application No. 62/422,365 filed Nov. 15, 2016, entitled Micro-Transfer-Printable Flip-Chip Structure and Method, the contents of which are incorporated by reference herein in their entirety. U.S. patent application Ser. No. 15/811,959, filed Nov. 14, 2017, entitled Micro-Transfer-Printable Flip-Chip Structures and Methods, claims the benefit of Provisional U.S. Patent Application No. 62/422,365. U.S. patent application Ser. No. 15/811,959 is hereby incorporated by reference in its entirety.

TECHNICAL FIELD

The present invention relates generally to structures and methods for providing micro-integrated circuits on substrates that can be printed using massively parallel transfer printing methods (e.g., micro-transfer printing methods).

BACKGROUND

Integrated circuits (ICs) are widely used in electronic devices. Integrated circuits are typically formed on a semiconductor wafer using photolithographic processes and then packaged, for example in a ceramic or plastic package, with pins or bumps on the package providing externally accessible electrical connections to the integrated circuit. An unpackaged integrated circuit is often referred to as a die. Each die typically has electrical contact pads on the top of the integrated circuit that are electrically connected to electronic circuits in the integrated circuit. The die is placed in a cavity in the package, the electrical contact pads are wire-bonded to the package pins or bumps, and the package is sealed. Frequently, multiple identical devices are formed in the semiconductor wafer and the wafer is cut (for example by scribing-and-breaking or by sawing the wafer) into separate integrated circuit dies that are each individually packaged. The packages are then mounted and electrically connected on a printed circuit board to make an electronic system.

In an alternative flip-chip approach, small spheres of solder (solder bumps) are deposited on the integrated circuit contact pads and the integrated circuit is flipped over so that the top side of the die with the solder bumps is located adjacent to the package or other destination substrate. This approach is particularly useful for packages such as pin-grid array packages because they can require less space than a wire-bond process. However, flipping the integrated circuit over can be difficult for very small integrated circuits having dimensions in the range of microns. Such small integrated circuit dies are not easily handled without loss or damage using conventional pick-and-place or vacuum tools.

In some applications, the bare integrated circuit dies are not separately packaged but are placed on a destination substrate and electrically connected on the destination substrate, for example using photolithographic or printed-circuit board methods, to form an electronic system. However, as with flip-chip handling, this can be difficult to accomplish when the integrated circuit dies are small. Nonetheless, an efficient method of transferring bare dies from a relatively small and expensive source substrate (e.g., crystalline semiconductor) to a relatively large and inexpensive destination substrate (e.g., amorphous glass or plastic) is very desirable, since the integrated circuits can provide much higher data processing efficiency than thin-film semiconductor structures formed on large substrates.

One approach to handling and placing small integrated circuits (chiplets) uses micro-transfer printing, for example as described in U.S. Pat. Nos. 8,722,458, 7,622,367 and 8,506,867, each of which is hereby incorporated by reference in its entirety. In exemplary embodiments of these methods, an integrated circuit is formed on a source wafer, for example a semiconductor wafer, and undercut by etching a gap between a bottom side of the integrated circuit and the wafer. A stamp contacts a top side of the integrated circuit to adhere the integrated circuit to the stamp, the stamp and integrated circuit are transported to a destination substrate, for example a glass or plastic substrate, the integrated circuit is contacted and adhered to the destination substrate, and the stamp removed to "print" the integrated circuit from the source wafer to the destination substrate. Multiple integrated circuits can be "printed" in a common step with a single stamp. The integrated circuits can then be electrically connected using conventional photolithographic or printed-circuit board methods, or both. This technique has the advantage of locating many (e.g., tens of thousands to millions) small integrated circuit devices on a destination substrate in a single print step. For example, U.S. Pat. No. 8,722,458 teaches transferring light-emitting, light-sensing, or light-collecting semiconductor elements from a wafer substrate to a destination substrate using a patterned elastomer stamp whose spatial pattern matches the location of the semiconductor elements on the wafer substrate.

In another method, a handle substrate is adhered to the side of the integrated circuits opposite the wafer (the top side), the wafer is removed, for example by grinding, the integrated circuits are adhered to the destination substrate, and the handle substrate is removed. In yet another variation, the handle substrate is the destination substrate and is not removed. In this case, the integrated circuit is flipped over so that the top side of the integrated circuit is adhered to the destination substrate.

In yet another method, epitaxial semiconductor layers are formed on a growth substrate, for example a sapphire substrate. A handle substrate is adhered to the top side of the semiconductor layers opposite the growth substrate, and the growth substrate is removed. The flipped semiconductor layers are then processed to form the integrated circuits. For example, U.S. Pat. No. 6,825,559 describes such a method to make light emitting diodes.

None of these flip-chip methods form a flipped integrated circuit that can be micro-transfer printed. Moreover, GaN micro-LEDs are typically formed on sapphire substrates since sapphire has a smaller crystal lattice mismatch with GaN than other materials, such as silicon. Thus, it is desirable to form printable integrated circuit structures, such as micro-LEDs, using a sapphire substrate. However, there is no known available method in the art for reliably undercutting a chiplet formed on a sapphire substrate to enable release of the chiplet without damaging the chiplet (e.g., for micro-transfer printing).

There is a need, therefore, for wafer and integrated circuit structures and methods that provide micro-transfer printable integrated circuits and for structures and methods that enable the construction of micro-LED chiplets formed on various substrate, including sapphire, that can be micro-transfer printed. There is also a need for simple and inexpensive methods and structures having a reduced area on a source wafer.

SUMMARY

A method of micro-transfer printing a micro-device from a support substrate comprises providing the micro-device, forming a pocket in or on the support substrate, providing a release layer over the micro-device or the pocket, optionally providing a base layer on a side of the release layer opposite the micro-device, disposing the micro-device in the pocket with the release layer between the micro-device and the support substrate so that no portion of the support substrate or the optional base layer is in contact with the micro-device, etching the release layer to completely separate and detach the micro-device from the support substrate or the optional base layer, providing a stamp having a conformable stamp post and pressing the stamp post against the separated micro-device to adhere the micro-device to the stamp post, and removing the stamp and micro-device from the support substrate. A surface of the micro-device can be exposed before etching the release layer.

In some embodiments, the micro-device is provided on a source substrate, the release layer is disposed on a side of the micro-device opposite the source substrate, the base layer is optionally formed on a side of the release layer opposite the micro-device, the support substrate is adhered to the release layer or optional base layer with a conformable adhesive to form the pocket with the micro-device disposed in the pocket and the release layer between the micro-device and the adhesive, and the source substrate is removed. The release layer, the optional base layer, or both, can be patterned, the source wafer can be removed with laser lift off, and the adhesive can be cured.

In some embodiments, the pocket is formed in or on the support substrate, a base layer is optionally formed in the pocket, the release layer is provided in the pocket on the support substrate or the optional base layer, and a micro-device is disposed at least partially in the pocket on the release layer. The release layer, the optional base layer, or both, can be patterned or the pocket can be formed by etching the support substrate. In some embodiments, the support substrate can be coated with a curable material, imprinted, and cured to form the pocket. In another approach, the curable material is cured and etched to form the pocket. The pocket can extend to the support substrate. The micro-device material can be deposited in the pocket and patterned in the pocket to form the micro-device.

In some embodiments of the present invention, a micro-transfer printable micro-device structure comprises a support substrate, an adhesive layer having pockets provided on or over the support substrate, an optional base layer provided in the pocket and on a side of the adhesive layer opposite the support substrate, a release layer provided in the pocket and on a side of the adhesive layer or the optional base layer opposite the support substrate, and the micro-device disposed at least partially in the pocket with the release layer between the micro-device and the support substrate so that no portion of the support substrate or optional base layer is in contact with the micro-device. The micro-device can protrude from the pocket, or not. The release layer, the optional base layer, or both can be patterned over the support substrate. A surface of the micro-device can be exposed.

In some embodiments, a micro-transfer printable micro-device structure comprises a support substrate having a pocket, an optional base layer provided in the pocket on the support substrate, a release layer provided in the pocket on the support substrate or on a side of the optional base layer opposite the support substrate, and the micro-device disposed at least partially in the pocket with the release layer between the micro-device and the support substrate so that no portion of the support substrate or optional base layer is in contact with the micro-device. The micro-device can protrude from the pocket, or not. The release layer, the optional base layer, or both can be patterned over the support substrate. A surface of the micro-device can be exposed.

According to some embodiments of the present invention, a micro-device wafer structure comprises a source wafer, a micro-device formed over the source wafer, a release layer disposed over the entire micro-device at least on a side of the micro-device opposite the source wafer, and an optional base layer disposed on the release layer. The source wafer can be sapphire, the micro-device can comprise a compound semiconductor, and the release layer, the optional base layer, or both can be patterned over the source wafer.

In some embodiments of the present invention, a micro-transfer printed micro-device substrate structure comprises a destination substrate, two or more contact pads disposed on the destination substrate, and a micro-transfer printed micro-device. The micro-device has a semiconductor structure and at least two electrical contacts disposed in different planes parallel to the destination substrate on the semiconductor structure. The electrical contacts are in physical and electrical contact with the contact pads. An adhesive layer can be disposed over the destination substrate and in contact with the micro-device so that the micro-device is adhered to the destination substrate.

A micro-transfer printable micro-device, according to some embodiments of the present invention, includes a semiconductor structure with at least one side and two or more electrical contacts on the side and two or more electrically separate electrodes. Each electrode is disposed at least partially on the side and extends from the semiconductor structure a distance greater than any other portion of the micro-transfer printable micro-device to form an electrically conductive connection post electrically connected to an electrical contact. A patterned first layer can be disposed on only a portion of the side and a patterned second electrically conductive electrode can be disposed on at least a portion of the side and overlapping only a portion of the first layer to form at least one of the connection posts on the overlapped portion. In a further embodiment, a patterned third layer is disposed on only a portion of the side and a patterned fourth electrically conductive layer is disposed on at least a portion of the side and overlapping only a portion of the third layer to form a connection post on the overlapped portion. The patterned fourth electrically conductive layer is in electrical contact with one of the electrical contacts. The portion of the patterned fourth electrically conductive layer can be exposed and extends beyond any other portion of the micro-transfer printable micro-device that is not a similarly constructed connection post. The first layer and the third layer can be the same layer or the second layer and the fourth layer can be the same layer. The first layer can be a dielectric.

In some embodiments of the present invention, a micro-transfer receivable substrate comprises a substrate having one or more contact pads, a patterned first layer disposed on only a portion of the side, and a patterned second electrically conductive layer disposed on at least a portion of the substrate and overlapping only a portion of the first layer to form a spike on the overlapped portion. The patterned second electrically conductive layer is in electrical contact with a contact pad and the portion of the patterned second electrically conductive layer extends beyond any other portion of the substrate that is not a similarly constructed spike.

A horizontal light-emitting diode, according to some embodiments of the present invention, includes a semiconductor structure extending along a length greater than a width or thickness having first and second ends at each end of the extent. The first and second ends of the semiconductor structure have a thickness greater than a portion of the semiconductor structure between the first and second ends. A first electrode electrically connects to an electrical contact adjacent to the first end and a second electrode electrically connects to an electrical contact adjacent to the second end. The first and second electrodes are at least partially in the same plane.

In some embodiments of the present invention, a light-emitting diode structure comprises a destination substrate having two or more contact pads and a semiconductor structure extending along a length greater than a width or thickness having first and second ends at each end of the extent, the first and second ends of the semiconductor structure having a thickness greater than a portion of the semiconductor structure between the first and second ends. A first electrode electrically connects to an electrical contact adjacent to the first end and a second electrode electrically connects to an electrical contact adjacent to the second end, wherein the first and second electrodes are at least partially in the same plane. The first and second electrodes are adjacent to the destination substrate, the first electrode is electrically connected to one of the contact pads, and the second electrode is electrically connected to another of the contact pads.

In one configuration, a light-emitting diode structure comprises a destination substrate having two or more contact pads, a semiconductor structure with at least one side and two or more electrical contacts on the side, and a first electrode electrically separate from a second electrode. Each of the first and second electrodes is disposed at least partially on the side and extend from the semiconductor structure a distance greater than any other portion of the micro-transfer printable micro-device to form an electrically conductive connection post electrically connected to an electrical contact. The first and second electrodes are adjacent to the destination substrate, the first electrode is electrically connected to one of the contact pads, and the second electrode is electrically connected to another of the contact pads.

In one aspect, the present invention is directed to a method of transfer printing a micro-device from a support substrate, comprising: providing the micro-device; forming a pocket in, on, or over the support substrate; providing a release layer disposed over the micro-device or in the pocket; disposing the micro-device in the pocket such that the release layer is disposed between the micro-device and the support substrate and no portion of the support substrate is in contact with the micro-device; and etching the release layer to completely separate the micro-device from the support substrate.

In certain embodiments, the method comprises forming the pocket in or on the support substrate. In certain embodiments, the method comprises forming the pocket over the support substrate by forming the pocket in or on one or more layers disposed on the support substrate. In certain embodiments, the method comprises a surface of the micro-device is exposed before etching the release layer.

In certain embodiments, the method comprises providing the micro-device on a source substrate; disposing the release layer on a side of the micro-device opposite the source substrate; adhering the support substrate to the release layer with a conformable adhesive thereby defining the pocket with the micro-device disposed in the pocket and the release layer between the micro-device and the adhesive; and removing the source substrate.

In certain embodiments, the method comprises patterning the release layer.

In certain embodiments, the method comprises removing the source wafer with laser lift off.

In certain embodiments, the method comprises solidifying, heating, cooling, or curing the adhesive.

In certain embodiments, the method comprises providing the micro-device on a source substrate; disposing the release layer on a side of the micro-device opposite the source substrate; forming a base layer on a side of the release layer opposite the micro-device; adhering the support substrate to the base layer with a conformable adhesive thereby defining the pocket with the micro-device disposed in the pocket and the release layer between the micro-device and the adhesive; and removing the source substrate. In certain embodiments, the method comprises patterning the release layer, the base layer, or both. In certain embodiments, the method comprises removing the source wafer with laser lift off. In certain embodiments, the method comprises solidifying, heating, cooling, or curing the adhesive.

In certain embodiments, the method comprises forming the pocket in or on the support substrate;
providing the release layer in the pocket on the support substrate; and
disposing a micro-device at least partially in the pocket and on the release layer.

In certain embodiments, the method comprises patterning the release layer.

In certain embodiments, the method comprises forming the pocket by etching the support substrate.

In certain embodiments, the method comprises (i) coating the support substrate with a curable material; and (ii) either (a) imprinting the curable material to form the pocket and curing the curable material or (b) curing the curable material and etching the pocket.

In certain embodiments, the method comprises micro-device material in the pocket and patterning the micro-device material in the pocket to form the micro-device.

In certain embodiments, the method comprises forming the pocket in or on the support substrate; forming a base layer in the pocket; providing the release layer in the pocket on the base layer; and disposing a micro-device at least partially in the pocket and on the release layer. In certain embodiments, the method comprises the release layer, the base layer, or both. In certain embodiments, the method comprises the pocket by etching the support substrate. In certain embodiments, the method comprises (i) coating the support substrate with a curable material; (ii) imprinting the curable material to define the pocket; and (iii) curing the curable material or both curing the curable material and etching the pocket. In certain embodiments, the method comprises depositing micro-device material in the pocket and patterning the micro-device material in the pocket to form the micro-device.

In certain embodiments, the method comprises providing a stamp comprising a conformable stamp post; pressing the stamp post against the separated micro-device to adhere the micro-device to the stamp post; and removing the stamp and micro-device from the support substrate.

In another aspect, the present invention is directed to a transfer printable micro-device structure, comprising: a support substrate; an adhesive layer comprising a pocket provided on or over the support substrate; a release layer disposed in the pocket and on or over a side of the adhesive layer opposite the support substrate; and a micro-device disposed at least partially in the pocket, wherein the release layer is disposed between the micro-device and the support substrate such that no portion of the support substrate is in contact with the micro-device.

In certain embodiments, the micro-device protrudes from the pocket.

In certain embodiments, the micro-device does not protrude from the pocket.

In certain embodiments, the release layer is patterned over the support substrate.

In certain embodiments, the release layer is unpatterned over the support substrate.

In certain embodiments, a surface of the micro-device is exposed.

In certain embodiments, the transfer printable micro-device structure comprises a base layer disposed on the adhesive layer, wherein at least a portion of the base layer is disposed in the pocket, the release layer is disposed on a side of the base layer opposite the support substrate, and no portion of the micro-device is in contact with the base layer.

In certain embodiments, the base layer is patterned over the support substrate. In certain embodiments, the base layer is unpatterned over the support substrate.

In another aspect, the present invention is directed to a transfer printable micro-device structure, comprising: a support substrate comprising a pocket; a release layer provided in the pocket on the support substrate; and the micro-device disposed at least partially in the pocket with the release layer between the micro-device and the support substrate such that no portion of the support substrate is in contact with the micro-device.

In certain embodiments, the micro-device protrudes from the pocket. In certain embodiments, the micro-device does not protrude from the pocket.

In certain embodiments, the release layer is patterned over the support substrate. In certain embodiments, the release layer is unpatterned over the support substrate.

In certain embodiments, a surface of the micro-device is exposed.

In certain embodiments, the transfer printable micro-device structure a base layer disposed on the support substrate, wherein at least a portion of the base layer is disposed in the pocket, the release layer is disposed on a side of the base layer opposite the support substrate, and no portion of the micro-device is in contact with the base layer.

In certain embodiments, the base layer is patterned over the support substrate. In certain embodiments, the base layer is unpatterned over the support substrate.

In another aspect, the present invention is directed to a micro-device wafer structure, comprising: a source wafer; a micro-device formed over the source wafer; and a release layer disposed over the entire micro-device at least on a side of the micro-device opposite the source wafer.

In certain embodiments, a base layer disposed on the release layer on a side of the release layer opposite the micro-device.

In certain embodiments, the source wafer is sapphire.

In certain embodiments, the micro-device comprises a compound semiconductor.

In certain embodiments, the release layer is patterned over the source wafer. In certain embodiments, the base layer is patterned over the source wafer.

In another aspect, the present invention is directed to a micro-device wafer structure, comprising: a source wafer comprising a pocket; a release layer disposed at least in the pocket on, over, or in direct contact with the source wafer; and a micro-device formed over, on, or in direct contact with the release layer at least in the pocket, and exclusively in contact with the release layer on a side of the release layer opposite the source wafer.

In certain embodiments, the release layer is patterned over the source wafer.

In certain embodiments, the micro-device has a thickness that is greater than the depth of the pocket.

In certain embodiments, the micro-device has a thickness that is less than or equal to the depth of the pocket.

In certain embodiments, the micro-device wafer structure comprises a base layer disposed on the source wafer, wherein at least a portion of the base layer is disposed in the pocket, the release layer is disposed on a side of the base layer opposite the support substrate, and no portion of the micro-device is in contact with the base layer. In certain embodiments, the base layer is patterned over the support substrate. In certain embodiments, the base layer is unpatterned over the support substrate.

In another aspect, the present invention is directed to a transfer printed micro-device substrate structure, comprising: a destination substrate; two or more contact pads disposed on the destination substrate; a transfer printed micro-device, the micro-device comprising a semiconductor structure and at least two electrical contacts disposed in different planes parallel to the destination substrate on the semiconductor structure; and wherein the at least two electrical contacts are in physical and electrical contact with the two or more contact pads.

In certain embodiments, the transfer printed micro-device substrate structure comprises an adhesive layer disposed over at least a portion of the destination substrate and in contact with the micro-device such that the micro-device is adhered to the destination substrate by the adhesive layer.

In another aspect, the present invention is directed to a transfer printable micro-device, comprising: a semiconductor structure with at least one side and two or more electrical contacts on a side of the at least one side; and two or more electrically separate electrodes, each electrode disposed at least partially on the side and extending from the semiconductor structure a distance greater than any other portion of the transfer printable micro-device such that each define an electrically conductive connection post electrically connected to an electrical contact.

In certain embodiments, the transfer printable micro-device comprises a patterned first layer disposed on only a portion of the side; and a patterned second electrically conductive electrode disposed on at least a portion of the side, overlapping only a portion of the first layer, and defining at least one of the connection posts on the overlapped portion.

In certain embodiments, the transfer printable micro-device comprises a patterned third layer disposed on only a portion of the side; and a patterned fourth electrically conductive layer disposed on at least a portion of the side, overlapping only a portion of the third layer, and defining a connection post on the overlapped portion, wherein the patterned fourth electrically conductive layer is in electrical contact with one of the electrical contacts, wherein the portion of the patterned fourth electrically conductive layer and extends beyond any other portion of the transfer printable micro-device that is not a similarly constructed connection post.

In certain embodiments, the first layer and the third layer are a same layer or wherein the second layer and the fourth layer are a same layer.

In certain embodiments, the first layer is a dielectric.

In another aspect, the present invention is directed to a substrate for receiving transfer printable micro-devices, comprising: a substrate comprising one or more contact pads; a patterned first layer disposed on only a portion of a side of the substrate; and a patterned second electrically conductive layer disposed on at least a portion of the substrate and overlapping only a portion of the first layer, wherein the patterned second electrically conductive layer defines a spike on the overlapped portion, the patterned second electrically conductive layer in electrical contact with one of the one or more contact pads, wherein the portion of the patterned second electrically conductive layer extends beyond any other portion of the substrate that is not a similarly constructed spike.

In another aspect, the present invention is directed to a horizontal light-emitting diode, comprising: a semiconductor structure having an extent along a length, wherein the extent has a first end and a second end and the length is greater than a width or thickness of the semiconductor structure, the semiconductor structure having a thickness at each of the first end and the second end that is greater than a thickness of a portion of the semiconductor structure between the first end and the second end; and a first electrode electrically connected to an electrical contact adjacent to the first end and a second electrode electrically connected to an electrical contact adjacent to the second end, wherein the first and second electrodes are at least partially in a common plane.

In another aspect, the present invention is directed to a light-emitting diode structure, comprising: a destination substrate comprising two or more contact pads; a semiconductor structure having an extent along a length, wherein the extent has a first end and a second end and the length is greater than a width or thickness of the semiconductor structure, the semiconductor structure having a thickness at each of the first end and the second end that is greater than a thickness of a portion of the semiconductor structure between the first end and the second end; a first electrode electrically connected to an electrical contact adjacent to the first end and a second electrode electrically connected to an electrical contact adjacent to the second end, wherein the first and second electrodes are at least partially in the same plane; and wherein the first electrode and the second electrode are adjacent to the destination substrate, the first electrode is electrically connected to one of the two or more contact pads, and the second electrode is electrically connected to another of the two or more contact pads.

In another aspect, the present invention is directed to a light-emitting diode structure, comprising: a destination substrate comprising two or more contact pads; a semiconductor structure with at least one side and comprising two or more electrical contacts disposed on one side of the at least one side; a first electrode electrically separate from a second electrode, each of the first and second electrodes disposed at least partially on the one side and extending from the semiconductor structure a distance greater than any other portion of the semiconductor structure, such that each define an electrically conductive connection post electrically connected to an electrical contact; and wherein the first and second electrodes are adjacent to the destination substrate, the first electrode is electrically connected to one of the two or more contact pads, and the second electrode is electrically connected to another of the two or more contact pads.

In another aspect, the present invention is directed to a micro-device structure, comprising: a micro-device comprising a body portion, at least two electrical connections that extend a first distance from the body portion, and a mesa portion that extends a second distance greater than the first distance from the body portion; and a substrate comprising two or more contact pads, the two or more contact pads each extending a distance from the substrate that is equal to or greater than a difference between the first distance and the second distance; wherein each of the at least two electrical connections is in contact with and electrically connected to one of the two or more contact pads.

In certain embodiments, the mesa is disposed between the at least two electrical connections. In certain embodiments, the mesa is disposed between at least two of the two or more contact pads. In certain embodiments, the mesa is non-conductive.

In another aspect, the present invention is directed to a micro-device and substrate structure, comprising: a destination substrate; one or more contact pads disposed on the destination substrate; a micro-device disposed on or over the destination substrate, the micro-device comprising a device structure and at least one electrical contact disposed on the device structure between the destination substrate and the device structure (e.g., completely between the device structure and the destination substrate), wherein the at least one electrical contact is in direct electrical contact (e.g., and direct physical contact) with the one or more contact pads; a layer of cured adhesive disposed on the destination substrate adhering the micro-device to the destination substrate, the layer of cured adhesive disposed in contact with the one or more contact pads.

In certain embodiments, the at least one electrical contact comprises at least two electrical contacts and the at least two electrical contacts are at least partially in a common plane. In certain embodiments, the one or more electrical contacts comprise at least two electrical contacts and wherein the at least two electrical contacts are in different planes.

In certain embodiments, the layer of cured adhesive is an electrical insulator. In certain embodiments, the layer of cured adhesive surrounds and is in direct contact with the at least one electrical contact. In certain embodiments, the layer of cured adhesive is in direct contact with the one or more contact pads. In certain embodiments, the layer of cured adhesive covers the one or more contact pads, the at least one electrical contact, or both, except where the at least one electrical contact is in contact with the one or more contact pads.

In certain embodiments, the at least one electrical contact comprises an electrically conductive electrical-contact material and the one or more contact pads comprise an electrically conductive contact-pad material, and wherein the electrical-contact material and the contact-pad material are the only conductive materials in contact with the at least one electrical contact and the one or more contact pads.

In certain embodiments, the at least one electrical contact comprises metal, the one or more contact pads comprise metal, or both.

In certain embodiments, the layer of cured adhesive comprises one or more of a thermoset resin, a UV-curable resin, and a cross-linked resin.

In certain embodiments, each electrical contact of the at least one electrical contacts is held in compressive contact with at least one of the one or more contact pads by the layer of cured adhesive. In certain embodiments, the layer of cured adhesive has a residual tensile stress.

In certain embodiments, (i) each of the at least one electrical contact is substantially planar, (ii) each of the one or more contact pads is substantially planar, or (iii) both (i) and (ii).

In certain embodiments, the at least one electrical contact comprises one or more protrusions.

In certain embodiments, the micro-device is tilted (e.g., as a result of being disposed on or over the destination substrate using a flip-chip method).

In another aspect, the present invention is directed to a method of making a micro-device and substrate structure, comprising: providing a destination substrate and one or more contact pads disposed on the destination substrate; coating at least a portion of the destination substrate and the one or more contact pads with a layer of curable adhesive; providing a micro-device comprising a device structure and at least one electrical contact disposed on the device structure; disposing the micro-device on the layer of curable adhesive (e.g., a curable electrically-insulating adhesive) with the at least one electrical contact between the device structure and the destination substrate (e.g., completely between the device structure and the destination substrate) and with the at least one electrical contact aligned with the one or more contact pads; and curing the layer of curable adhesive to form a layer of cured adhesive thereby directly electrically contacting (e.g., and directly physically contacting) the at least one electrical contact with the one or more contact pads.

In certain embodiments, the micro-device is disposed by micro-transfer printing. In certain embodiments, the micro-device is disposed by a die sorter, a die bonder, a pick-and-place machine, or a chip shooter.

In certain embodiments, curing the layer of curable adhesive shrinks the curable adhesive and pulls the least one electrical contact into direct electrical contact with the one or more contact pads (e.g., and also direct physical contact). In certain embodiments, curing the layer of curable adhesive shrinks the curable adhesive thereby at least partially (e.g., completely) removing the curable adhesive from between the least one electrical contact and the one or more contact pads. In certain embodiments, the curable adhesive flows during the curing.

In certain embodiments, an orientation of the micro-device is flipped during disposition of the micro-device on the layer of curable adhesive.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIGS. 1A-1J are successive cross sections illustrating sequential steps in an exemplary method according to illustrative embodiments of the present invention and illustrating a semiconductor structure according to illustrative embodiments of the present invention;

FIGS. 2A-2K are successive cross sections illustrating sequential steps in another exemplary method according to illustrative embodiments of the present invention and illustrating another semiconductor structure according to illustrative embodiments of the present invention;

FIGS. 4A-4B are successive cross sections illustrating sequential steps in an exemplary method according to some embodiments of the present invention;

FIGS. 8A-8B are successive cross sections illustrating sequential steps in a method of the present invention and illustrating a semiconductor structure of the present invention;

FIGS. 9A-9G are cross sections illustrating various release and base layer structures according to various embodiments of the present invention;

FIGS. 11A-11C are successive cross sections illustrating sequential steps in a method of the present invention describing the use of overlapping layers to form connection posts;

FIGS. 12A-12E are successive cross sections illustrating sequential steps according to embodiments of the present invention describing the use of physical vapor deposition to form connection posts;

FIGS. 14A-14B are a cross section and corresponding plan view of a micro-device having connection posts according to embodiments of the present invention;

FIG. 16 is a cross section illustrating micro-transfer-printed completed semiconductor devices with a connection post structure and a destination substrate in accordance with an embodiment of the present invention;

FIG. 17 is a cross section illustrating a completed semiconductor device with a connection post structure and a destination substrate in accordance with an embodiment of the present invention;

FIGS. 18A-18F are schematic cross sections of a micro-device and destination substrate structure, respectively, according to embodiments of the present invention;

Figure 1A:
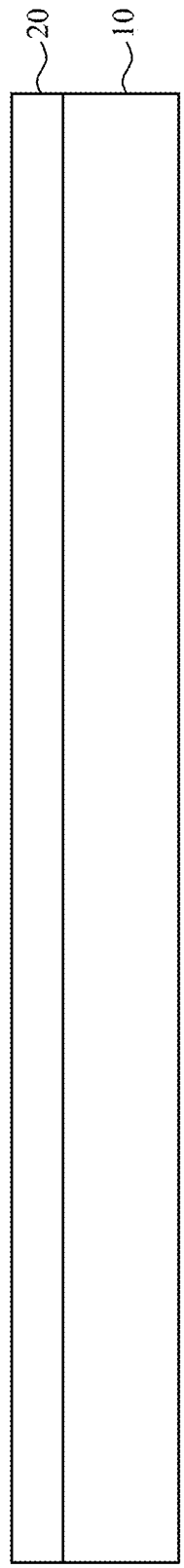

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

The present invention provides, inter alia, structures and methods for making transfer printable (e.g., micro-transfer printable) micro-devices having a reduced area on a source substrate and reduced potential for particulate contamination in the transfer printing process. A reduction in source substrate area reduces material costs and increases transfer density. A reduction in particulate contamination increases print yields. Micro-transfer printable micro-devices of the present invention can be, for example, a variety of semiconductor structures, including a diode, a light-emitting diode (LED), a laser, a photo-diode, a photo-transistor, a transistor, or an integrated circuit.

The present invention also provides, inter alia, structures and methods to enable micro-transfer printing of flipped integrated circuits adhered to a handle substrate. By forming completed semiconductor devices before the removal of a support or growth substrate, photolithographic processing steps that would otherwise disable or destroy release layers and structures needed for micro-transfer printing are performed before the construction of the release layer. Thus, in some embodiments, once a support or growth substrate is removed, a release layer can be etched and completed semiconductor devices transfer printed (e.g., micro-transfer printed) without exposing the completed semiconductor device or release layer to destructive photolithographic process steps. Completed semiconductor micro-devices are otherwise functional devices that do not necessarily, but can, include electrical conductors necessary for providing electrical power to the completed semiconductor devices.

Figure 1B:
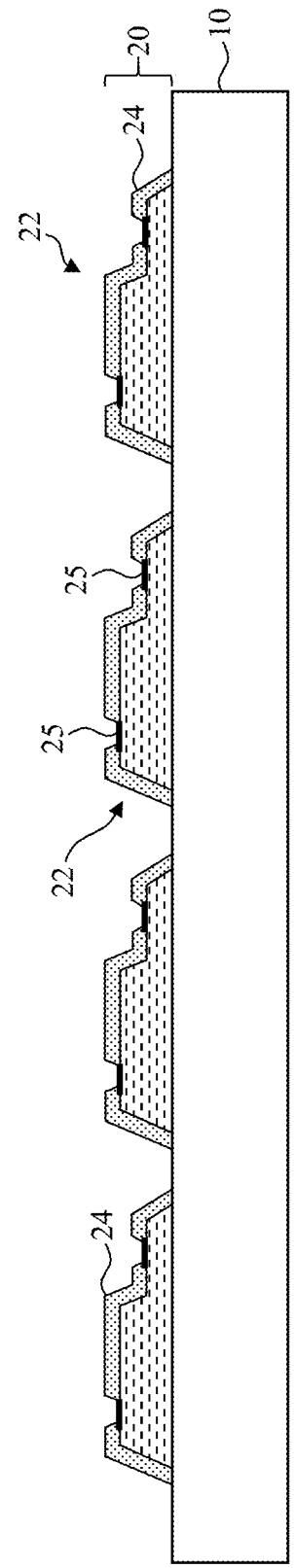
Figure 3:
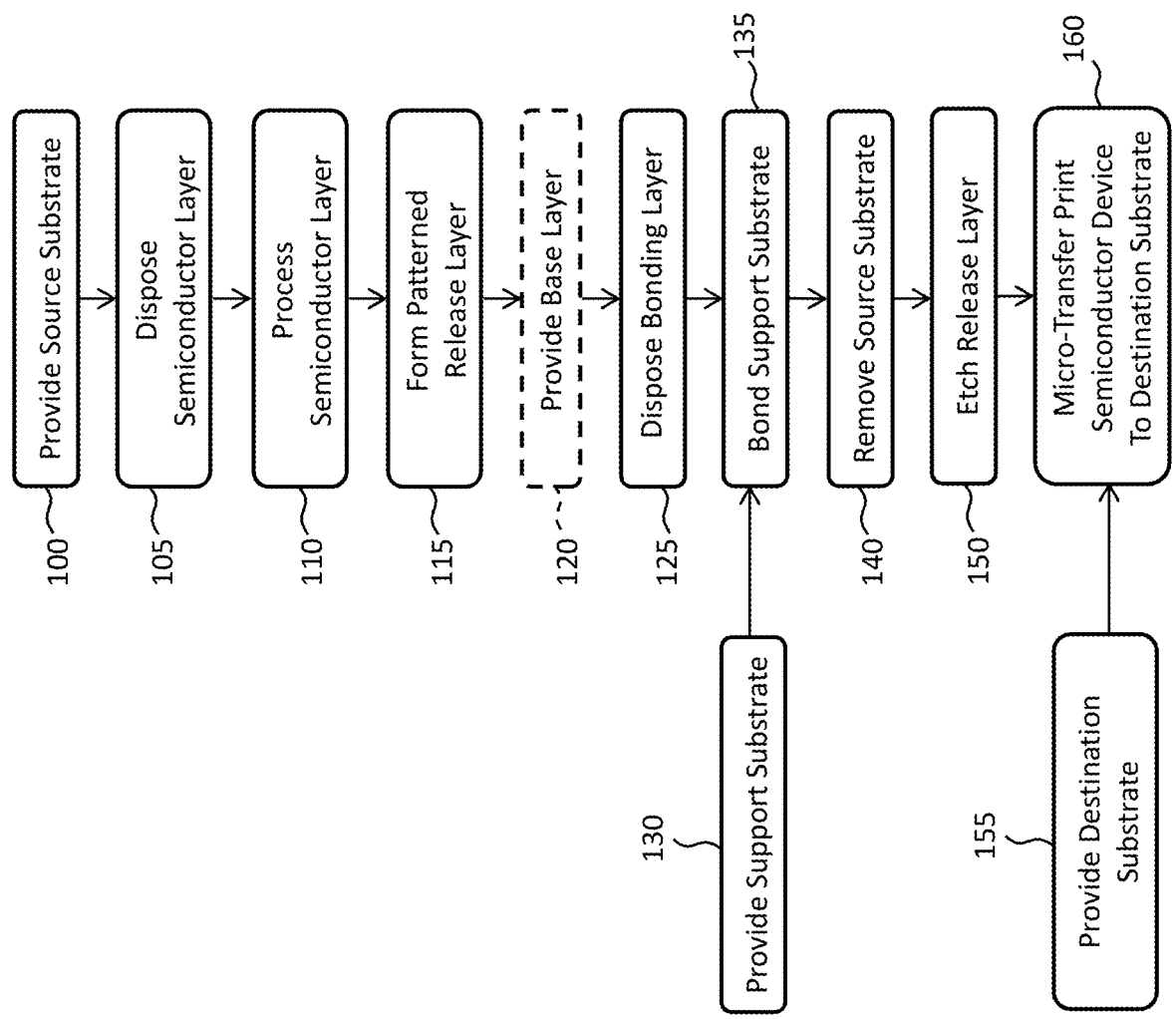
FIG. 3 is a flow diagram illustrating exemplary embodiments of the present invention including those described in FIGS. 1A-1J and 2A-2K.

Referring to the sequential cross sections of FIGS. 1A-1J and also to the flow diagram of FIG. 3, in an exemplary method according to some embodiments of the present invention, a source substrate 10 is provided in step 100 and a semiconductor layer 20 disposed on the source substrate 10 in step 105 (FIG. 1A). Referring to FIG. 1B, the semiconductor layer 20 is processed in step 110 to form a completed semiconductor structure 22 (forming a micro-device 22). A source substrate 10 can be a native substrate for a semiconductor layer 20 or micro-device 22. In some embodiments, a micro-device 22 is not a semiconductor structure. The step 110 processing can include adding other materials, patterning materials, doping, etching, forming structures, and other photolithographic or integrated circuit processes. The completed semiconductor structure 22 can include an electrical contact 25 for providing electrical power to the micro-device 22 and a patterned dielectric layer 24 to encapsulate and insulate portions of the semiconductor structure 22.

In various embodiments, a source substrate 10 can be glass, plastic, semiconductor, silicon, compound semiconductor, sapphire (e.g., aluminum oxide or $Al_2O_3$), ceramic, quartz, silicon, GaAs, GaN, InP, SiC, GaP, GaSb, AlN, MgO, or other substrates suitable for photolithographic processing. A source substrate 10 can be substantially transparent, for example 50%, 70%, or 90% transparent to visible, UV, or IR electromagnetic radiation, or to laser radiation. A source substrate 10 can include multiple layers, can include one or more semiconductor layers, can be a growth substrate, or can include a growth or semiconductor seed layer on which the one or more semiconductor layers 20 are formed or disposed. A source substrate 10 can be crystalline or have a crystalline layer. A source substrate 10 and semiconductor layer 20 can be a single unified structure with defined layers.

One or more semiconductor layers 20 can be organic or inorganic, can be crystalline or polycrystalline, can be a semiconductor, can be a compound semiconductor, or can be doped or implanted, for example with p or n doping to provide desired electrical structures and functions, or can include one or more of GaN, Si, InP, SiGe, and GaAs. One or more semiconductor layers 20 can be formed or disposed in step 105 using photolithographic processes including, for example, evaporation or sputtering, or formed or disposed using one of various methods of chemical vapor deposition. In some embodiments, a source substrate 10 is a semiconductor substrate and disposing one or more semiconductor layers 20 in, on, or over the source substrate 10 (e.g., as in step 105) includes doping or implanting a portion or layer of the semiconductor substrate (source substrate 10) to form the one or more semiconductor layers 20. In some embodiments, disposing the one or more semiconductor layers 20 in, on, or over the source substrate 10 (step 105) includes growing the one or more semiconductor layers 20 on the source substrate 10 or on a growth layer on the source substrate 10, for example using epitaxial techniques. In some such embodiments, the source substrate 10 is a crystalline semiconductor substrate or sapphire substrate.

The one or more semiconductor layers 20 can be processed in step 110 using photolithographic methods, for example including evaporation, sputtering, chemical vapor deposition (CVD), physical vapor deposition (PVD), annealing, or masking using photoresist, exposure to patterned radiation, and etching. Semiconductor layers 20 can be patterned and structured and additional layers and structures can be formed on or in the one or more semiconductor layers 20, for example patterned dielectric layers 24 or patterned conductors such as electrical contacts 25 formed, as shown in FIG. 1B. Electrical contacts 25 can be a metalized portion of one or more of the semiconductor layers 20 or a patterned metal layer over one or more of the semiconductor layers 20 (e.g., with Ag, Al, Ni, Ti, Au, Pd, W, or metal alloys) or simply a designated portion of one or more of the semiconductor layers 20. Electrical contact 25 portions of a completed semiconductor micro-device 22 to which electrical connections can be made and power and signals provided to operate the completed micro-device 22. Semiconductor layers 20 and any additional layers and structures necessary to function form the completed semiconductor micro-device 22. A plurality of completed semiconductor micro-devices 22 can be disposed on a source substrate 10, as shown.

A completed semiconductor micro-device 22 includes all of the elements necessary to function but does not necessarily include electrical connections (electrodes) to external power or signal sources that enable device operation, or necessarily include protective layers. FIG. 1B illustrates a horizontal LED structure with shaped, structured, doped, and optionally implanted semiconductor layers 20, a patterned dielectric layer 24 that defines vias, and two electrical contacts 25 through which electrical power can be transmitted to the semiconductor layers 20 to cause the completed semiconductor micro-device 22 to operate. In certain embodiments, a completed semiconductor micro-device 22 is formed by all of the photolithographic steps, such as processing and patterning steps, to make the completed semiconductor micro-device 22 functional. Although illustrated as a horizontal LED structure, the functional completed semiconductor micro-device 22 in FIG. 1B can be an integrated circuit and can be a device that provides a desired electronic, optical, thermal, mechanical, magnetic, electric field, photonic, opto-electronic effect or circuit operation when provided with power but does not necessarily include the interconnections necessary to provide power or control signals, such as electrical power or control signals. In certain embodiments, a completed semiconductor micro-device 22 is an integrated circuit and can be a device that provides a desired electronic, optical, thermal, mechanical, magnetic, electric field, photonic, opto-electronic effect or circuit operation when provided with power but does not necessarily include the interconnections necessary to provide power or control signals, such as electrical power or control signals.

Figure 1C:
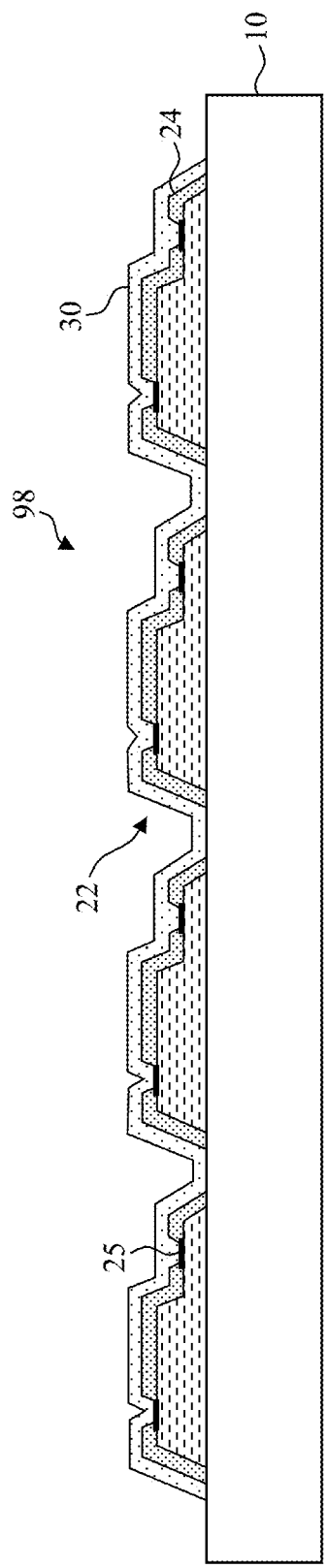

In step 115 and referring to FIG. 1C, a release layer 30 is disposed over, on, and in contact with the completed semiconductor structure 22 and in contact with the source substrate 10 (or layers formed on the source substrate 10), for example by coating, evaporation, sputtering, or vapor deposition. A release layer 30 can be blanket coated (unpatterned) or patterned and can be a sacrificial layer and include a material that is differentially etchable from portions of the completed semiconductor structure 22 with which the release layer 30 is in contact. In some embodiments, a release layer 30 completely covers the exposed portion of the completed semiconductor structure 22. A release layer 30 can be formed or disposed using photolithographic methods and materials and can include germanium, Si, TiW, Al, Ti, a lift-off resist, or other polymers. In various embodiments, a release layer 30 material can etch in developer, is not photo-active, or can etch at a higher temperature than photo-active materials such as photo-resists (e.g., greater than 200° C., 300° C., or 400° C.). Once etched, a release layer 30 can define a gap 32 (e.g., between a layer or substrate and a completed micro-device 22) or space formed, for example, by etching the patterned release layer 30 material.

Figure 1D:
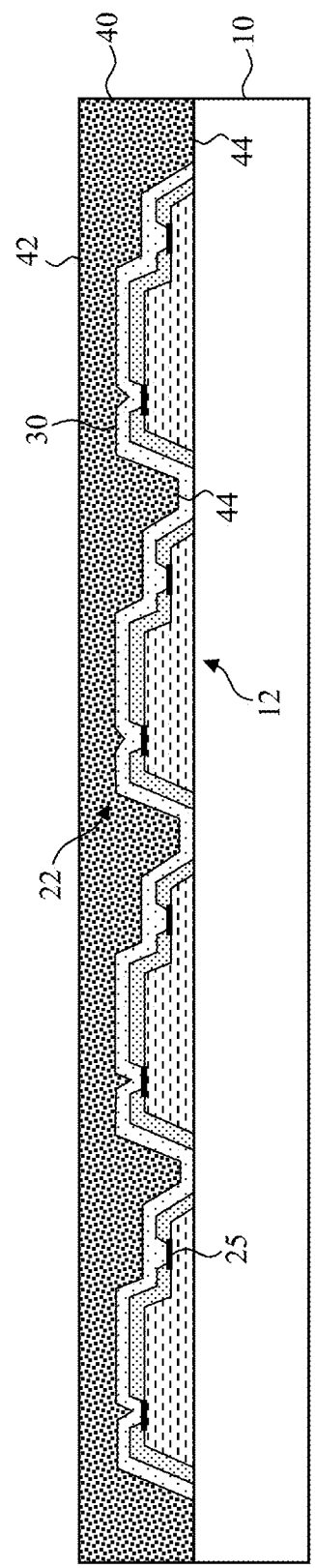

Referring to FIG. 1D, in step 125 a conformable and curable bonding layer 40 is disposed over the release layer 30. The bonding layer 40 covers and conforms to the micro-device 22 and release layer 30 to provide a planarized bonding layer planar side 42 on a side of the bonding layer 40 opposite the release layer 30. A bonding layer 40 can be, for example, an adhesive, a curable resin, epoxy, SU-8, a metal layer, a metal alloy layer, a solder layer, or AuSn. The side of the bonding layer 40 adjacent to the release layer 30 is a bonding layer non-planar side 44. The micro-device 22 and release layer 30 shown in FIG. 1D therefore form an indentation or depression in the bonding layer 40 that is referred to herein as a pocket 12. As used herein, a pocket 12 can be formed in any layer, such as, for example, a support substrate 50, a bonding layer 40, or a base layer 60. One or more layers can be disposed in the pocket 12. Because the release layer 30 is disposed completely over the micro-device 22, the pocket 12 has an area over the source substrate 10 greater than the micro-device 22 surface area over the source substrate 10 (e.g., wherein the area of the pocket 12 is defined by the area of the micro-device 22 and the area of the corresponding release layer 30 projected onto the source substrate 10) and a volume greater than the volume of the micro-device 22. In certain embodiments, because a release layer 30 completely covers a micro-device 22, no portion of a bonding layer 40 is in direct contact with the micro-device 22 (e.g., as in FIG. 1F). Depending on, for example, the patterning of a release layer 30, a bonding layer 40 can, but does not necessarily, directly contact a source substrate 10.

As illustrated in FIG. 1E, in step 130 a support substrate 50 is provided and in step 135 the support substrate 50 is adhered to the bonding layer planar side 42 of the bonding layer 40. In some embodiments, a bonding layer 40 is coated on the release layer 30 (as shown in FIG. 1D) and a support substrate 50 adhered to the bonding layer 40. In some embodiments, a bonding layer 40 is coated on a support substrate 50 and a release layer 30 adhered to the bonding layer 40 (not shown) with a micro-device 22 and source substrate 10. In either of these cases, a pocket 12 is formed in a bonding layer 40 in which a micro-device 22 is disposed with a release layer 30 between the micro-device 22 and a support substrate 50 and, moreover, no portion of the support substrate 50 is in contact with the micro-device 22.

A support substrate 50 can be substantially transparent, for example 50%, 70%, or 90% transparent to visible, UV, or IR electromagnetic radiation, or to laser radiation. Referring to FIG. 3, the support substrate 50 is located in contact with the bonding layer 40 and bonded to the release layer 30 and the completed semiconductor micro-devices 22, for example, by curing the bonding layer 40 in step 135 (FIG. 1E) by heating, by cooling, or by providing electromagnetic radiation to the bonding layer 40, for example through the support substrate 50, or otherwise solidifying the bonding layer 40. Curing a bonding layer 40 can include forming a chemical reaction in the material of the bonding layer 40 or hardening the bonding layer 40, or by facilitating a phase change from a liquid to a solid (as with a solder). The bonding layer 40 can be cured by exposing the bonding layer 40 material to light or heat (for example if the bonding layer 40 is a UV-curable resin) or by exposing the bonding layer 40 to heat to melt a metal or metal alloy, disposing a structure in contact with the melted metal or metal alloy, and then cooling the metal. Thus, in some embodiments of the present invention, a metal or metal alloy bonding layer 40 is deposited, heated to melt the metal bonding layer 40 to a liquid, a support substrate 50 or release layer 30 is brought into contact with the melted liquid metal bonding layer 40, and the melted metal bonding layer 40 is cooled to a solid to adhere the bonding layer 40 to the support substrate 50 or release layer 30.

In step 140 and as shown in FIG. 1F, the source substrate 10 is removed, for example, by one or more of laser liftoff, ablation, laser ablation, etching, and grinding. In some embodiments, both grinding and another removal technique, such as etching, are used. For example, a source substrate 10 can be transparent to laser light and a laser can heat a layer of the source substrate 10, a semiconductor layer 20, or a micro-device 22 and ablate the heated material to separate the micro-device 22 from the source substrate 10. The removal of the source substrate 10 exposes at least a portion of the release layer 30.

Next, referring to FIG. 1G, in step 150 the structure can be inverted (as shown compared to FIG. 1F) and the release layer 30 is etched to remove the sacrificial material in the release layer 30, for example by etching with $H_2O_2$, $XeF_2$, HCl, HF, TMAH (trimethylammonium hydroxide), or oxygen plasma. The selection of etchant can depend on the material of a patterned release layer 30. For example, $H_2O_2$ or $XeF_2$ can be used with a Ge, W, or TiW release layer 30, $XeF_2$ can be used with a Si release layer 30, HCl acid mixtures can be used with an Al or Ti release layer 30, TMAH-based developers can be used with a lift-off resist release layer 30, and oxygen plasma can be used with polyimide, epoxy, PMMA, or other organic release layers 30. An etchant can be benign to materials found in or exposed on the surface of a completed semiconductor micro-device 22. In certain embodiments, after etching, the release layer 30 defines a gap 32 or space between portions of a completed semiconductor micro-devices 22 and a bonding layer 40.

Referring again to FIG. 1G, because the micro-device 22 is completely covered by the release layer 30 (step 115 FIG. 1C), the micro-device 22 is completely detached and separated from the support substrate 50 and bonding layer 40. There is no tether or other structural component that connects the micro-device 22 to the support substrate 50. The micro-device 22 can fall into and touch the pocket 12, as shown, but the micro-device 22 is not structurally connected or attached to the pocket 12. Because the pocket 12 is larger than the micro-device 22, the micro-device 22 can move within the pocket 12 and is not strictly aligned or held in place with respect to the support substrate 50, but the range of movement is limited by the pocket 12 size.

As used herein, an area of a pocket 12 for a micro-device 22 (e.g., over a substrate such as a source substrate 10 or support substrate 50) is the maximal planar area covered by the micro-device 22 and corresponding portion of a release layer 30 in a plane parallel to a surface of the micro-device 22 (e.g., projected onto the substrate). An area of a pocket 12 does not include area attributable to a layer in the pocket 12 other than a release layer 30 and a micro-device 22. As used herein, a micro-device 22 area is the maximal planar area covered by the micro-device 22 exclusively in the plane that the pocket 12 area is measured. In general, a plane used to calculate a pocket 12 area and corresponding micro-device 22 area is a plane of a substrate (e.g., a source substrate 10 or support substrate 50) and, therefore, the respective maximal areas are the respective projected areas over the substrate. For example, in certain embodiments, micro-devices 22 are disposed in an array on (e.g., over) a substrate and a release layer 30 is a continuous layer of material that is between each of the micro-devices 22 and the substrate, such that the corresponding portion of the release layer 30 used in calculating a pocket area is an area of the release layer 30 defined by a unit cell of the array. For example, one dimension of a corresponding portion of a release layer 30 that defines a pocket 12 area (e.g., unit cell area) is shown as width $W_p$ in the cross-sectional views of FIGS. 1D, 2G, 6F, and 8A. In some embodiments, a release layer 30 is patterned such that a material of the release layer 30 is not continuous and a pocket 12 area is the maximal planar area corresponding to a corresponding micro-device 22 and a continuous portion of material of the patterned release layer adjacent to (e.g., disposed in contact with) the corresponding micro-device 22. The terms "area of a micro-device" and "micro-device area" are used interchangeably herein, as are the terms "area of a pocket" and "pocket area".

As used herein, a volume of a pocket 12 for a micro-device 22 is the volume of the micro-device 22 and volume of a corresponding portion of a release layer 30 taken together, where the corresponding portion of the release layer 30 is defined as it is for calculation of the pocket 12 area. The volume of a micro-device 22 is the amount of space occupied by the micro-device 22. The terms "volume of a micro-device" and "micro-device volume" are used interchangeably herein, as are the terms "volume of a pocket" and "pocket volume". A volume of a pocket 12 does not include volume attributable to any layer that may disposed in the pocket 12 other than a release layer 30 and micro-device 22.

In some embodiments, a pocket 12 has an area (e.g., over a source substrate 10) that is less than or equal to 200%, less than or equal to 150%, less than or equal to 120%, or less than or equal to 110% of the area of a micro-device 22. In some embodiments, a pocket 12 has a volume that is less than or equal to 200%, less than or equal to 150%, less than or equal to 120%, or less than or equal to 110% of the volume of a micro-device 22. In some embodiments, a pocket 12 has a volume greater the volume of a micro-device 22 and a micro-device 22 is completely within the pocket 12. In some embodiments, a micro-device 22 has a surface that is aligned or parallel or at least partially in a plane with an exposed portion of a bonding layer 40 opposite a support substrate 50. A support substrate 50 can be oriented so that a micro-device 22 falls into a pocket 12 due to the force of gravity. A micro-device 22 can also adhere to the sides or bottom of a pocket 12 (e.g., bonding layer 40 or support substrate 50) by molecular forces, such as van der Waal's forces.

In some embodiments, the absence of a tether or corresponding anchor area reduces the area over a source substrate 10 required to form patterned (e.g., completed) micro-devices 22, enabling, for example, one or more of (i) a denser arrangement of micro-devices 22 arranged closer together over a source substrate 10, (ii) a reduction in the materials cost of the micro-devices 22 and (iii) a reduction in the number of source substrates 10. In some embodiments in which a release layer 30 is unpatterned, an even more dense arrangement is possible, further reducing costs, for example as shown in FIGS. 1F and 2G.

Figure 1I:
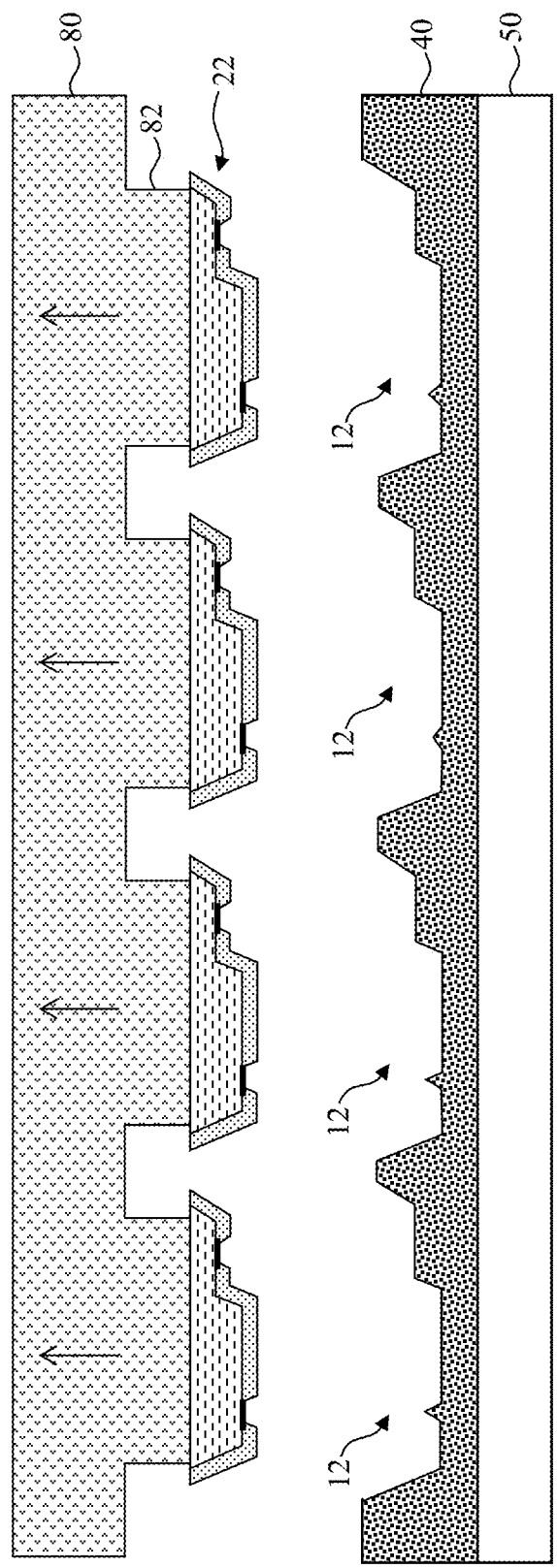

As shown in FIG. 1H, in step 160 the micro-devices 22 can be micro-transfer printed to a destination substrate (provided in step 155) with an elastomeric stamp 80 having stamp posts 82. The stamp post 82 has a surface that is conformable and compliant so that the stamp post surface can deform and compress to press against the micro-device 22, despite the orientation of the micro-device 22 within the pocket 12. Since the micro-device 22 is separated and detached from the support substrate 50 and bonding layer 40, the micro-device 22 can be located in a variety of positions and orientations at a variety of angles within the pocket 12 and a surface of the micro-device 22 may not be parallel to the stamp post 82 surface (e.g., may be slightly tilted). Thus, in certain embodiments, the deformation of a compliant surface of a stamp post 82 accommodates an orientation of a micro-device 22 (e.g., when it is tilted) in a pocket 12 and adheres the micro-device 22 to a stamp post 82 so that when the stamp 80 is removed from the support substrate 50 over or in which the pocket 12 exists, the micro-device 22 remains adhered to the stamp post 82 and is also removed from the support substrate 50 (e.g., and bonding layer 40 as shown in FIG. 1I).

Figure 1J:
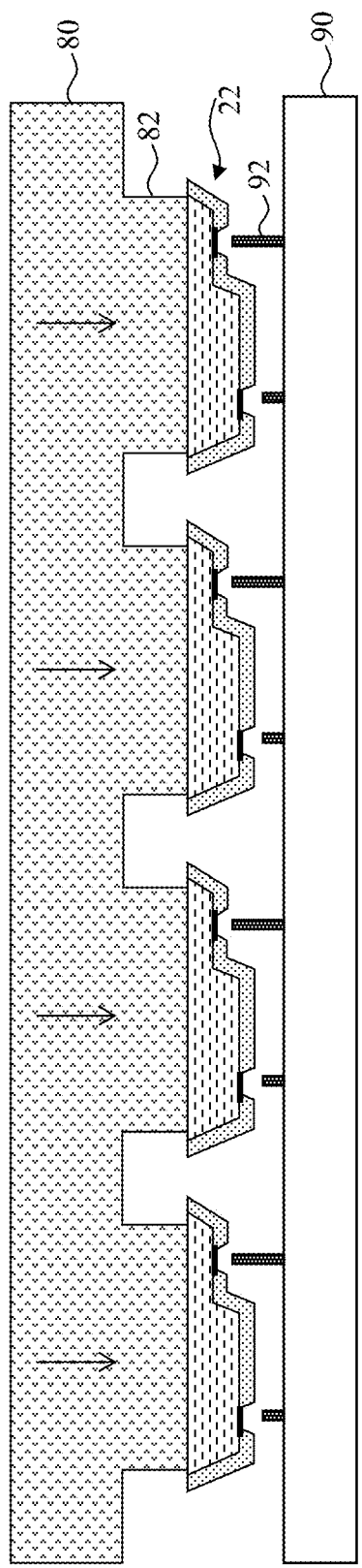

Referring to FIG. 1J, the completed semiconductor micro-devices 22 are brought into aligned contact with a destination substrate 90 by micro-transfer printing from the support substrate and adhered to the destination substrate 90. In some embodiments, electrical contacts 25 of a completed semiconductor micro-device 22 are electrically connected to contact pads 92 formed or disposed on a destination substrate 90. A destination substrate 90 can have a non-planar surface with a topography that complements a non-planar semiconductor structure surface of a completed semiconductor micro-device 22. Contact pads 92 of a destination substrate 90 can be electrically connected to an electrical circuit, for example through electrical conductors on the destination substrate 90 (not shown), to provide electrical power and signals to the completed semiconductor micro-device 22.

In some embodiments of the present invention and referring to FIGS. 2A-2K, an exemplary method of making a transfer-printing source structure 99 (e.g., micro-transfer-printing source structure 99) suitable for transfer printing (e.g., micro-transfer printing) can include additional steps and structures compared to the process and transfer-printing source structure 99 described with respect to FIGS. 1A-1G. Referring to FIG. 2A and again to FIG. 3, the source substrate 10 is provided in step 100 but includes a removal layer 26. A source substrate 10 can be one or more of sapphire, quartz, silicon, GaAs, GaN, InP, SiC, GaP, GaSb, AlN, and MgO. A source substrate 10 can be a growth substrate, can have a semiconductor seed layer, or can be a semiconductor layer 20.

A removal layer 26 can be an ablation layer or an etch-stop layer and can be a layer of the source substrate 10 or a layer disposed on the source substrate 10. In some embodiments, a removal layer 26 is a portion of a semiconductor layer 20. Ablation and etch-stop layers are generally known in the art and can include $SiO_x$ or $SiN_x$ deposited by plasma-enhanced CVD (PECVD) or organic layers with or without particles. Additional layers, such as buffer layers (e.g., C—GaN, AlGaN, or doped GaN) or one or more semiconductor growth layers can be provided as well.

One or more semiconductor layers 20 are disposed in, on, or over the source substrate 10 in step 105 (FIG. 2A). The one or more semiconductor layers 20 can be processed in step 110 to make a completed semiconductor micro-device 22 (FIG. 2B) with electrical contacts 25 and patterned dielectric layers 24 over or in contact with the removal layer 26, as described with respect to FIGS. 1A and 1B. A completed semiconductor micro-device 22 can include one or more of a semiconductor material, a compound semiconductor material, GaN, Si, InP, SiGe, and GaAs.

Figure 2C:
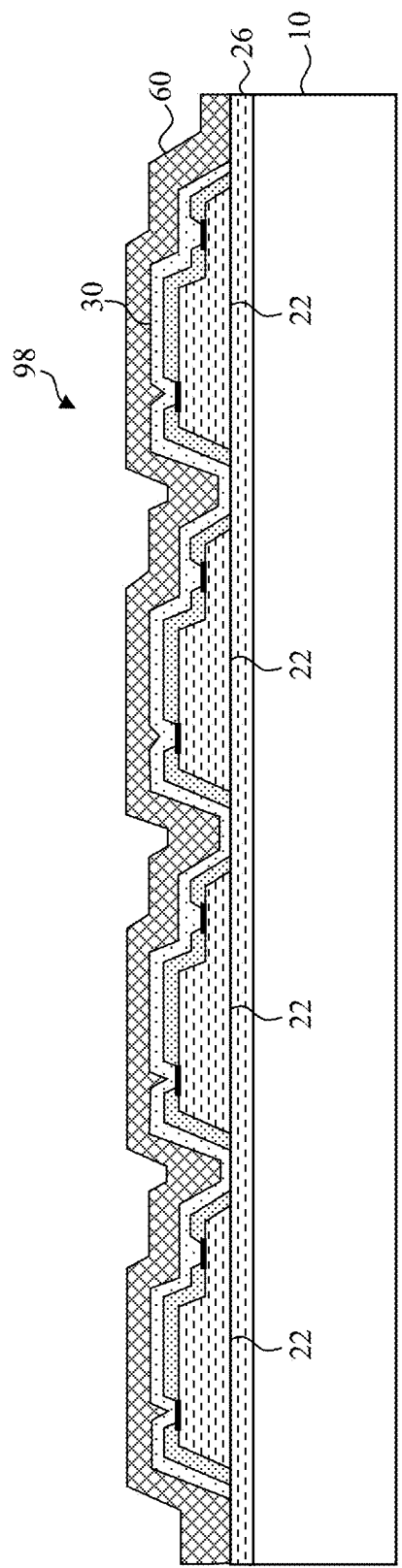

Referring next to FIG. 2C, a patterned or unpatterned release layer 30 is formed or disposed on or over the completed semiconductor micro-device 22 in step 115 and is at least partially in contact with the removal layer 26. A patterned or unpatterned release layer 30 can include germanium, Si, TiW, Al, Ti, a lift-off resist, or other polymers and, when etched, can be a gap 32 or space.

In some embodiments, a removal layer 26 (e.g., an ablation or etch-stop layer) is a portion, but only a portion, of the completed semiconductor micro-device 22. In some embodiments, a transfer-printing source structure 99 includes a removal layer 26 in contact with a completed semiconductor micro-device 22 and is disposed on or over, or is a part of, a source substrate 10. In some embodiments, a source substrate 10 is in contact with a completed semiconductor micro-device 22 or a removal layer 26 and the removal layer 26 is in contact with the completed semiconductor micro-device 22.

An optional base layer 60 is disposed on the release layer 30 in optional step 120. An optional base layer 60 can be deposited using photolithographic methods such as evaporation, sputtering, plating, vapor deposition, atomic layer deposition (ALD), or coating and can include organic or inorganic materials such as SiNx, SiOx, copper, nickel, or other materials. An optional base layer 60 can be blanket coated or patterned and can be in contact with a portion of a removal layer 26, or not.

Figure 2D:
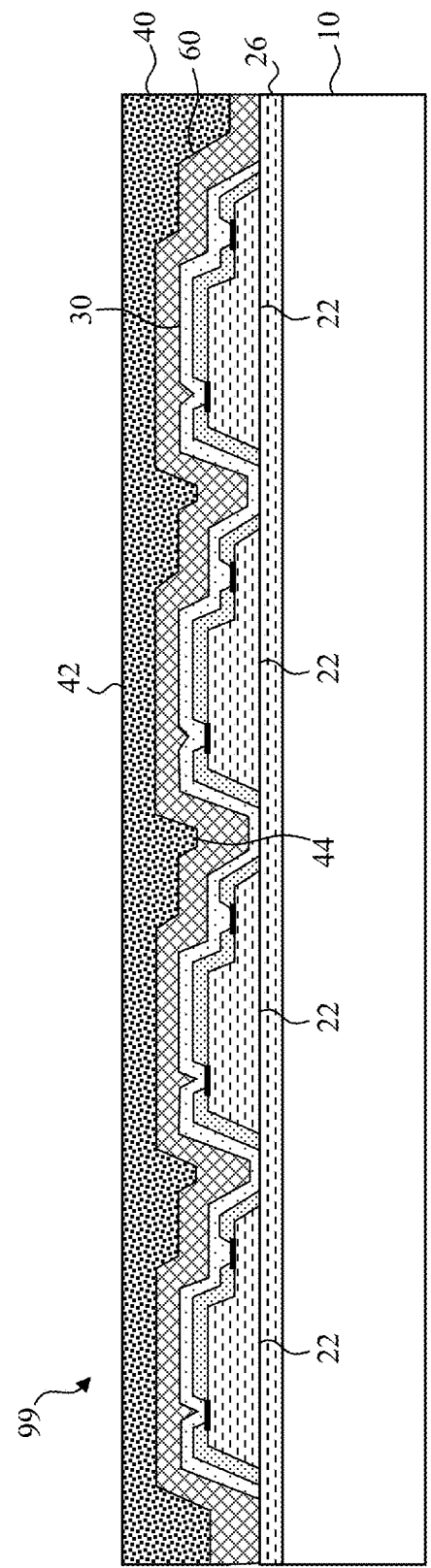

An optional base layer 60 can be non-planar, patterned, structured or shaped, can be a stiffener that is less flexible or harder than, for example, a release layer 30, bonding layer 40 or support substrate 50, can stiffen a transfer-printing source structure 99, or can include multiple layers of different materials that can be selected and formed to control acoustic or mechanical vibrations. In some embodiments, a release layer 30 is unpatterned and a base layer 60 is a blanket layer in contact with the release layer 30 (e.g., as shown in FIG. 2D). In some embodiments (not shown), a release layer 30 is patterned to expose a portion of a removal layer 26 and a base layer 60 is partially in contact with the removal layer 26. An optional base layer 60 can also be patterned to expose a portion of the removal layer 26 (not shown). In embodiment illustrated in FIG. 2A-2K, the optional base layer 60 and release layer 30 are unpatterned but in certain embodiments either or both are patterned.

Figure 2E:
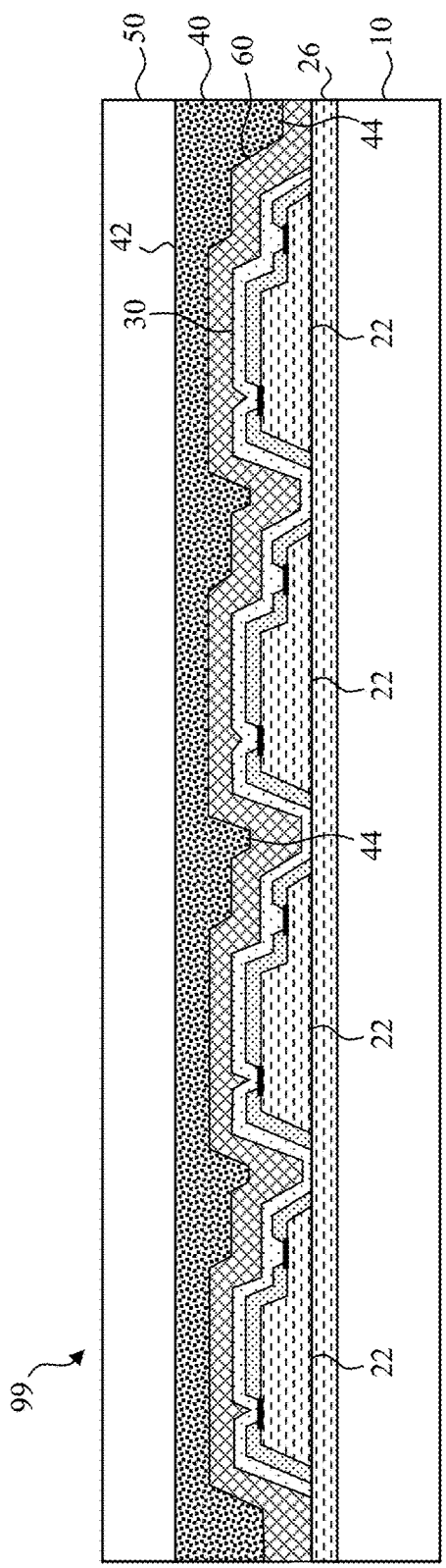
Figure 2F:
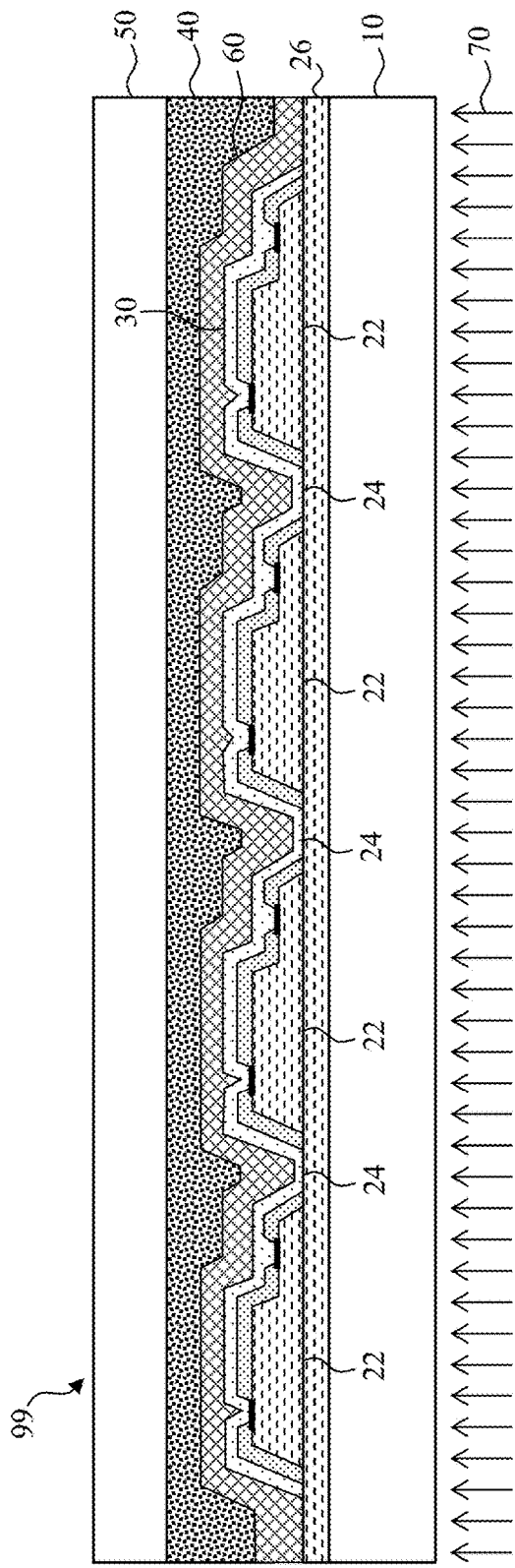

Referring to FIGS. 2D and 2E, a conformable and curable bonding layer 40 is disposed on the optional base layer 60 (as shown) or on the removal layer 26 (if the release layer 30 and optional base layer 60 are patterned, not shown), in step 125 and the support substrate 50 is provided in step 130. The conformable and curable bonding layer 40 can have a substantially planar side 42 opposite a non-planar side 44 closer to the completed semiconductor micro-device 22. A support substrate 50 can be substantially transparent, for example 50%, 70%, or 90% transparent to visible, UV, or IR electromagnetic radiation or to laser radiation. A bonding layer 40 can be, for example, a curable resin, a cured resin, epoxy, SU-8, a metal layer, a metal alloy layer, a solder layer, or AuSn.

The support substrate 50 is contacted to the bonding layer 40 (FIG. 2E) and bonded to the completed semiconductor micro-devices 22, for example by curing the curable bonding layer 40 in step 135 (FIG. 2F), for example by providing time, heat, cooling, or electromagnetic radiation to the bonding layer 40, for example through the support substrate 50. The material of the base layer 60 provided in optional step 120 can be selected to prevent unwanted interactions between the release layer 30 etching chemistry and the bonding layer 40. For example, a certain etchant that is suitable for etching a release layer 30 might also undesirably etch a bonding layer 40, compromising a micro-transfer printing process for a completed semiconductor micro-device 22 without the presence of an optional base layer 60.

Referring to FIG. 2G, the source substrate 10 is removed in step 140. The source substrate 10 can be removed by laser ablating the removal layer 26 or a portion of the completed semiconductor micro-device 22, causing a mechanical or acoustic shock wave to propagate through the completed semiconductor micro-device 22. In some embodiments, a removal layer 26 is exposed to electromagnetic radiation 70 (for example from a laser) through a source substrate 10 and to which the source substrate 10 is at least partially transparent to decompose at least a portion of the removal layer 26. The removal layer 26, for example an ablation layer, absorbs and is heated by the electromagnetic radiation 70 and evaporates or sublimes (sublimates) to a gas or plasma that forcefully dissociates the source substrate 10 from the removal layer 26.

Ablation layers are generally known in the art and can be selected to complement a source substrate 10 or layer materials formed on or in the source substrate 10. An ablation layer can be a portion of the source substrate 10 or can be the same material as is found in semiconductor layers 20 or a portion of the semiconductor layers 20, for example GaN. Moreover, GaN can serve as an ablation layer for sapphire or AlN source substrates 10. GaNAs or InGaNAsSb can be included in ablation layers or materials grown on GaAs substrates. InGaAs, InGaAsP, AlInGaAs, or AlInGaAsP can be included in ablation layers or materials grown on InP substrates. Black chromium can be an ablation layer. Ablation layers can include organic materials such as vaporizable polymer or materials that incorporate light-absorbing particles such as carbon black or oxidized chromium and that can absorb electromagnetic radiation 70, facilitate ablation layer heating, and ablate of the layer.

Typically, laser ablation transfers momentum to a surface and, in some embodiments of the present invention, can form a shock wave (an acoustic or mechanical pulse of high pressure) that passes into and through the completed semiconductor micro-devices 22 and can damage the completed semiconductor micro-devices 22. To reduce or avoid damage from a shock wave, in some embodiments, a base layer 60, and, optionally, to some extent a bonding layer 40 and release layer 30, has a thickness and layer material shape or structure to disperse, deflect, reflect, or absorb the shock wave and prevent or mitigate damage to a completed semiconductor micro-devices 22. A base layer 60 can have a plurality of layers and different materials. The layers, materials, and structure of a base layer 60 can be specifically designed to prevent or mitigate damage to a completed semiconductor micro-devices 22. Germanium is one option for a release layer 30 and has a large acoustic impedance and can therefore effectively reflect or redirect the shock wave. Thus, in some embodiments of the present invention, laser ablation can be used to remove a source substrate 10 and exposes at least a portion of the release layer 30 (e.g., as shown in FIG. 2G).

As shown in FIG. 2H (inverted from FIG. 2G), the release layer 30 is removed in step 150, for example by etching as described above with respect to FIG. 1G. After etching, the release layer 30 forms a gap 32 or space between some portions of the completed semiconductor micro-devices 22 and the base layer 60. The micro-devices 22 are completely separated from the base layer 60 and the support substrate 50.

Figure 2I:
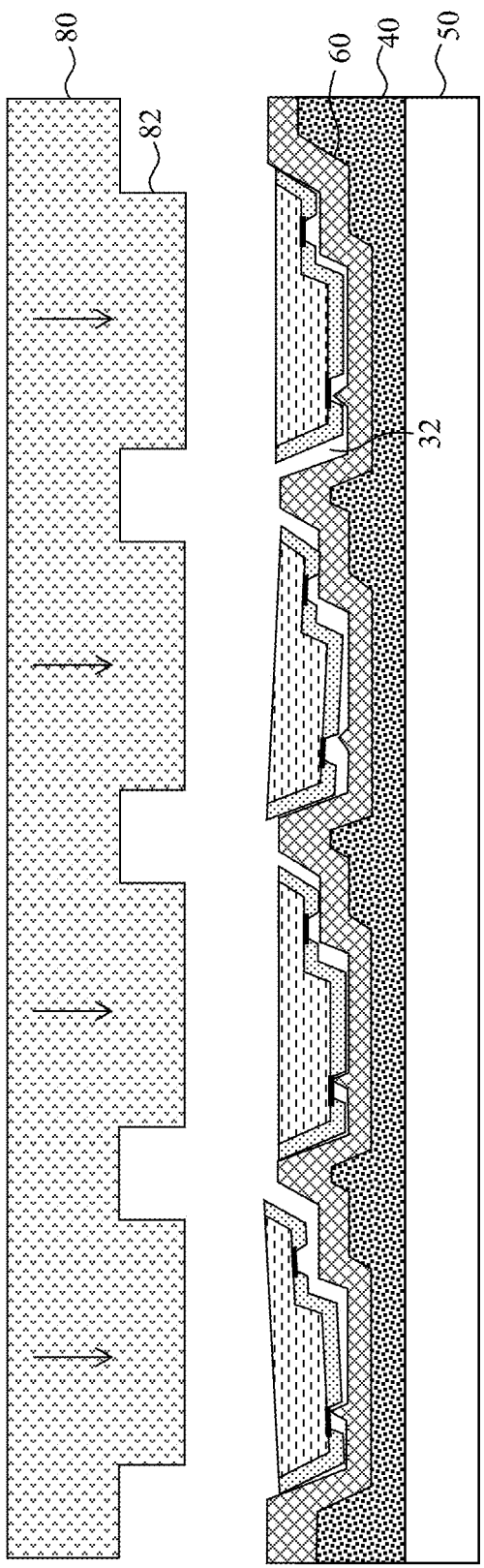
Figure 2J:
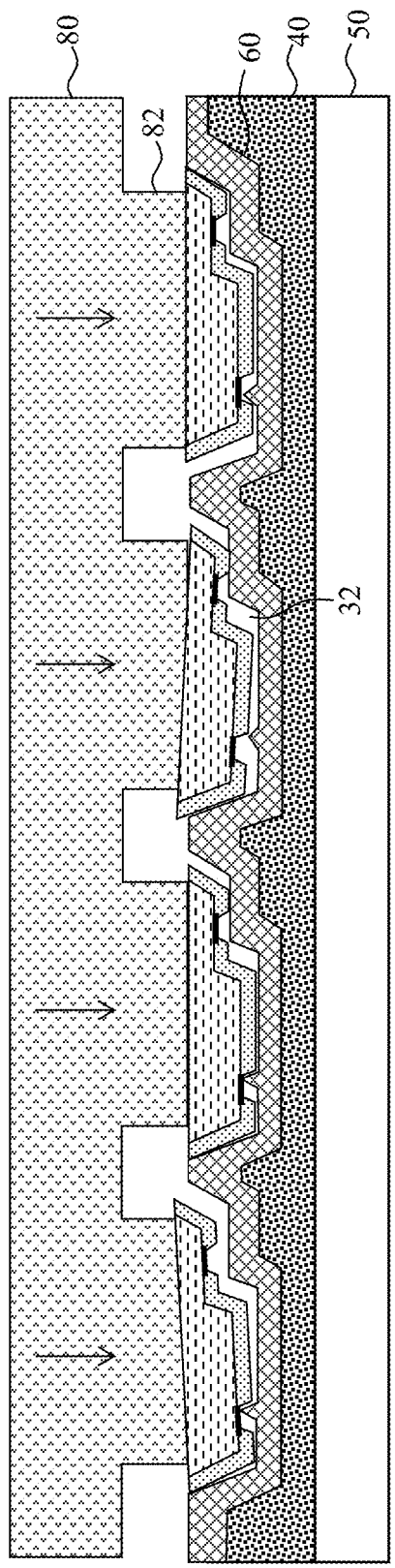
Figure 2K:
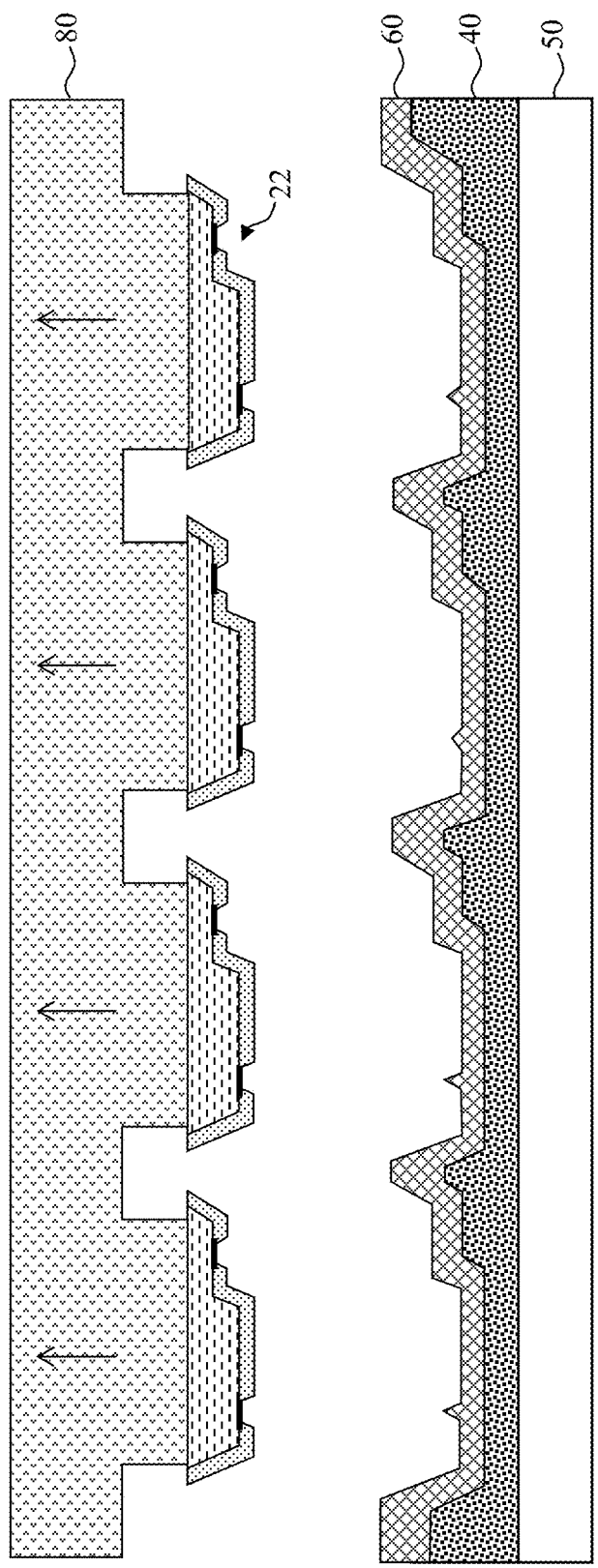

Once the release layer 30 is etched, the completed semiconductor micro-devices 22 can be micro-transfer printed in step 160 to a destination substrate 90 provided in step 155, as illustrated in FIGS. 2I and 2J, with a stamp 80 having stamp posts 82 that align with and then can deform, compress, press against, and adhere to the completed semiconductor micro-devices 22 and is then separated from the support substrate 50 (FIG. 2K). The completed semiconductor micro-devices 22 are brought into aligned contact with a destination substrate 90 and micro-transfer printed to the destination substrate 90, as shown and described with respect to FIG. 1J.

Referring next to FIG. 4A, in some embodiments, semiconductor layer(s) 20 are formed in a source substrate 10, for example by doping or implanting the source substrate 10 form a layer on or in the top of the source substrate 10 in step 105 that is the semiconductor layer(s) 20. The semiconductor layer(s) 20 can be processed in step 110 to form the completed semiconductor micro-devices 22 (FIG. 4B). Thus, forming the semiconductor layer(s) 20 in step 105 can include forming a layer on the source substrate 10 (FIGS. 1A, 2A) or forming a layer in the source substrate 10 (FIG. 4B).

Figure 5:
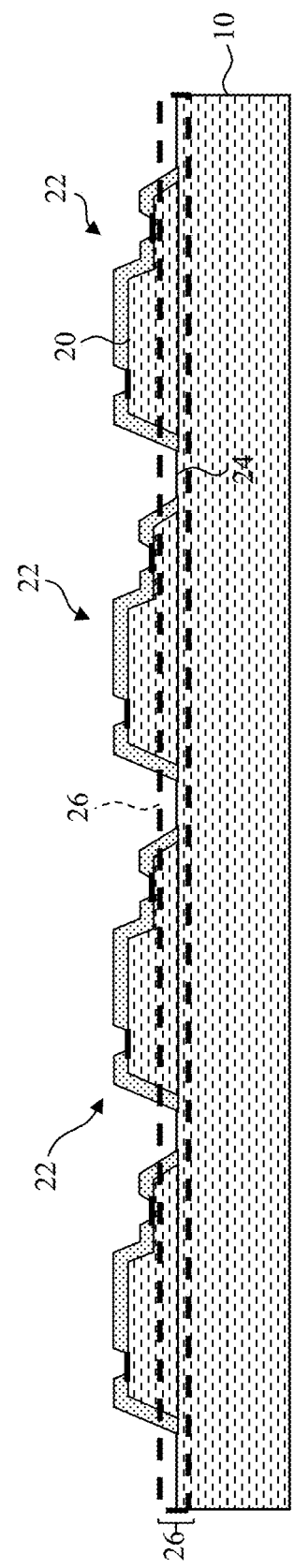
FIG. 5 is a cross section illustrating a semiconductor device with an ablation layer in accordance with some embodiments of the present invention.

In some embodiments, and as shown in FIG. 5, a removal layer 26 is a portion of a completed semiconductor micro-devices 22 and possibly other layers or a portion of a source substrate 10 (in which case the removal layer 26 includes a portion or layer of the source substrate 10). For example, ablation can remove the portion of the structure indicated with the heavy dashed rectangle in FIG. 5. Thus, in the exemplary embodiment of FIG. 5, removing the source substrate 10 (step 140) comprises exposing the semiconductor layer 20 or completed semiconductor micro-device 22 to electromagnetic radiation 70 through the source substrate 10 to decompose a portion of the semiconductor layer(s) 20 or completed semiconductor micro-device 22 and form a shock wave in the micro-transfer-printing source structure 99. The base layer 60, if present, can at least partially disperse, reflect, deflect, or absorb the shock wave. In some embodiments, the removal layer 26 is a portion of, or a layer on, the source substrate 10 (FIG. 2A). The exemplary embodiments described in FIGS. 1A-1J and 2A-2K use a flip-chip approach to micro-transfer printing the micro-devices 22 with the side of the micro-devices 22 opposite the source substrate 10 in contact with the destination substrate 90. In some embodiments, another side of micro-devices 22 is micro-transfer printed into contact with a destination substrate 90.

Figure 6A:
FIGS. 6A-6G are successive cross sections illustrating sequential steps in an exemplary method according to some embodiments of the present invention and illustrating a semiconductor structure according to some embodiments of the present invention.
Figure 6B:
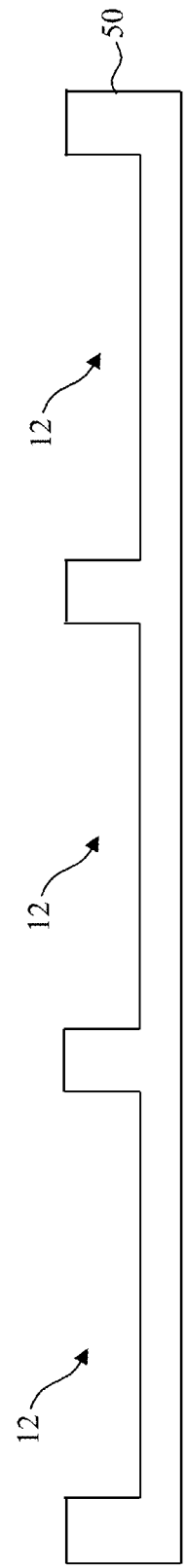
Figure 6C:
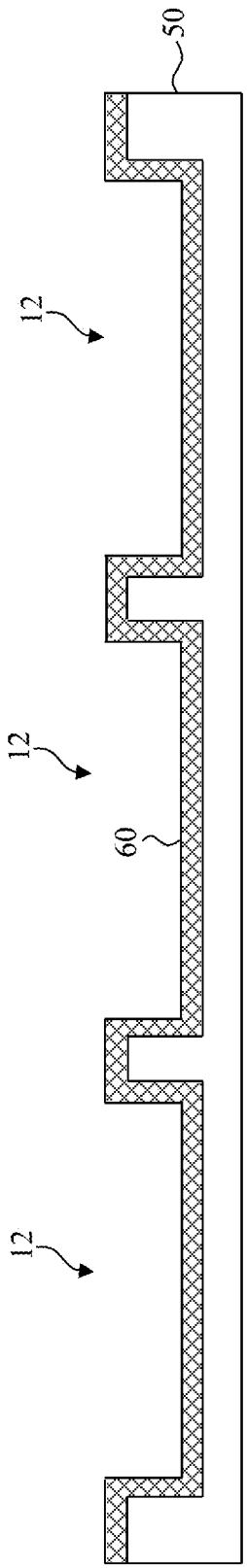
Figure 6D:
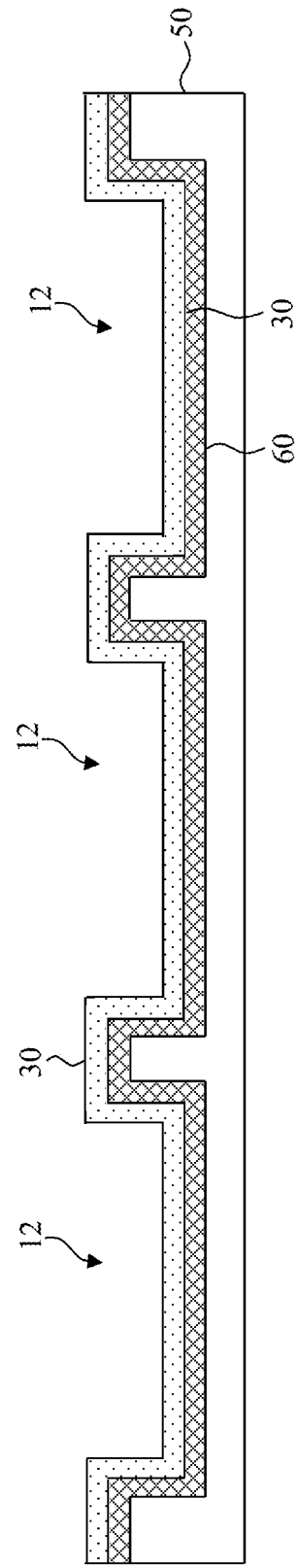
Figure 6E:
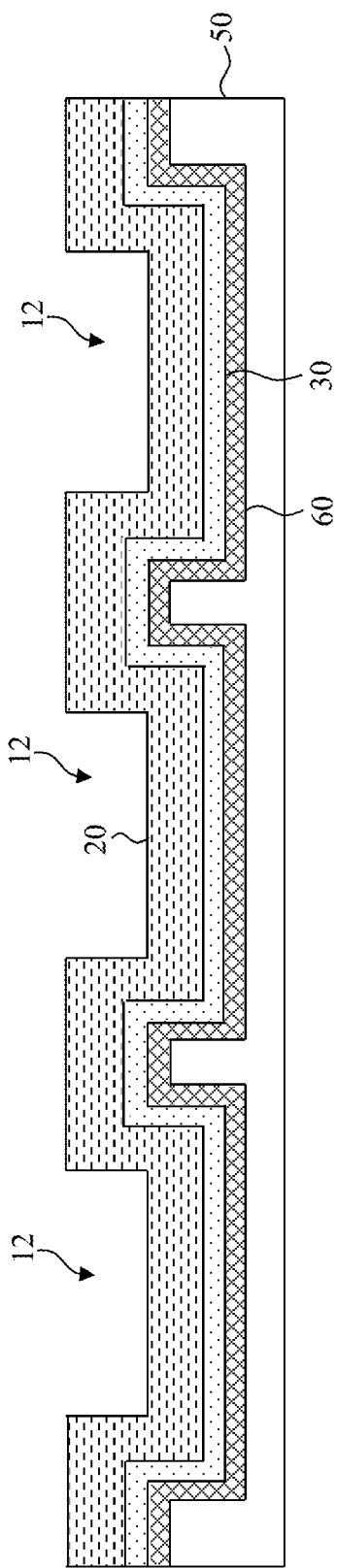
Figure 6F:
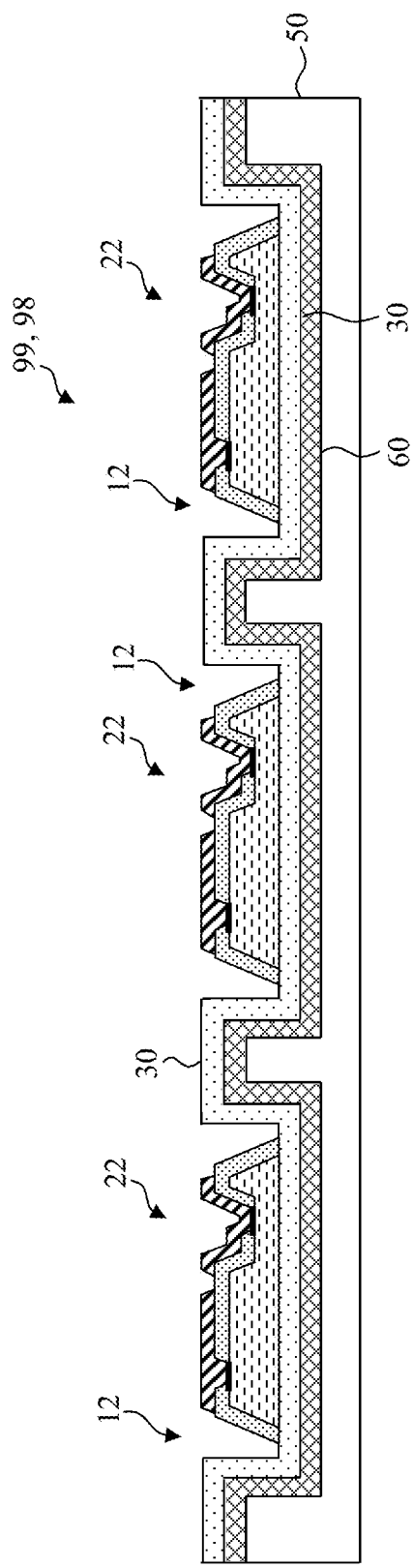
Figure 6G:
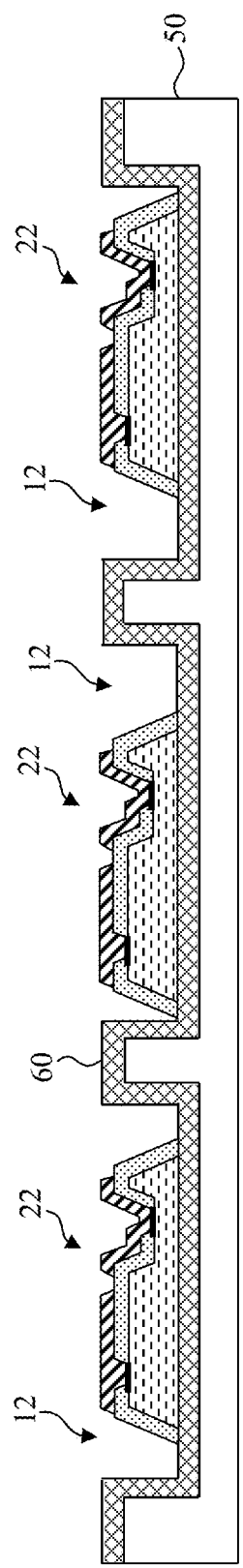
Figure 7:
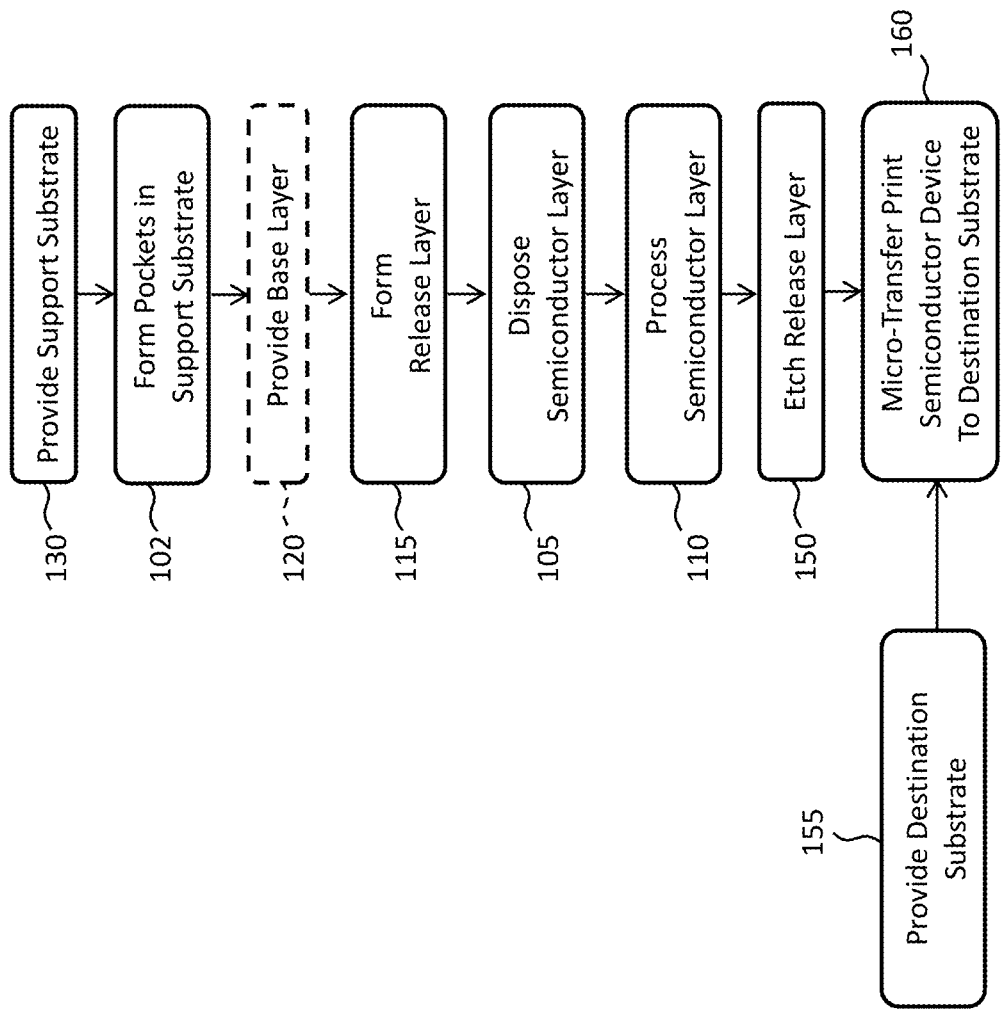
FIG. 7 is a flow diagram illustrating exemplary embodiments of the present invention including the exemplary method and structures illustrated in FIGS. 6A-6G.

Referring to the flow diagram of FIG. 7 and the successive cross section illustrations of FIGS. 6A-6G, an exemplary method according to some embodiments of the present invention includes providing a support substrate 50 in step 130 (FIG. 6A). In some such embodiments, the support substrate 50 can also be a source substrate 10 or native substrate on which the micro-devices 22 are formed. In step 102, pockets 12 are formed in the support substrate 50, as shown in FIG. 6B. In some embodiments, pockets 12 are etched in a support substrate 50. In some embodiments, a layer, for example a polymer layer, is coated over a support substrate 50. Pockets 12 can be micro-imprinted in the layer and then the layer can be cured or the pockets 12 can be patterned (e.g., etched) in the layer to expose the support substrate 50. In some embodiments, pockets 12 can be etched only partially through the layer. In some such embodiments, a layer can be a part of a support substrate 50.

In optional step 120 and as shown in FIG. 6C, an optional base layer 60 is optionally deposited, coated, or formed and optionally patterned over a support substrate 50 and in the pockets 12. In step 115 and as shown in FIG. 6D, the release layer 30 is similarly deposited, coated, or formed and optionally patterned. Next, in step 105 and as shown in FIG. 6E, the semiconductor layer 20 is deposited, including any initial seed layer. The semiconductor layer 20 can be patterned, or not. In step 110, the semiconductor layer 20 is processed to form the semiconductor structure micro-devices 22 (FIG. 6F) within the pockets 12 and in contact only with the release layer 30. Referring to FIG. 6G, in step 150 the release layer 30 is etched to separate and detach the semiconductor micro-devices 22 from the support substrate 50 and optional base layer 60. The micro-devices 22 can fall into the pockets 12 (in a non-flipped configuration) and then be transfer printed (e.g., micro-transfer printed) (step 160) to a provided destination substrate 90 (step 155) as described above. Steps 105, 110, 115, 120, 130, 150, 155, and 160 are similar to those described with respect to FIG. 3, and can use the same methods and materials.

In some embodiments in which an optional base layer 60 is absent, the structure of FIG. 8A corresponds to that of FIG. 6F and the structure of FIG. 8B corresponds to that of FIG. 6G. In both FIGS. 8A and 8B, no base layer 60 is present and the structures are otherwise similar to those of FIGS. 6F and 6G.

The exemplary method shown in FIGS. 6A-6G does not require a source substrate 10 in addition to a support substrate 50 or a bonding layer 40 but, because the micro-devices 22 are formed over the release layer 30, the materials used in the semiconductor layer 20 can be different from those provided over a source substrate 10.

Figure 9C:
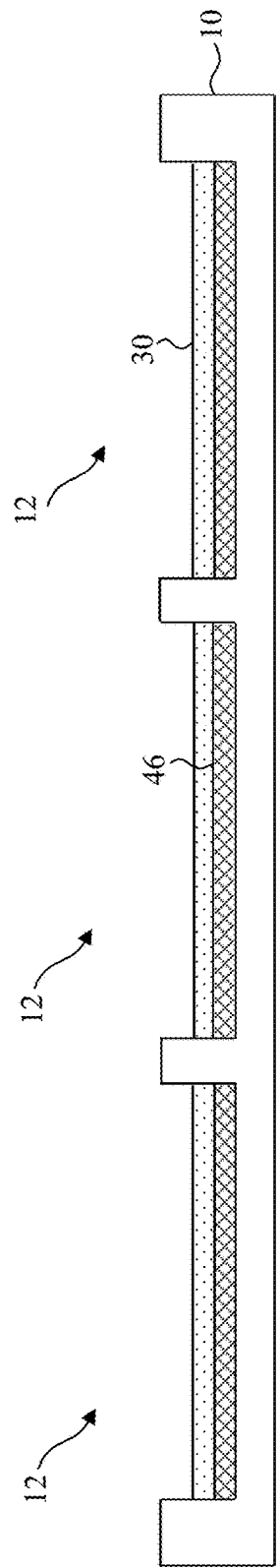
Figure 9D:
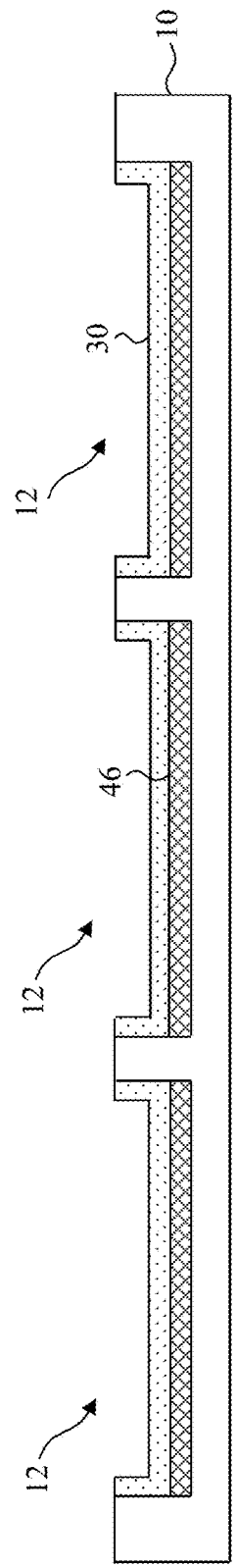
Figure 9E:
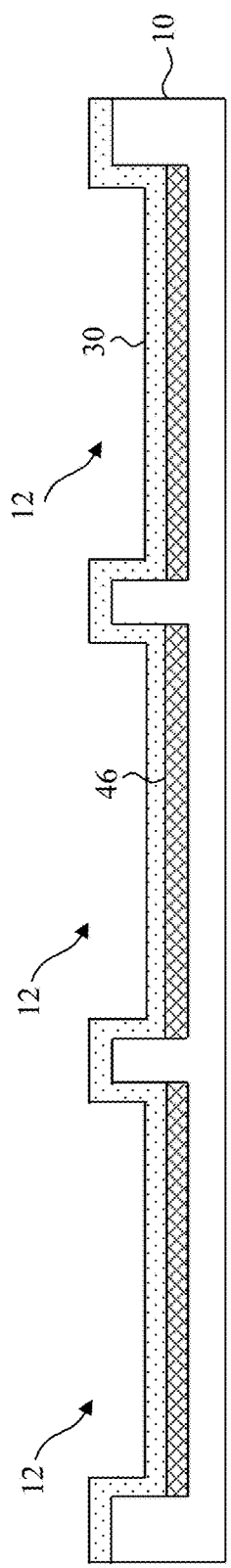
Figure 9F:
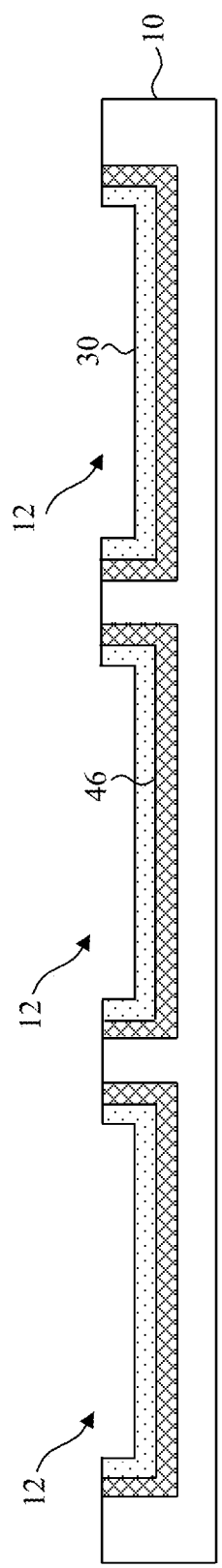
Figure 9G:
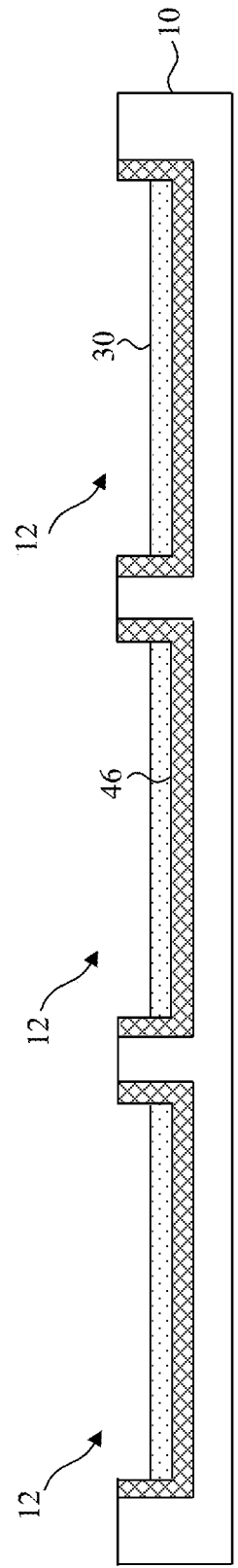

Referring to FIGS. 9A-9E, the optional base layer 60 and the release layer 30 can be patterned in different arrangements. Referring to FIG. 6D, the optional base layer 60 and the release layer 30 are blanket coated and unpatterned over the support substrate 50 and pockets 12. Referring to FIG. 9A, the optional base layer 60 is blanket coated and unpatterned over the support substrate 50 and pockets 12 and the release layer 30 is patterned and present only on the sides and bottom within the pockets 12. As shown in FIG. 9B, the optional base layer 60 is blanket coated and unpatterned over the support substrate 50 and pockets 12 and the release layer 30 is patterned and present only on the bottom of the pockets 12. Referring to FIG. 9C, the optional base layer 60 and the release layer 30 are patterned and present only on the bottom of the pockets 12. Referring to FIG. 9D, the optional base layer 60 is patterned and present only on the bottom of the pockets 12 and the release layer 30 is patterned and present on the sides and bottom of the pockets 12. Referring to FIG. 9E, the optional base layer 60 is patterned and present only on the bottom of the pockets 12 and the release layer 30 is blanket coated and unpatterned over the support substrate 50 and pockets 12. Referring to FIG. 9F, the optional base layer 60 and the release layer 30 are patterned and present only on the sides and the bottom of the pockets 12. Referring to FIG. 9G, the optional base layer 60 is patterned and present only on the sides and the bottom of the pockets 12 and the release layer 30 is patterned and present only on the bottom of the pockets 12. These various configurations can contain micro-devices 22 and control a release and separation process from an optional base layer 60 and a support substrate 50 for different materials and micro-devices 22.

In various embodiments of the present invention, a micro-device 22 is disposed completely within a pocket 12, has a surface coincident with the top of a support substrate 50 (as shown), or protrudes from a pocket 12 (not shown). In some embodiments, a pocket 12 has a volume that is less than the volume of the micro-device 22 and the micro-device 22 protrudes from the pocket 12 after the micro-device 22 is released from the pocket 12. Thus, in some embodiments of the present invention the pockets 12 can have a volume greater than, the same as, or less than the volume of the micro-devices 22. In some embodiments, a micro-device 22 has a surface that is aligned or parallel or at least partially in a plane with an exposed portion of a bonding layer 40 opposite a support substrate 50. In certain embodiments, these various configurations can control the process by which a micro-device 22 is constructed, released, or micro-transfer printed.

Pockets 12 can constrain movement of untethered and detached micro-devices 22 after a release layer 30 is etched. In some embodiments, in order to effectively micro-transfer print micro-devices 22 from pockets 12, stamp posts 82 must have an extent large enough to successfully contact and adhere to the exposed surface of the micro-devices 22 despite any variation in the location of the micro-devices 22 in the pockets 12. Furthermore, the variation in position of micro-devices 22 in pockets 12 can be complemented by the size of contact pads 92 on a destination substrate 90. The difference in size between micro-devices 22 and pockets 12 can be used to determine (e.g., correspond to) a size of contact pads 92 on a destination substrate 90. Furthermore, the separation between electrical contacts 25 of micro-devices 22 should be greater than the difference in size between the micro-devices 22 and pockets 12 in one or more corresponding dimension(s) to avoid electrically connecting the wrong electrical contact 25 to a contact pad 92. In some embodiments, a stamp post 82 has an area and dimensional extent smaller than the corresponding area and dimensional extent of a pocket 12 over a support substrate 50 so that the stamp post 82 can extend into the pocket 12 to contact a micro-device 22. In some embodiments, a stamp post 82 has an area greater than the area of a contact surface of a micro-device 22 surface (e.g., that was opposite a release layer 30), for example if the micro-device 22 protrudes from its pocket 12, and a stamp post 82 with an area larger than the surface area of the pocket 12 can be used.

In general, an exemplary method for micro-transfer printing a micro-device 22 from a support substrate 50, according to some embodiments of the present invention, includes the steps of providing a micro-device 22, forming a pocket 12 in or on a support substrate 50, providing a release layer 30 over the micro-device 22 or the pocket 12, disposing the micro-device 22 in the pocket 12 with the release layer 30 between the micro-device 22 and the support substrate 50 so that no portion of the support substrate 50 is in contact with the micro-device 22, etching the release layer 30 to completely separate the micro-device 22 from the support substrate 50, providing a stamp 80 having a conformable stamp post 82 and pressing the stamp post 82 against the separated micro-device 22 to adhere the micro-device 22 to the stamp post 82, and removing the stamp 80 and micro-device 22 from the support substrate 50. In some embodiments, for example, the steps of disposing the semiconductor layer 20 (step 105) and forming the micro-devices 22 (step 110 processing the semiconductor layer 20), forming the release layer 30 (step 115), and disposing the optional base layer 60 (step 120) can be reversed (as shown in FIGS. 3 and 7).

According to some embodiments of the present invention and as illustrated in FIGS. 1F-1G and 2G-2H, a transfer-printing source structure 99 suitable for transfer printing (e.g., micro-transfer printing) (e.g., made by a method described above) includes a support substrate 50, a conformable, cured bonding layer 40 disposed on and in contact with the support substrate 50, an optional base layer 60 disposed on and in contact with the bonding layer 40, a release layer 30 disposed on and in contact with the cured bonding layer 40 or the optional base layer 60, and a micro-device 22 on and in contact with the release layer 30.

In the exemplary embodiment shown in FIG. 6F, a transfer-printing source structure 99 suitable for transfer printing (e.g., micro-transfer printing) (e.g., made by a method described above) includes a support substrate 50, an optional base layer 60 disposed on and in contact with the support substrate 50, a release layer 30 disposed on and in contact with the support substrate 50 or the base layer 60, and a micro-device 22 on and in contact with the release layer 30. In the embodiment shown in FIG. 8A, a transfer-printing source structure 99 suitable for transfer printing (e.g., micro-transfer printing) (e.g., made by a method described above) includes a support substrate 50, a release layer 30 disposed on and in contact with the support substrate 50, and a micro-device 22 in a pocket 12 on and in contact with the release layer 30. In some embodiments, any of the release layer 30, the optional base layer 60, or both are patterned over the support substrate 50.

A support substrate 50, a release layer 30, and an optional base layer 60 can define or form one or more pockets 12 in a bonding layer 40 in each of which a micro-device 22 is disposed. In some embodiments, the release layer 30 completely separates the micro-devices 22 from the optional base layer 60, the bonding layer 40 if present, and the support substrate 50 so that the micro-devices 22 are not in direct contact with any of the optional base layer 60, the bonding layer 40 if present, and the support substrate 50. When the release layer 30 is etched, the micro-devices 22 are detached from the optional base layer 60, the bonding layer 40 if present, and the support substrate 50 and can fall into the pockets 12. In some embodiments, a micro-device 22 protrudes from a pocket 12. In some embodiments, a micro-device 22 is completely within a pocket 12 or has a surface at the top of the pocket 12. Thus, a micro-device 22 can have a thickness that is greater than the depth of a pocket 12 or a thickness that is less than or equal to the depth of the pocket 12. In some embodiments, a pocket 12 constrains the movement of a micro-device 22 during the etch process to the physical extent of the pocket 12 so that micro-devices 22 remain in corresponding pockets 12, facilitating, for example, the micro-transfer printing of the micro-devices from the pockets 12 to a destination substrate 90.

In some embodiments of the present invention, and referring to FIGS. 1C and 2C, a micro-device wafer structure 98 comprises a source substrate 10 (e.g., source wafer 10), a micro-device 22 disposed on, over, or in direct contact with the source substrate 10, a release layer 30 disposed over the entire micro-device 22 on a side of the micro-device 22 opposite the source substrate 10, and an optional base layer 60 disposed on the release layer 30 on a side of the release layer 30 opposite the micro-device 22 (FIG. 2C). A source substrate 10 can be sapphire and a micro-device 22 can comprise a compound semiconductor. A source substrate 10 can be a wafer to which devices (e.g., micro-devices 22) are native and on which the devices are formed.

An exemplary micro-device wafer structure 98 is illustrated in FIG. 6F and comprises a source substrate 10 (e.g., source wafer 10) including a pocket 12, an optional base layer 60 disposed on the release layer 30 in the pocket 12 on the source wafer 10, a release layer 30 disposed over the optional base layer or at least the pocket 12 on the source wafer 10, and a micro-device 22 exclusively in contact with the release layer on a side of the release layer 30 opposite the source substrate 10.

In some embodiments of the present invention (not shown), the completed semiconductor micro-device 22 has a semiconductor structure with a planar surface adjacent to a release layer 30 opposite a source substrate 10 so that electrical contacts 25 are in a common plane. Such a structure can be found, for example in an integrated circuit with a substantially rectangular cross section. This arrangement facilitates electrical connection between the electrical contacts 25 and contact pads 92. Since the contact pads 92 are likewise in a common plane on a surface of a destination substrate 90, the electrical contacts 25 can both contact the contact pads 92 at the same time.

However, in some embodiments and as illustrated in FIGS. 1C and 2C, a completed semiconductor micro-device 22 has a semiconductor structure with a non-planar surface adjacent to a release layer 30 and opposite a source substrate 10 so that electrical contacts 25 are not in a common plane. Thus, in some embodiments, the structure or arrangement of a completed semiconductor micro-device 22 or destination substrate 90 is modified or adjusted in order to form an electrical connection between the completed semiconductor micro-device 22 and contact pads 92 on the destination substrate 90 when the completed semiconductor micro-device 22 is micro-transfer printed to the destination substrate 90.

In some embodiments and as shown in FIG. 1J, a destination substrate 90 has a non-planar surface with a topography that complements the non-planar semiconductor structure surface. In the exemplary embodiment shown in FIG. 1J, the contact pads 92 (which provide at least a portion of the surface topography of the destination substrate 90) have different heights that correspond to the different locations of the non-planar semiconductor structure surface, in particular the different heights of the electrical contacts 25 of the completed semiconductor structures 22 over the destination substrate 90, so that the contact pads 92 can readily make electrical connections with the electrical contacts 25. (In this Figure, the topography in FIG. 1J and the differences in heights are exaggerated for clarity.)

Figure 10A:
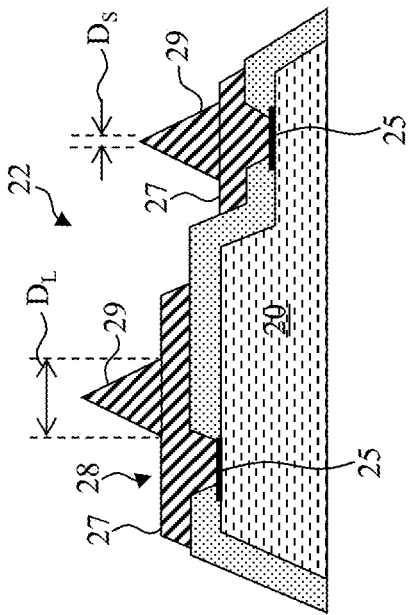
FIGS. 10A-10E are cross sections illustrating a variety of completed semiconductor devices with a corresponding variety of connection post structures in accordance with embodiments of the present invention.
Figure 15:
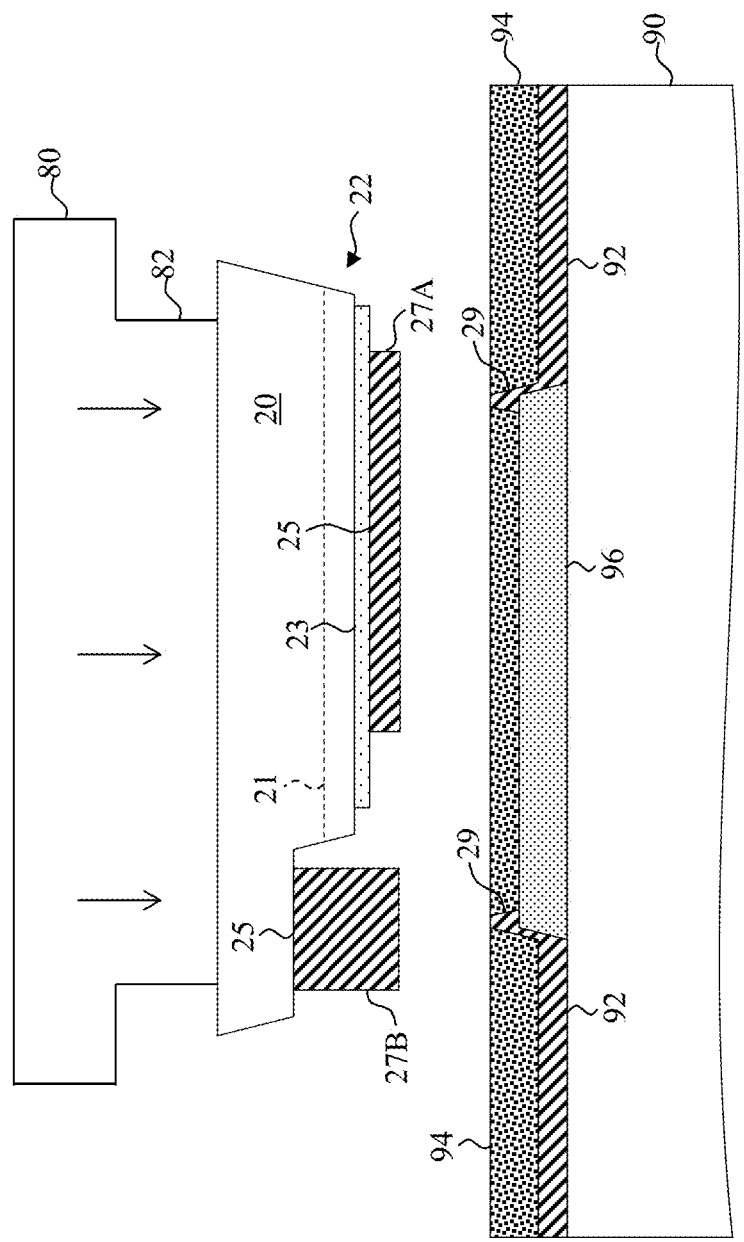
FIG. 15 is a cross section illustrating micro-transfer-printed completed semiconductor devices and a destination substrate with a connection post structure in accordance with an embodiment of the present invention.

In some embodiments and as shown in FIGS. 10A-10E, the structure of semiconductor micro-devices 22 is modified or adapted. Referring to FIG. 10A, the semiconductor micro-device 22 includes a possibly non-semiconductor structure (the electrodes 27) electrically connected to the electrical contacts 25 on a side 28 of the semiconductor micro-device 22 opposite the source substrate 10 (e.g., as shown in FIG. 1B) or support substrate 50 (e.g., as shown in FIG. 6F). Exposed portions of the electrodes 27 together form at least a portion of a common planar surface for the semiconductor micro-device 22 and form electrical contacts 25 for the electrodes 27. The electrodes 27 are electrically connected to the electrical contacts 25 and, when flipped and micro-transfer printed onto a destination substrate 90 (e.g., as shown in FIG. 15, described further below), the exposed portions of the electrodes 27 are in contact with and can readily electrically connect to planar contact pads 92 on the destination substrate 90. Since the electrical contacts 25 are not in a common plane, each of the electrodes 27 have a different thickness, $D_L$, $D_S$, as shown, to provide a surface that is in a common plane. The electrodes 27 can be electrically conductive and made of metal or a conductive metal oxide and can be formed using conventional photolithographic methods, for example deposition (e.g., by evaporation or sputtering) and patterning (e.g., by patternwise etching). Different thicknesses $D_L$, $D_S$ can be achieved by multiple deposition and patterning steps.

Figure 10B:
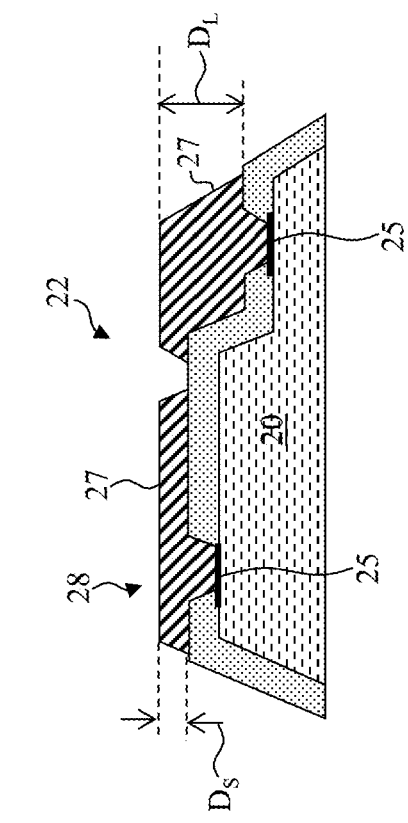

In some embodiments, referring to FIG. 10B, each electrical contact 25 is electrically connected to a connection post 29. In some embodiments, an electrode 27 is electrically connected to each electrical contact 25 and a connection post 29 is electrically connected to each electrode 27. In some embodiments, an electrode 27 includes or forms a connection post 29. Connection posts 29 can be electrically conductive and, for example, can be made of metal or a conductive metal oxide, as can electrodes 27 and made using photolithographic methods and materials. Connection posts 29 can be made of the same material(s) as electrodes 27 and can be made in common steps or processes. Connection posts 29 and corresponding electrode 27 can be a common structure so that the connection posts 29 each include and electrode 27 or the electrode 27 includes the connection post 29.

In some embodiments, a completed semiconductor micro-device 22 includes an electrical contact 25 on the side of the completed semiconductor micro-device 22 adjacent to a source substrate 10 or an electrical contact 25 on the side of the completed semiconductor micro-device 22 adjacent to a release layer 30. Each electrical contact 25 can include an electrically conductive connection post 29. In some embodiments, each completed semiconductor micro-device 22 can include an electrode 27 electrically connected to each electrical contact 25 and a connection post 29 electrically connected to each electrode 27. In some embodiments, an electrode 27 includes or forms a connection post 29 or the connection post 29 includes or forms an electrode 27. In some embodiments, connection posts 29 are exposed and protrude from a surface of a completed semiconductor micro-device 22 farther than any other elements of the micro-device 22 and, when micro-transfer printed to a destination substrate 90, can electrically connect to contact pads 92 on a destination substrate 90.

Figure 10C:
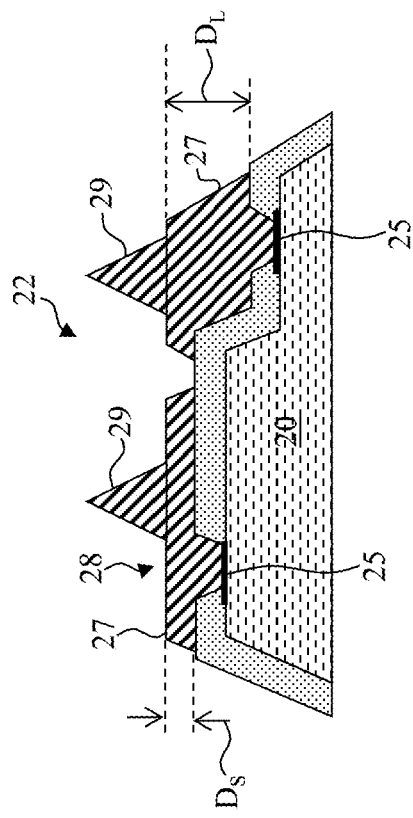
Figure 10D:
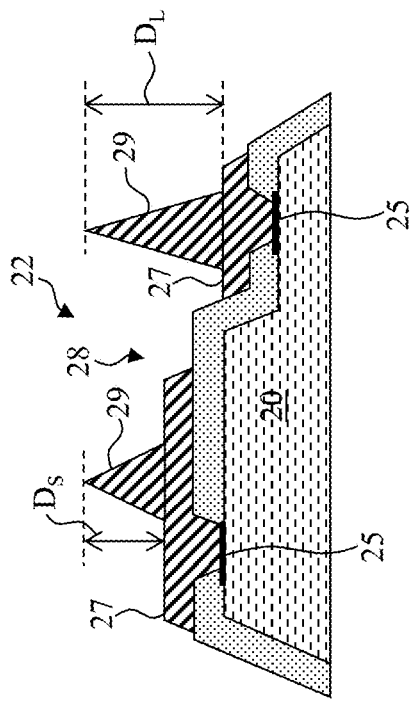
Figure 10E:
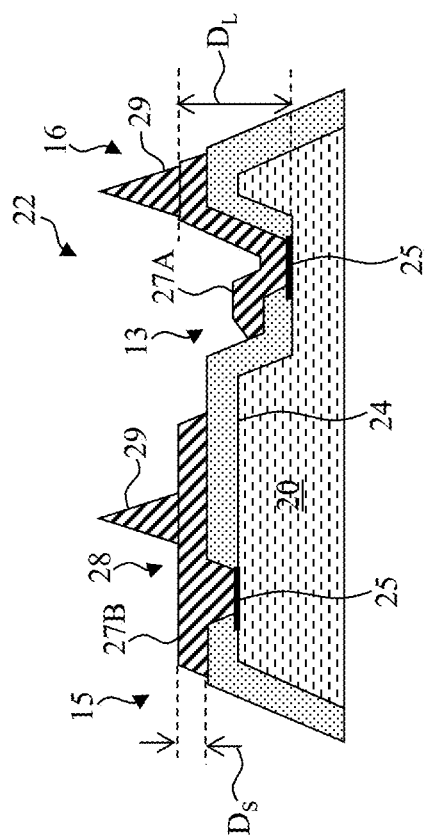

In some embodiments, and to facilitate electrically connecting connection posts 29 to contact pads 92, a connection post 29 has a first surface adjacent to a surface of a completed semiconductor micro-device 22 (a bottom of the connection post 29) and a second opposing surface (a top of the connection post 29). The second opposing surface (top) has a smaller area or dimension $D_S$ than an area or dimension $D_L$ of the first surface (bottom), so that, for example, the connection posts 29 can have a relatively sharp point and can form a spike, as shown in FIG. 10B. In some embodiments, a connection post 29 is cylindrical or has a constant rectangular cross section parallel to a surface of a completed semiconductor micro-device 22 (not shown). Furthermore, a connection post 29 can have a height that is greater than a dimension of the first surface (bottom) or the connection post 29 can have a height that is greater than a dimension of the second opposing surface (top). Thus, a connection post 29 can have an elongated aspect ratio, a height that is greater than a width, and a sharp point. Referring to FIG. 10C, connection posts 29 can have different heights or dimensions $D_S$, $D_L$ so different connection posts 29 have a common projection distance from a completed semiconductor micro-device 22. Referring to FIG. 10D, the structures of FIGS. 10A and 10B are combined to provide connection posts 29 that have a common projection distance from a completed semiconductor micro-device 22 using different electrode 27 thicknesses $D_S$, $D_L$ and common connection post 29 sizes. Referring to FIG. 10E, a semiconductor structure 20 has a thin portion 13 separating thicker first and second end portions 15, 16 of the semiconductor structure 20 on which connection posts 29 are formed.

Thus, in some embodiments of the present invention, a micro-transfer printable micro-device 22 comprises a semiconductor structure 20 with at least one side 28 and two or more electrical contacts 25 on the side 28. Two or more electrically separate electrodes 27 are disposed at least partially on the side 28 and extend from the semiconductor structure 20 a distance greater than any other portion of the micro-transfer printable micro-device 22 to form an electrically conductive connection post 29 electrically connected to an electrical contact 25.

Connection posts 29 can be formed by repeated masking and deposition processes that build up three-dimensional structures. In some embodiments, connection posts 29 are made of one or more high elastic modulus metals, such as tungsten. As used herein, a high elastic modulus is an elastic modulus sufficient to maintain the function and structure of a connection post 29 when pressed into a destination substrate 90 contact pad 92. Connection posts 29 can be made by etching one or more layers of electrically conductive metal or metal oxide evaporated or sputtered on a side of semiconductor layers 20 opposite the source substrate 10. Connection posts 29 can have a variety of aspect ratios and typically have a peak area smaller than a base area. Connection posts 29 can have a sharp point that is capable of embedding in or piercing destination substrate 90 contact pads 92. Semiconductor devices with protruding connection posts 29 generally are discussed in U.S. Pat. No. 8,889,485, whose description of connection posts is incorporated by reference herein.

In some embodiments of the present invention, connection posts 29 are made with overlapping structures formed on underlying layers. Referring to FIG. 11A, in an exemplary method a substrate 10 is provided and a first layer patterned on the side 28 of the source substrate 10, for example a patterned dielectric layer 24 (e.g., as shown in FIG. 11B) having a first extent A over the source substrate 10. Referring to FIG. 11C, a second patterned layer, for example an electrical contact 25, having a second extent B is patterned over the source substrate 10 side 28. The first and second extents A, B only partially overlap. The overlapping portion of the electrical contact 25 forms a connection post 29. Note that the connection post 29 could form a point or be a ridge, a rectangle, a ring, or other non-point shape. The process can be repeated to form a second connection post 29 using third and fourth layers or the same steps can be used to construct multiple connection posts 29 by forming multiple overlapping portions of the first and second layers.

In some embodiments, connection posts 29 are formed by physical vapor deposition through a template mask 14, as shown in the successive cross sections A-E of FIG. 12. Referring to FIG. 12, a substrate (e.g., destination substrate 90 or source substrate 10) has an electrical connection (e.g., contact pad 92 or electrical contact 25) on a surface and a template mask 14 structure, for example a pair of polymer re-entrant structures (FIG. 12A), formed on either side of the electrical connection. A suitable material, such as a metal for example, aluminum, gold, silver, titanium, tin, tungsten or combinations of metals is physically evaporated over the substrate, electrical connection and template mask 14. As physical vapor deposition proceeds, a connection post 29 is formed as material condenses and deposits on the electrical connection. Material also deposits on the template mask 14 structure, narrowing the opening between the template masks 14, and thus also narrowing the top of the connection post 29 to form a spike (FIGS. 12B-12D, the dashed lines indicate the original pre-deposition template mask 14). Once the connection post 29 is completed, the template mask 14 is removed, for example by laser lift-off or other photolithographic methods. The area of material deposition can be controlled using conventional patterning methods, for example including photoresist deposition, patterning, and stripping.

Figure 13B:
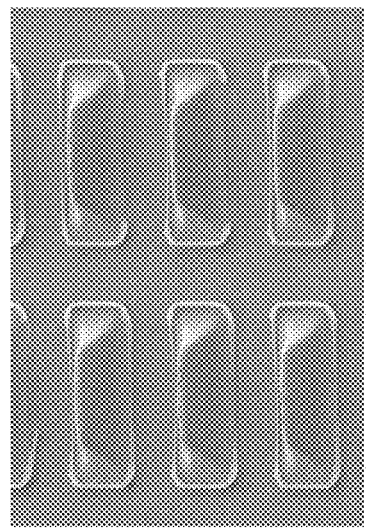
FIGS. 13A-13D are a set of micrographs showing various connection posts made using physical vapor deposition according to embodiments of the present invention.
Figure 13D:
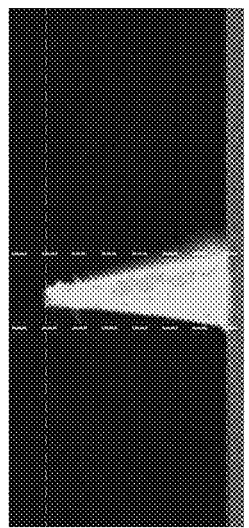
Figure 13A:
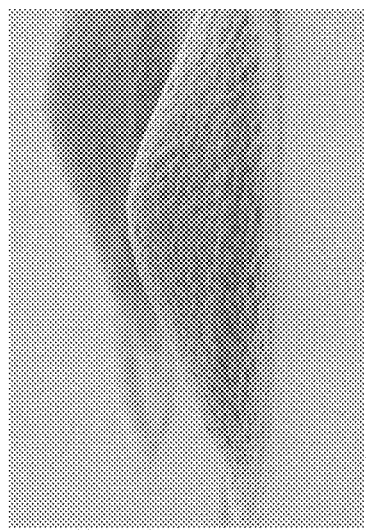
Figure 13C:
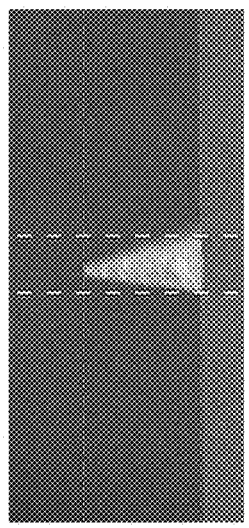

Connection posts 29 constructed using physical vapor deposition are shown in FIGS. 13A-13D. FIGS. 13A and 13B are micrographs of circular and linear connection posts 29, respectively. FIGS. 13C and 13D are cross sections of the connection posts 29, showing a sharp spike with a base diameter of 2.7 µm and a height of 6.4 µm. In certain embodiments, connection posts 29 have a height that is greater than or equal to 2, 4, 10, 20, 50, or 100 times a base dimension (e.g., diameter). Connection posts 29 can have various shapes, such as radially symmetric, linear (blade-like), pyramidal, or ring-shaped depending on the shape of the template mask 14.

Figure 14C:
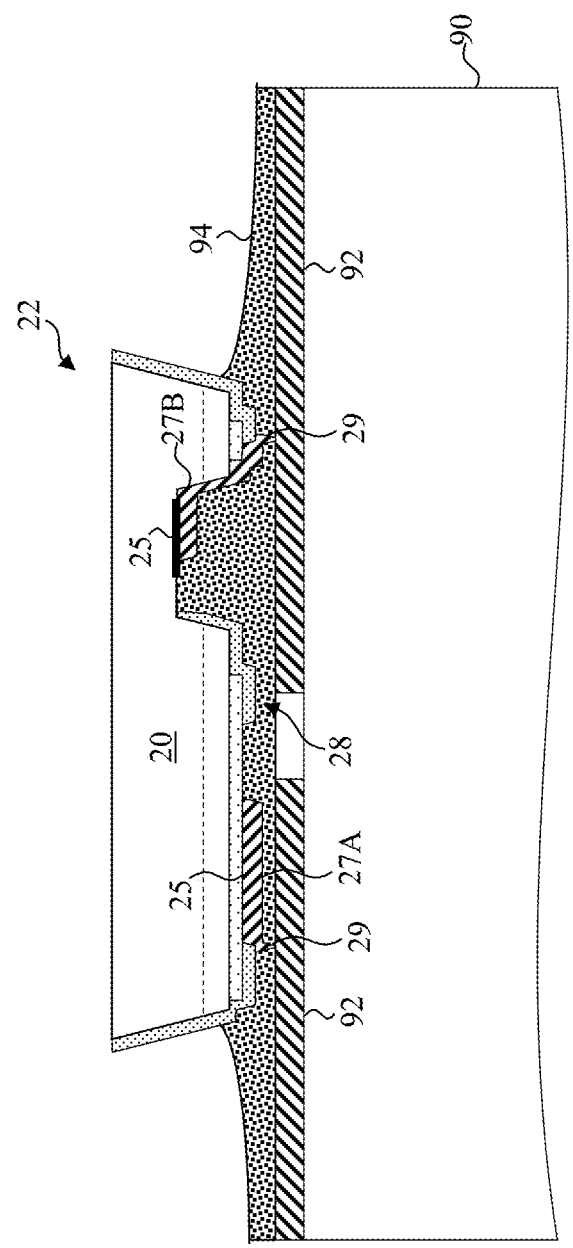
FIG. 14C is a cross section of a micro-device of FIGS. 14A-14B micro-transfer printed onto a destination substrate in some embodiments of the present invention.

Referring to the cross section of FIG. 14A and corresponding plan view of FIG. 14B, the LED micro-device 22 includes a connection post 29 formed by the overlap of the p-metal layer 23 and the electrical contact 25 on the left side, and a connection post 29 formed by the overlap of the patterned dielectric layer 24, the contact 17, and the electrical contact 25 on the right side. FIG. 14C illustrates the micro-device 22 micro-transfer printed to a destination substrate 90 with an adhesive layer 94 adhering the micro-device 22 electrical contacts 25 in electrical contact with the contact pads 92.

Thus, according to some embodiments of the present invention, referring to FIG. 14C, a light-emitting diode structure comprises a destination substrate 90 having two or more contact pads 92 and a semiconductor structure 20 with at least one side 28 and two or more electrical contacts 25 on the side 28. A first electrode 27A is electrically separate from a second electrode 27B. Each of the first and second electrodes 27A, 27B is disposed at least partially on the side 28 and extends from the semiconductor structure 20 a distance greater than any other portion of the micro-transfer printable micro-device 22 to form an electrically conductive connection post 29 electrically connected to an electrical contact 25. The first and second electrodes 27A, 27B are adjacent to the destination substrate 90. The first electrode 27A is electrically connected to one of the contact pads 92 and the second electrode 27B is electrically connected to another of the contact pads 92. By adjacent is meant that the first and second electrodes 27A, 27B are closer to the destination substrate 90 and the contact pads 92 than the semiconductor structure 20 or any other portion of the micro-device 22. By electrically separate is meant that the first and second electrodes 27A, 27B are not directly electrically connected, but could be indirectly electrically connected, for example through the semiconductor layer 20.

Overlapping patterned structures can also be used to construct connection posts 29 on a destination substrate 90 (e.g., as shown in FIG. 1J). FIG. 15 illustrates a destination substrate 90 with a patterned dielectric layer 96 and contact pads 92 extending over a portion of the dielectric layer 96 to form connection posts 29. An adhesive layer 94 is coated over the destination substrate 90 to adhere a micro-device 22 with electrical contacts 25 to the destination substrate 90 in alignment with the contact pads 92. A stamp 80 with a stamp post 82 micro-transfer prints the micro-device 22 to the destination substrate 90. An advantage of this arrangement is that the coated adhesive will, under the influence of gravity, tend to flow away from the connection post 29 peaks, thereby reducing the thickness of the adhesive layer 94 over the connection posts 29 and facilitating an electrical connection through the adhesive layer 94 by micro-transfer printing the micro-devices 22.

Thus, in various embodiments, a completed semiconductor micro-device 22 includes a semiconductor structure with a non-planar surface adjacent to a release layer 30. The completed semiconductor micro-device 22 can include a non-semiconductor structure (e.g., an electrode 27) in contact with the non-planar semiconductor structure surface adjacent to the release layer 30 so that the non-semiconductor structure forms at least a portion of a planar surface for the completed semiconductor micro-device 22. As is shown in FIG. 10A, because electrodes 27A, 27B are in a common plane on a completed semiconductor micro-device 22 and the top or bottom surfaces of the completed semiconductor micro-devices 22 are substantially parallel to a destination substrate 90, the electrodes 27A, 27B can readily make contact with contact pads 92 and destination substrate 90 connection posts 29.

Referring to FIGS. 16 and 17, in some embodiments of the present invention, the completed semiconductor micro-devices 22 of either of FIG. 10C or FIG. 10D is illustrated with the destination substrate 90 onto which the completed semiconductor micro-devices 22 are micro-transfer printed. As shown in FIG. 16, the completed semiconductor micro-devices 22 are micro-transfer printed onto the destination substrate 90 so that the connection posts 29 are aligned with and will pierce or otherwise electrically connect with the contact pads 92 of the destination substrate 90. As is also shown in FIGS. 10B-10E, because connection posts 29 or electrodes 27 extend a common projection distance from a completed semiconductor micro-device 22 and the top or bottom surfaces of the completed semiconductor micro-devices 22 are substantially parallel to a destination substrate 90 (e.g., when printing), the connection posts 29 can readily make contact with contact pads 92 on or in the destination substrate 90.

Thus, in some embodiments of the present invention, a light-emitting diode structure comprises a destination substrate 90 having two or more contact pads 92 and a semiconductor layer 20 with at least one side 28 and two or more electrical contacts 25 on the side. A first electrode 27A is electrically separate from a second electrode 27B; each of the first and second electrodes 27A, 27B is disposed at least partially on the side 28 and extends from the semiconductor structure 20 a distance greater than any other portion of the micro-transfer printable micro-device 22 to form an electrically conductive connection post 29 electrically connected to an electrical contact 25. The first and second electrodes 27A, 27B are adjacent to the destination substrate 90. The first electrode 27A is electrically connected to one of the contact pads 92 and the second electrode 27B is electrically connected to another of the contact pads 92. By adjacent is meant that the first and second electrodes 27A, 27B are closer to the destination substrate 90 and the contact pads 92 than the semiconductor structure 20 or any other portion of the micro-device 22. By electrically separate is meant that the first and second electrodes 27A, 27B are not directly electrically connected, but could be indirectly electrically connected, for example through the semiconductor layer 20.

Referring to the detail of FIG. 17, the completed semiconductor micro-devices 22 (e.g., corresponding to the configuration of FIG. 10B) have top or bottom surfaces that are not substantially parallel to the destination substrate 90 (e.g., after printing) because the connection posts 29 do not project a common distance from the completed semiconductor micro-device 22. However, because the size of the completed semiconductor micro-devices 22 over the destination substrate 90 is relatively large compared to the difference in protrusion distance of the connection posts 29, the completed semiconductor micro-devices 22 can be successfully printed onto the destination substrate 90 and successfully make an electrical connection to the contact pads 92. The completed semiconductor micro-device 22 is only slightly tilted or angled with respect to a surface of the destination substrate 90 (e.g., less than 30 degrees tilted, less than 20 degrees tilted, less than 10 degrees tilted, or less than 5 degrees tilted).

Figure 22:
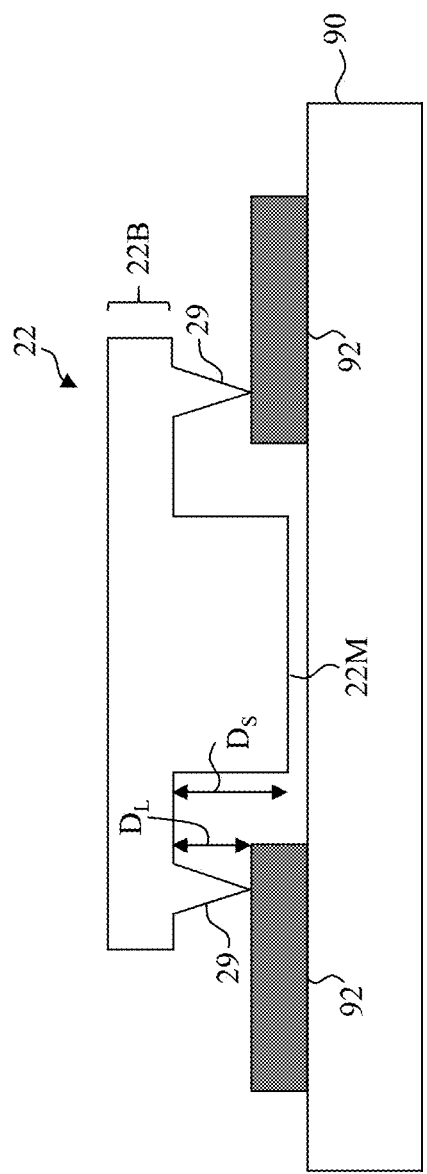
FIG. 22 is a cross section of a micro-device structure according another embodiment of the present invention.

In some embodiments, referring to FIG. 22, a micro-device structure comprises a micro-device 22 having a body portion 22B, at least two electrical connections (connection post 29) that extend a first distance $D_L$ from the body portion 22B, and a mesa portion 22M that extends a second distance $D_S$ greater than the first distance $D_L$ from the body portion 22B. A substrate (destination substrate 90) has at least two contact pads 92, the two contact pads extending a distance from the substrate (destination substrate 90) that is equal to or greater than a difference between the first distance $D_L$ and the second distance $D_S$. Each of the at least two electrical connections (connection posts 29) is in contact with and electrically connected to one of the at least two contact pads 92. The mesa 22M can be between the two electrical connections connection posts 29), can be between two contact pads 92, or can be non-conductive.

Figure 18A:
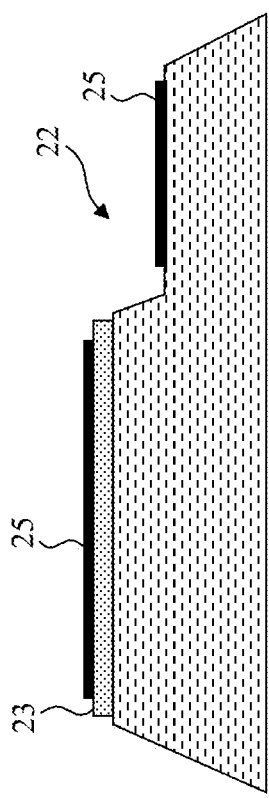
Figure 18B:
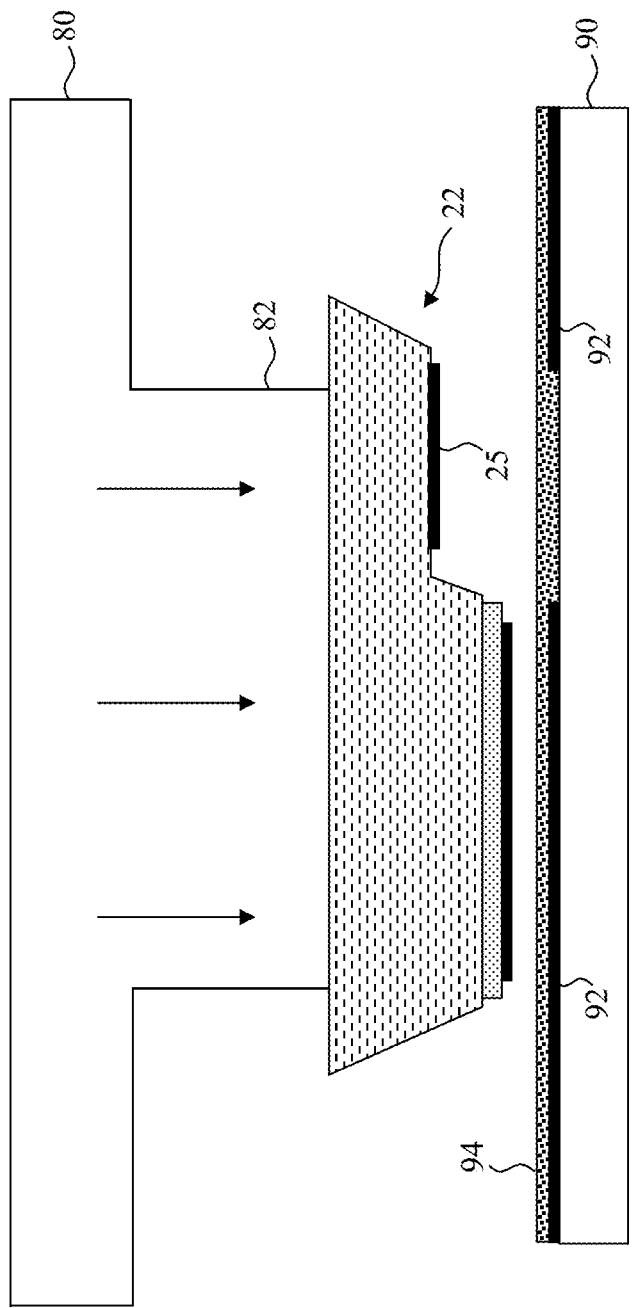
Figure 18C:
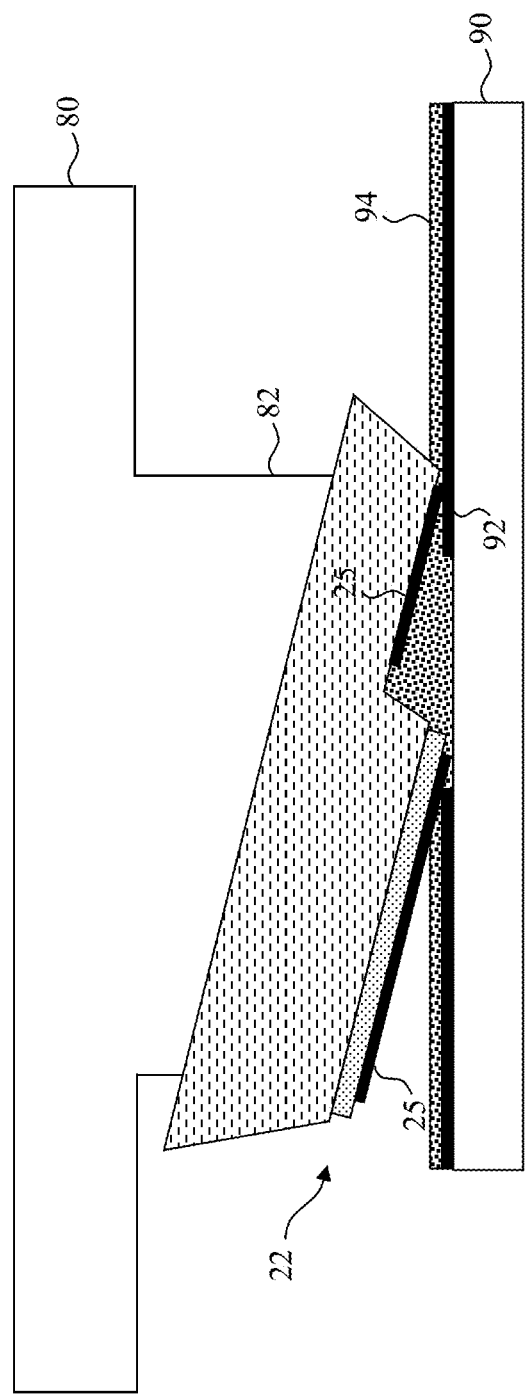
Figure 18D:
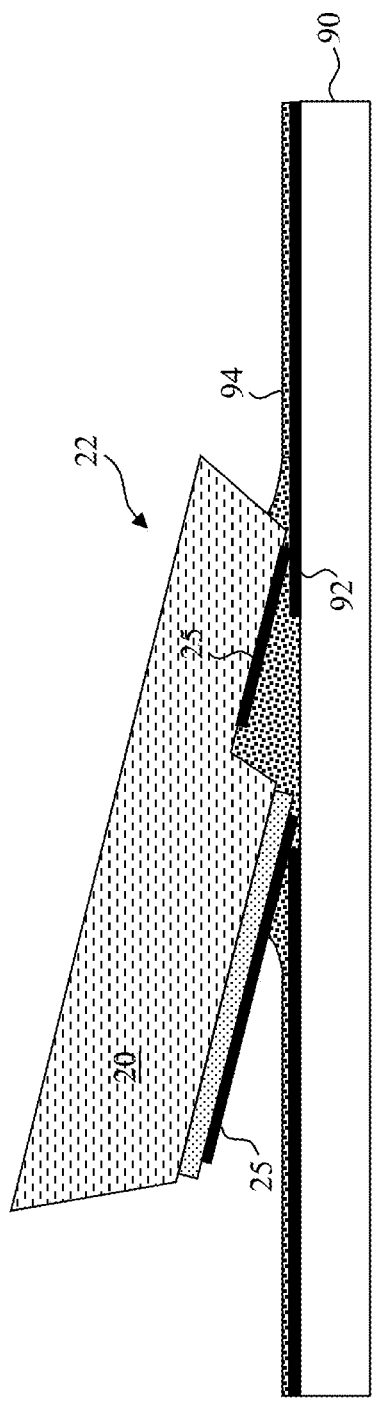

FIGS. 10-17 illustrate some exemplary embodiments of the present invention with connection posts 29 for making micro-transfer printable electrical connections between a micro-device 22 and contact pads 92 on a destination substrate 90. In some embodiments, micro-devices 22 having electrical contacts 25 that are not in a common plane and are without connection posts 29 (FIG. 18A) are micro-transfer printed in an inverted configuration (FIG. 18B) with a stamp 80 and adhered to a destination substrate 90 with contact pads 92 electrically connected to the electrical contacts 25 (FIG. 18C). The stamp 80 is removed and the adhesive 94 cured (FIG. 18D). Referring to FIG. 18E and FIG. 18F, the adhesive 94 is removed from areas other than those of the micro-devices 22, for example with oxygen plasma, before the adhesive is cured. FIG. 18F locates both of the electrical contacts 25 on top of the contact pads 92. An advantage of some such embodiments of the present invention is that micro-devices 22 have exposed semiconductor structures without patterned insulating or dielectric layers 24 can be made with fewer processing steps and transfer printed (e.g., micro-transfer printed) and electrically connected to contact pads 92 on a destination substrate 90, as shown in FIGS. 18A-18D. Thus, according to some embodiments of the present invention, a micro-transfer printed micro-device substrate structure comprises a destination substrate 90 having two or more contact pads 92 disposed on the destination substrate 90 and a micro-transfer printed micro-device 22. The micro-device 22 has a semiconductor structure and at least two electrical contacts 25 disposed in different planes on the semiconductor structure. The electrical contacts 25 are in physical and electrical contact with the contact pads 92. An adhesive layer 94 can be disposed over the destination substrate 90 and in contact with the micro-device 22 so that the micro-device 22 is adhered to the destination substrate 90.

Figure 18G:
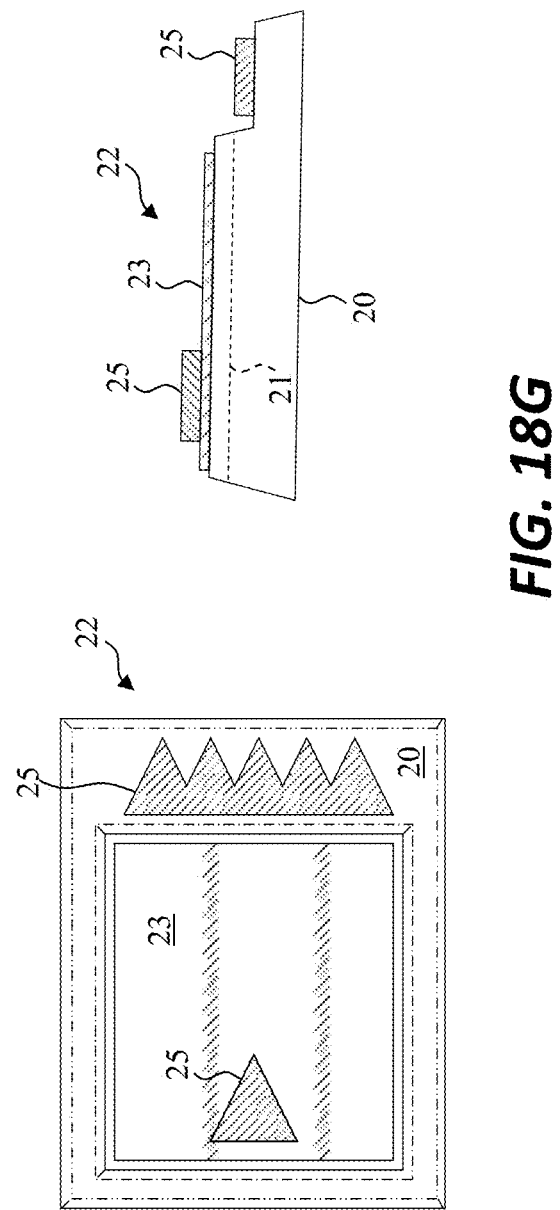
FIG. 18G is a plan view and corresponding cross section of a micro-device having an electrical contact or contact pad according to some embodiments of the present invention.

Because the two electrical contacts 25 or electrodes 27 of the LED micro-device 22 are not in a common plane, the micro-device 22 can rotate on the conformable stamp post 82 when contacting the destination substrate 90 and contact pads 92 (e.g., as shown in FIG. 18C). This rotation can cause a corner of the electrodes 27 or electrical contacts 25 to contact the contact pads 92 or a corner of the contact pads 92 to contact the electrodes 27 or electrical contacts 25 of the micro-device 22, decreasing the contact area and increasing the pressure and thereby improving the electrical contact between the electrodes 27 or electrical contacts 25 and the contact pads 92. In some embodiments of the present invention, either or both of contact pads 92 and electrical contacts 25 or electrodes 27 have a jagged or sawtooth outline to increase one or more of the number of corners, the likelihood of micro-transfer printing onto a corner, and the consequent contact pressure at the corners (e.g., as shown in FIG. 18G, which has a plan view on the left and cross section on the right).

Figure 19A:
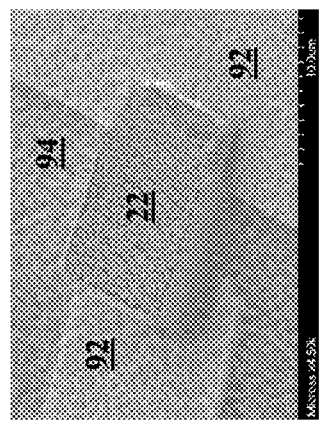
FIGS. 19A-19B are micrographs of the structure illustrated in FIG. 18D.
Figure 19B:
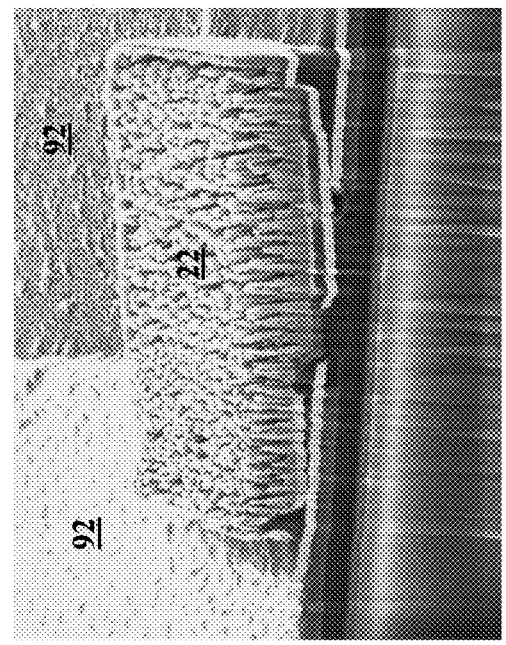

The structure shown in FIG. 18D using an LED micro-device 22 as shown in FIG. 18A without the patterned dielectric layer 24 (e.g., as shown in FIG. 1B) has been constructed and successfully tested. FIGS. 19A and 19B show the inverted micro-device 22 micro-transfer printed to a destination substrate 90 with contact pads 92 in physical and electrical contact with the LED micro-device 22 electrical contacts 25. An adhesive layer 94 adheres the LED micro-device 22 to the destination substrate 90. Electrical power applied to wires electrically connected to the contact pads 92 caused the LED micro-device 22 to emit light.

FIGS. 18-19 illustrate some exemplary embodiments of the present invention with electrical contacts 25 that are not in a common plane. In some embodiments, for example related to FIG. 10A and referring to FIGS. 20A-20D, surfaces at opposing edges of the completed semiconductor micro-device 22 are in a common plane. A first one of the electrical contacts 25 is located at the bottom of a well, pit, or depression in the completed semiconductor micro-device 22 and is electrically connected to a first electrode 27A. A second electrode 27B is in electrical contact with a second electrical contact 25 electrically separate from the first electrical contact 25. The first electrode 27A has a greater height $D_L$ than the height $D_S$ of the second electrode 27B so that exposed portions of the first and second electrodes 27A, 27B together are in a common plane. The electrodes 27 are in contact with and electrically connected to the electrical contacts 25. Exposed portions of the first and second electrodes 27A, 27B are used to make electrical contact to external electrical conductors, such as the contact pads 92 on the destination substrate 90. The first and second electrodes 27A and 27B are separated by a greater distance in FIG. 20B than in FIG. 10A or 20A. Referring to FIG. 20C, the electrodes 27 are both present in a common plane and patterned dielectric structure 24 on the top surface of the completed semiconductor structure 22. In this exemplary embodiment, a first electrical contact 25 is located in a first plane in the completed semiconductor micro-device 22 and is electrically connected to a first electrode 27A and a second electrical contact 25 is located in a second plane different from the first plane and is electrically connected to a second electrode 27B, and the second electrode 27B extends onto the first plane.

Figure 20A:
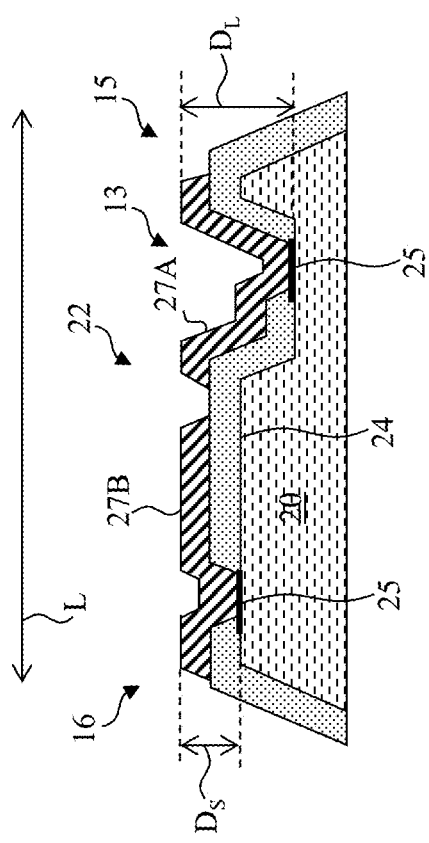
FIGS. 20A-20D are cross sections illustrating a variety of completed semiconductor devices with a corresponding variety of co-planar electrode structures in accordance with embodiments of the present invention.
Figure 20B:
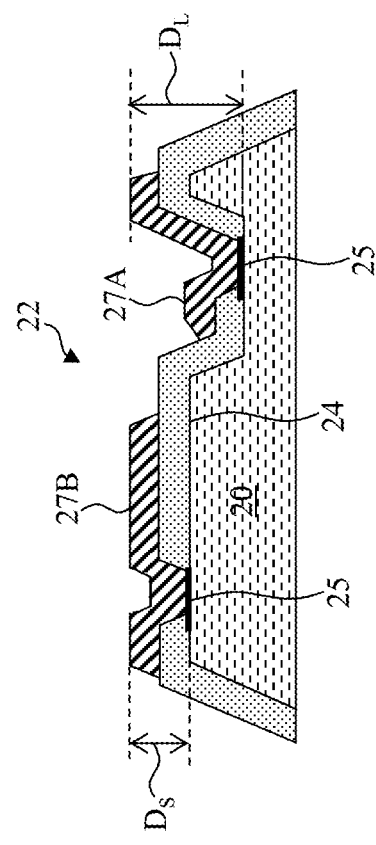
Figure 20C:
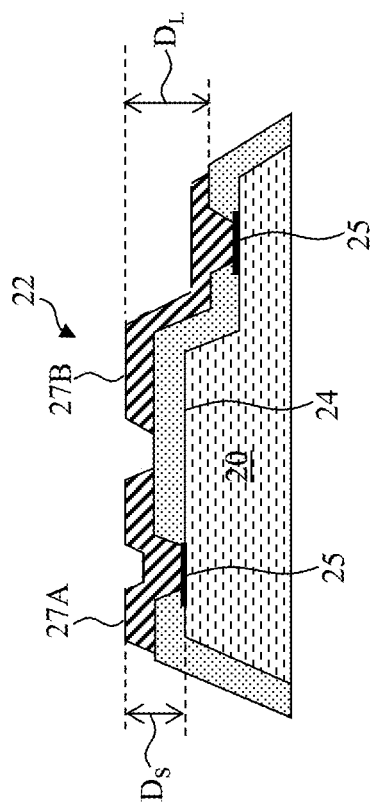
Figure 20D:
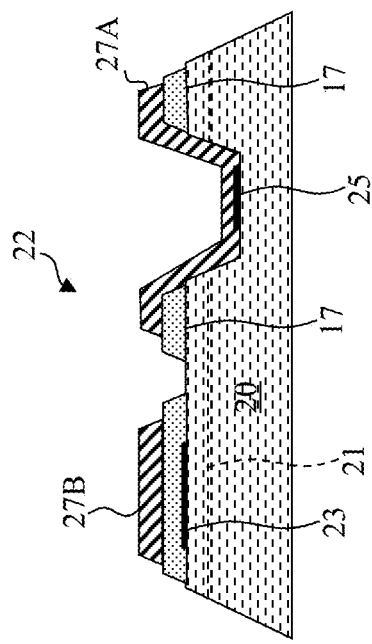
Figure 20E:
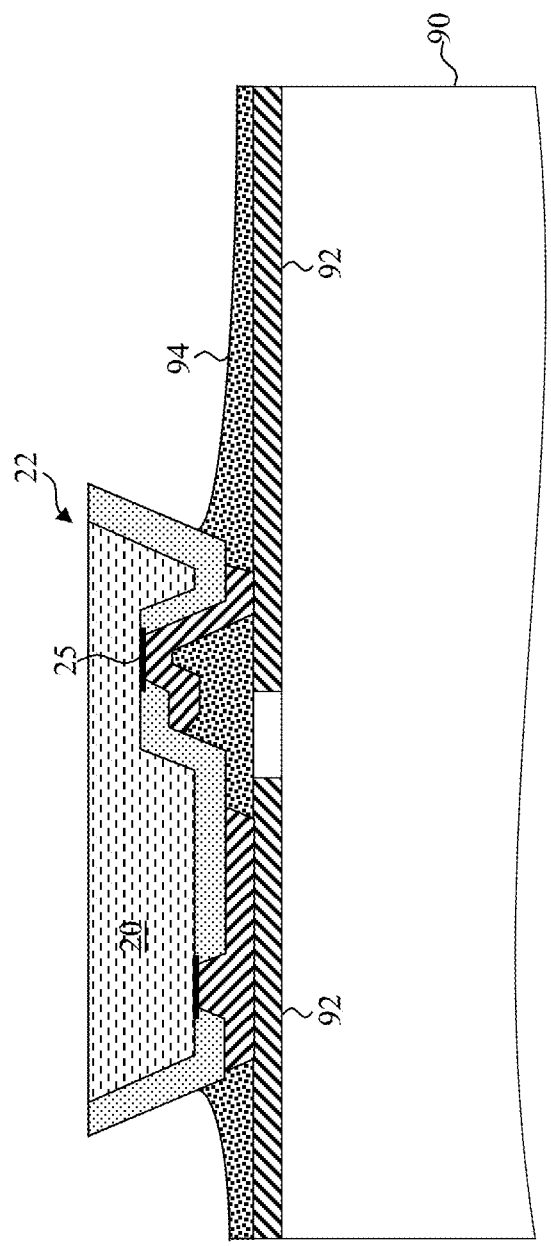
FIG. 20E is a cross section of the FIG. 20B micro-device micro-transfer printed to a destination substrate according to some embodiments of the present invention.

FIG. 20D illustrates a micro-device 22 that does not require a patterned dielectric insulator to protect the semiconductor structure but relies on a high resistance through the semiconductor material to avoid shorts between the electrical contacts 25. FIG. 20E illustrates the structure shown in FIG. 20B micro-transfer printed to a destination substrate 90 in an inverted arrangement, so that the first and second electrodes 27A, 27B are adjacent to the destination substrate 90 and the first electrode 27A is electrically connected to one of the contact pads 92 and the second electrode 27B is electrically connected to another of the contact pads 92. By adjacent is meant that the first and second electrodes 27A, 27B are closer to the destination substrate 90 and the contact pads 92 than the semiconductor structure 20 or any other portion of the micro-device 22. By electrically separate is meant that first and second electrodes 27A, 27B are not directly electrically connected (e.g., shorted), but could be indirectly electrically connected, for example through semiconductor layer 20.

Thus, in some embodiments (e.g., as shown in FIG. 20A), a horizontal light-emitting diode comprises a semiconductor structure 20 extending along a length L greater than a width or thickness having first and second ends 15, 16 at each end of the extent. The first and second ends 15, 16 of the semiconductor structure have a thickness greater than a thin portion 13 of the semiconductor structure 20 between the first and second ends 15, 16. A first electrode 27A is electrically connected to an electrical contact 25 adjacent to the first end 15 and a second electrode 27B is electrically connected to an electrical contact 25 adjacent to the second end 16. By adjacent is meant that no other electrical contact 25 is closer to the first or second end 15, 16 so that the adjacent electrical contact 25 is the closest electrical contact 25. The first and second electrical contacts 25 are at least partially in the same plane. The plane can be parallel to a surface of the semiconductor structure 20, for example a light-emitting surface or the surface on which the first or second electrical contacts 25 are disposed.

The FIGS. 10A-10D and 20A-20E are not necessarily to scale and in some embodiments the first and second electrodes 27A and 27B are separated by relatively greater distances than those illustrated in the Figures.

Figure 21A:
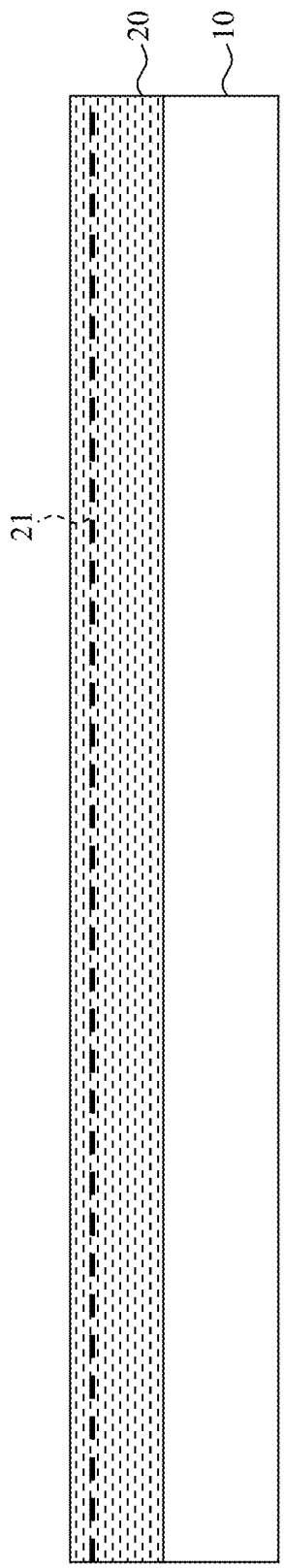
FIGS. 21A-21D are cross sections illustrating a method of making a micro-device according to some embodiments of the present invention.
Figure 21B:
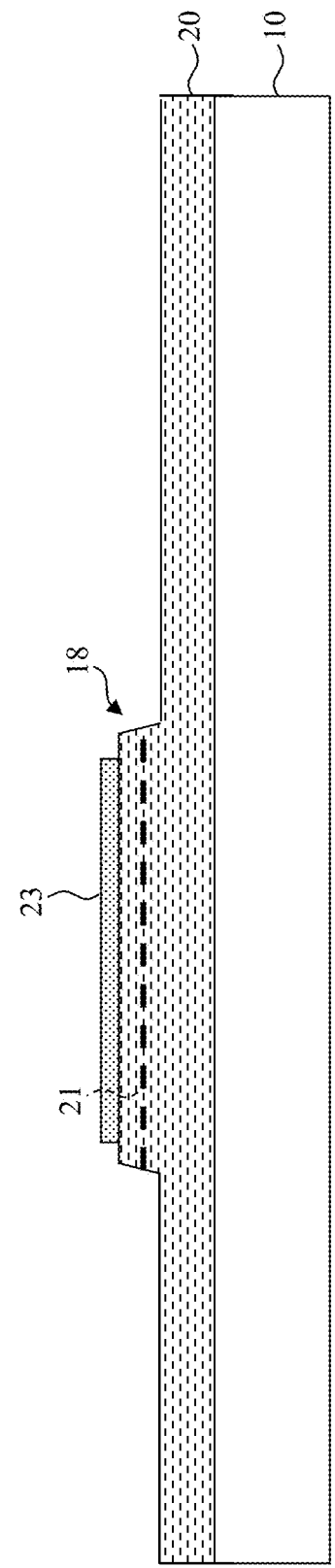
Figure 21C:
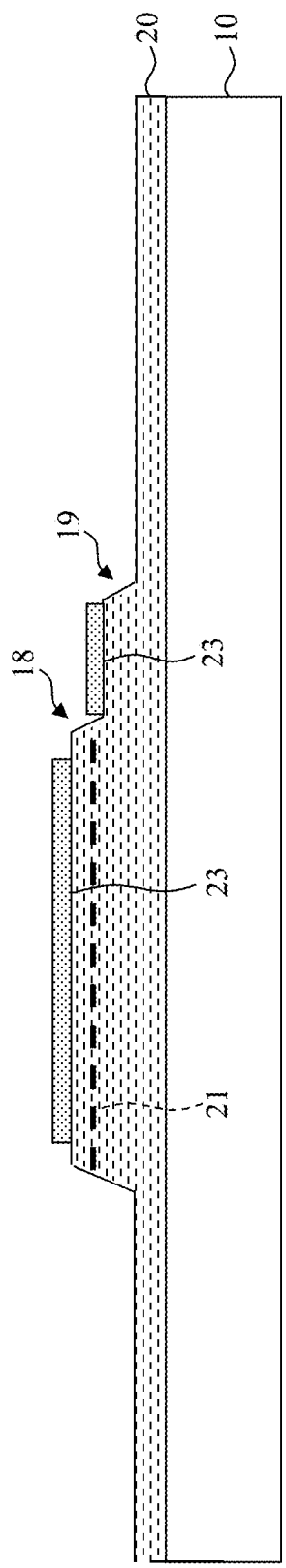
Figure 21D:
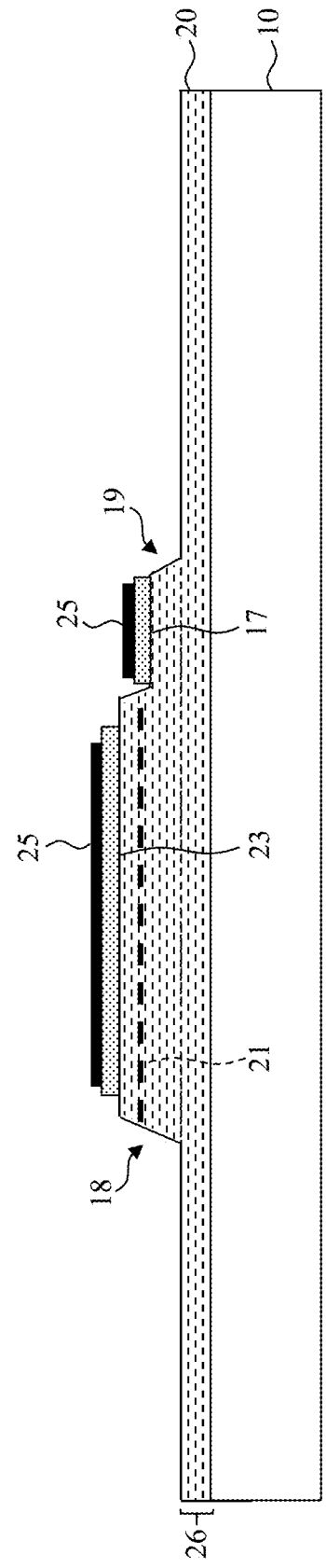

Referring to FIGS. 21A-21D, an LED micro-device 22 can be made by providing a substrate 10 with a semiconductor layer 20 (FIG. 21A and corresponding to FIGS. 1A, 2A, and FIG. 3 steps 100, 105, for example). The semiconductor layer 20 has a p/n junction 21 formed across the semiconductor layer 20, for example made by implanting or doping the semiconductor layer 20 as the semiconductor layer 20 is deposited. As shown in FIG. 21B, the semiconductor layer 20 is patterned to form a first mesa 18 and a patterned p-metal layer 23 is formed on the semiconductor layer 20 first mesa 18. The p-metal layer 23 can be any metal with a suitable work function for injecting holes into the semiconductor layer 20 (an anode) and can also serve as a reflective mirror for any photons generated within the LED micro-device 22. The first mesa 18 and p-metal layer 23 can be formed using photolithographic methods and materials known in the integrated circuit arts. Referring to FIG. 21C, a second mesa 19 is formed in the semiconductor layer 20 and an optional ohmic or reflective contact 17 for injecting electrons into the semiconductor layer 20 (a cathode) is optionally patterned on the semiconductor layer 20. As shown in FIG. 21D, electrical contacts 25 (or electrodes) are then patterned on the p-metal layer 23 and the optional contact 17 (if present) or semiconductor layer 20 (if not present). The electrical contacts 25 provide electrical connection to the LED micro-device 22 and, when supplied with electrical power, cause the LED micro-device 22 to emit light that is reflected by the p-metal layer 23 and, optionally, by the contact 17. In some embodiments, the unpatterned portion of the semiconductor layer 20 serves as the removal layer 26 (also shown in FIG. 2B). The patterning process corresponds to step 110 of FIG. 9 and the process then continues in step 115 and as illustrated in FIG. 2C.

In some embodiments of the present invention, for example as illustrated in FIGS. 18F and 20E, a micro-device and substrate structure comprises a destination substrate 90, one or more contact pads 92 disposed on the destination substrate 90, and a micro-device 22 disposed on or over the destination substrate 90. The micro-device 22 can comprise a device structure 20 (for example, a semiconductor structure 20 as shown in FIG. 20D) and at least one electrical contact 25 disposed on the device structure 20 and located between the destination substrate 90 and the device structure 20. The at least one electrical contact 25 is in direct electrical contact with the one or more contact pads 92. In some embodiments, the at least one electrical contact 25 is in direct physical and electrical contact with the one or more contact pads 92, for example as shown in FIGS. 18A-18F. In some embodiments, an electrode 27 (for example, as shown in FIG. 20D) is electrically connected to each of at least one electrical contact 25 and electrodes 27 are in direct physical and electrical contact with the one or more contact pads 92, for example as shown in FIGS. 20A-20E. A layer 94 of cured adhesive is disposed on the destination substrate 90 adhering the micro-device 22 to the destination substrate 90. The layer 94 of cured adhesive is disposed in direct physical contact with the one or more contact pads 92. In some embodiments, the layer 94 of cured adhesive is in direct physical contact with the at least one electrical contact 25 or in direct physical contact with any electrodes 27 that are in electrical contact with the at least one electrical contact 25.

In some embodiments of the present invention, and as shown in FIGS. 20A-20E, the at least one electrical contact 25 comprises at least two electrical contacts 25 and the at least two electrical contacts 25 are at least partially in a common plane. In some embodiments, the at least two electrical contacts 25 are in different planes, for example as shown in FIGS. 18A-18G. According to some embodiments, at least one electrical contact 25 is disposed between a device structure 20 and a destination substrate 90 (and one or more contact pads 92). Thus, a micro-device 22 can be provided or disposed in a flip-chip configuration, for example as shown in FIGS. 1A-1I and FIGS. 2A-2K. For example, an orientation of a micro-device 22 may be flipped during disposition of the micro-device 22 on a layer 94 of curable adhesive (e.g., relative to an orientation is which the micro-device 22 was formed). In some embodiments, a micro-device 22 is tilted (e.g., relative to a destination substrate 90) (e.g., as a result of being disposed using a flip-chip method). Exemplary tilted micro-devices 22 are shown in FIGS. 18D-18F. A tilted micro-device 22 disposed on or over a destination substrate 90 can have an upper surface that is not substantially parallel to the surface of the destination substrate 90 on or over which the micro-device 22 is disposed.

In certain embodiments of the present invention, a layer 94 of cured adhesive is an electrical insulator. In certain embodiments, a layer 94 of cured adhesive comprises one or more of a thermoset resin, a UV-curable resin, and a cross-linked resin, any one of which can be an electrical insulator.

As shown in FIG. 20E, in some embodiments of the present invention, a layer 94 of cured adhesive surrounds and is in direct physical contact with at least one electrical contact 25. Similarly, in some embodiments of the present invention, a layer 94 of cured adhesive is in direct physical contact with one or more contact pads 92. Thus, in some configurations of the present invention, a layer 94 of cured adhesive covers one or more contact pads 92, at least one electrical contact 25, or both the one or more contact pads 92 and the at least one electrical contact 25, except where the at least one electrical contact 25 is in direct physical contact with the one or more contact pads 92. In some embodiments, a layer 94 of cured adhesive is present on only a portion of one or more contact pads 92, or only a portion of at least one electrical contact 25, or both, for example on only a portion of a surface or on one or more sides of the one or more contact pads 92 and/or the at least one electrical contact 25.

In some embodiments of the present invention, at least one electrical contact 25 is in direct electrical contact with one or more contact pads 92 without the use of any other conductive materials, for example without the use of solder, and the at least one electrical contact 25, or an electrode 27 electrically connected to the at least one electrical contact 25, is in direct physical contact with the one or more contact pads 92 so as to exclude any other materials from the physical contact, for example to exclude the layer 94 of cured adhesive. Thus, in some embodiments, at least one electrical contact 25 comprises an electrically conductive electrical-contact material and one or more contact pads 92 comprise an electrically conductive contact-pad material. In some embodiments, the electrical-contact material and the contact-pad material are the only conductive materials in contact with the at least one electrical contact 25 and the one or more contact pads 92. In some embodiments of the present invention, at least one electrical contact 25 comprises metal, one or more contact pads 22 comprise metal, or both the at least one electrical contact 25 and the one or more contact pads 92 comprise metal.

Each electrical contact 25 of at least one electrical contact 25 can be held in compressive contact with at least one of one or more contact pads 22 by a layer 94 of cured adhesive. Moreover, in some embodiments, a layer 94 of cured adhesive can have a residual tensile stress.

In some embodiments of the present invention, for example as shown in FIGS. 18F and 20E, each of at least one electrical contact 25 is substantially planar, wherein one or more contact pads 92 are each substantially planar, or both. In some embodiments, at least one electrical contact 25 comprises one or more protrusions such as connection posts 29, for example as shown in FIGS. 10A-10D, 16, and 22. Protrusions (e.g., connection posts 29) can extend from a planar portion of at least one electrical contact 25.

Figure 23:
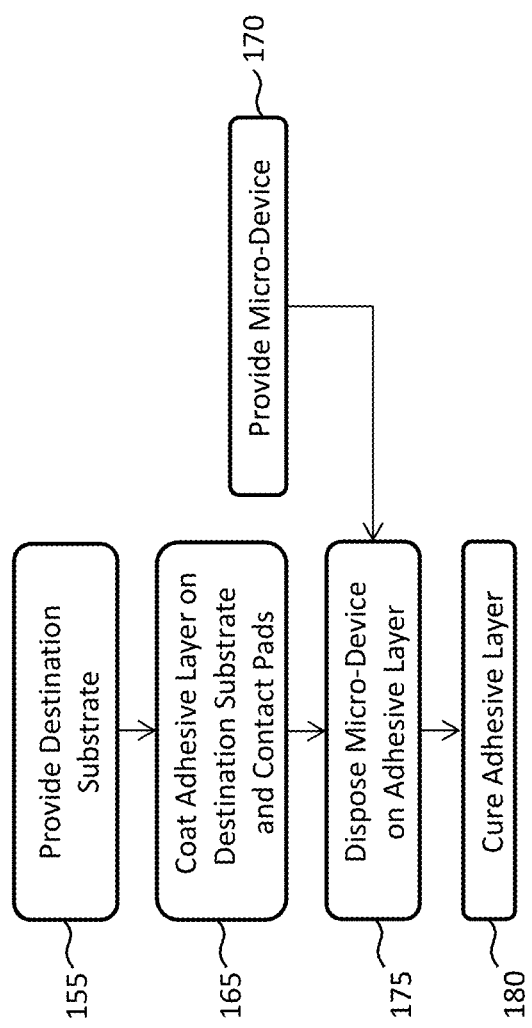
FIG. 23 is a flow diagram illustrating exemplary methods according to certain embodiments of the present invention.

According to some embodiments of the present invention and as illustrated in FIG. 23, a method of making a micro-device and substrate structure comprises providing a destination substrate 90 and one or more contact pads 92 disposed on the destination substrate 90 (step 155, also in FIGS. 3 and 7). In step 165, at least a portion of the destination substrate 92 and the one or more contact pads 92 is coated with a layer 94 of curable adhesive. In some embodiments, all of the one or more contact pads 92 are completely coated with the layer 94 of curable adhesive.

In step 170, a micro-device 22 (e.g., comprising a device structure 20) and at least one electrical contact 25 disposed on the device structure 20 is provided. The micro-device 20 is disposed on the layer 94 of curable adhesive with the at least one electrical contact 25 between the device structure 20 and the destination substrate 90 and with the at least one electrical contact 25 aligned with the one or more contact pads 92 in step 175. In step 180, the layer 94 of curable adhesive is cured to form a layer 94 of cured adhesive thereby directly electrically contacting the at least one electrical contact 25 with the one or more contact pads 92 and physically contacting the at least one electrical contact 25, electrode 27, or protrusion 29 to the one or more contact pads 92.

In some embodiments of the present invention and as shown in FIGS. 1J, 15, 16, 18B, and 18C, a micro-device 22 is disposed by micro-transfer printing (for example with a stamp) or by a die sorter, a die bonder, a pick-and-place machine, or a chip shooter.

In some embodiments of the present invention, curing the layer 94 of curable adhesive shrinks the curable adhesive and pulls the least one electrical contact 25, protrusion 29, or electrode 27 into direct physical and electrical contact with the one or more contact pads 92. Shrinking the curable adhesive can also remove the curable adhesive from between the least one electrical contact 25 and the one or more contact pads 22. The curable adhesive can flow during the curing process, facilitating the movement of the adhesive away from or out of the contact area between the at least one electrical contact 25, protrusion 29, or electrode 27 and the one or more contact pads 92. Curing the layer 94 of adhesive material can be accomplished, for example, by heating the layer 94 of adhesive material or exposing the layer 94 of adhesive material to electromagnetic radiation, such as ultra-violet radiation. In certain embodiments, a layer 94 of curable adhesive can be disposed by, for example, drop-casting, spin-coating, or doctor-blading.

In some embodiments, the p and n layers of the semiconductor layer 20 are reversed and the injection metals chosen to suit the corresponding doped layers.

Transfer printable (e.g., micro-transfer printable) completed semiconductor micro-devices 22 made by methods in accordance with some embodiments of the present invention include a variety of semiconductor structures, including a diode, a light-emitting diode (LED), a laser, a photo-diode, a photo-transistor, a transistor, or an integrated circuit.

Completed semiconductor micro-devices 22 can have a variety of different sizes suitable for micro-transfer printing. For example, the completed semiconductor micro-devices 22 can have at least one of a width from 2 to 5 µm, 5 to 10 µm, 10 to 20 µm, or 20 to 50 µm, a length from 2 to 5 µm, 5 to 10 µm, 10 to 20 µm, or 20 to 50 µm, and a height from 2 to 5 µm, 4 to 10 µm, 10 to 20 µm, or 20 to 50 µm.

Methods of forming micro-transfer printable structures are described, for example, in the paper "AMOLED Displays using Transfer-Printed Integrated Circuits" (Journal of the Society for Information Display, 2011, DOI #10.1889/JSID19.4.335, 1071-0922/11/1904-0335, pages 335-341) and U.S. Pat. No. 8,889,485, referenced above. For a discussion of micro-transfer printing techniques see U.S. Pat. Nos. 8,722,458, 7,622,367 and 8,506,867, of which the disclosure of micro-transfer printing techniques (e.g., methods and structures) in each is hereby incorporated by reference. Micro-transfer printing using compound micro-assembly structures and methods can also be used with certain embodiments of the present invention, for example, as described in U.S. patent application Ser. No. 14/822,868, filed Aug. 10, 2015, entitled Compound Micro Assembly Strategies and Devices, from which the description of compound micro-assembly structures and methods is hereby incorporated by reference. A micro-device 22 can be a compound micro-system or portion thereof (e.g., device thereof). Additional details useful in understanding and performing aspects of some embodiments of the present invention are described in U.S. patent application Ser. No. 14/743,981, filed Jun. 18, 2015, entitled Micro Assembled LED Displays and Lighting Elements, which is hereby incorporated by reference in its entirety.

As is understood by those skilled in the art, the terms "over" and "under" are relative terms and can be interchanged in reference to different orientations of the layers, elements, and substrates included in the present invention. For example, a first layer on a second layer, in some implementations means a first layer directly on and in contact with a second layer. In other implementations, a first layer on a second layer includes a first layer and a second layer with another layer therebetween.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST

A first extent
B second extent
$D_S$ thickness/dimension
$D_L$ thickness/dimension
L length
$W_P$ pocket width/unit cell width
10 source substrate/source wafer
12 pocket
13 thin portion
14 template mask
15 first end
16 second end
17 ohmic/reflective contact
17 first mesa
18 second mesa
19 semiconductor layer/semiconductor structure/device structure
20 p/n junction
22 completed semiconductor structure/micro-device
22B micro-device body
22M micro-device mesa
23 p-metal/mirror
24 dielectric layer
25 electrical contact
26 removal layer
27, 27A, 27B electrode
28 side
29 connection post/protrusion
30 release layer
32 gap
40 bonding layer
42 bonding layer planar side
44 bonding layer non-planar side
50 support substrate
60 base layer
70 electromagnetic radiation
80 stamp
90 stamp post
92 destination substrate
92 contact pad
94 adhesive layer
96 dielectric layer
98 micro-device wafer structure
99 micro-transfer-printing source structure
100 provide source substrate step
102 form pockets in source substrate step
105 dispose semiconductor layer step
110 optional process semiconductor layer step
115 form release layer step
120 optional provide base layer step
125 dispose bonding layer step
130 provide support substrate step
135 bond support substrate step
140 remove source substrate step
150 etch release layer step
155 provide destination substrate step
160 micro-transfer print semiconductor device to destination substrate step
165 coat adhesive layer step
170 provide micro-device step
175 dispose micro-device step
180 cure adhesive layer step

What is claimed:

1. A micro-device and substrate structure, comprising:
   a destination substrate;
   two or more contact pads disposed on the destination substrate;
   a micro-device disposed on or over the destination substrate, the micro-device comprising a device structure and at least two electrical contacts disposed on the device structure between the destination substrate and the device structure, wherein the at least two electrical contacts are in direct electrical contact with the two or more contact pads;
   a layer of cured adhesive disposed on the destination substrate adhering the micro-device to the destination substrate, the layer of cured adhesive disposed in contact with the two or more contact pads,
   wherein the at least two electrical contacts are on a common side of the device structure and in different planes that are parallel to a surface of the device structure opposite the common side and the micro-device is tilted with respect to the surface of the destination substrate.

2. The micro-device and substrate structure of claim 1, wherein the layer of cured adhesive is an electrical insulator.

3. The micro-device and substrate structure of claim 1, wherein the layer of cured adhesive surrounds and is in direct contact with the at least one electrical contact.

4. The micro-device and substrate structure of claim 1, wherein the layer of cured adhesive is in direct contact with the two or more contact pads.

5. The micro-device and substrate structure of claim 1, wherein the layer of cured adhesive covers the two or more contact pads, the at least two electrical contacts, or both the two or more contact pads and the at least two electrical contacts, except where the at least two electrical contacts are in contact with the two or more contact pads.

6. The micro-device and substrate structure of claim 1, wherein the at least two electrical contacts comprise an electrically conductive electrical-contact material and the two or more contact pads comprise an electrically conductive contact-pad material, and wherein the electrical-contact material and the contact-pad material are the only electrically conductive materials in contact with the at least two electrical contacts and the two or more contact pads.

7. The micro-device and substrate structure of claim 1, wherein the at least two electrical contacts comprise a metal, the two or more contact pads comprise a metal, or the at least two electrical contacts and the two or more contact pads both comprise a metal.

8. The micro-device and substrate structure of claim 1, wherein the layer of cured adhesive comprises one or more of a thermoset resin, a UV-curable resin, and a cross-linked resin.

9. The micro-device and substrate structure of claim 1, wherein each electrical contact of the at least two electrical contacts is held in compressive contact with at least one of the two or more contact pads by the layer of cured adhesive.

10. The micro-device and substrate structure of claim 1, wherein the layer of cured adhesive has a residual tensile stress.

11. The micro-device and substrate structure of claim 1, wherein one of the conditions is met: (i) each of the at least two electrical contacts is substantially planar; (ii) each of the two or more contact pads is substantially planar; or (iii) both each of the at least two electrical contacts and each of the two or more contact pads are substantially planar.

12. The micro-device and substrate structure of claim 1, wherein the at least two electrical contacts comprise one or more protrusions.

13. A method of making a micro-device and substrate structure, comprising:
providing a destination substrate and two or more contact pads disposed on the destination substrate;
coating at least a portion of the destination substrate and the two or more contact pads with a layer of curable adhesive;
providing a micro-device comprising a device structure and at least two electrical contacts disposed on the device structure, wherein the at least two electrical contacts are on a common side of the device structure and in different planes that are parallel to a surface of the device structure opposite the common side;
disposing the micro-device on the layer of curable adhesive with the at least two electrical contacts between the device structure and the destination substrate and with the at least two electrical contacts aligned with the two or more contact pads; and
curing the layer of curable adhesive to form a layer of cured adhesive thereby directly electrically contacting the at least one electrical contact with the two or more contact pads, wherein, after the curing, the micro-device is tilted with respect to the surface of the destination substrate.

14. The method of claim 13, wherein the micro-device is disposed by micro-transfer printing.

15. The method of claim 13, wherein the micro-device is disposed by a die sorter, a die bonder, a pick-and-place machine, or a chip shooter.

16. The method of claim 13, wherein curing the layer of curable adhesive shrinks the curable adhesive and pulls the least two electrical contacts into direct electrical contact with the two or more contact pads.

17. The method of claim 13, wherein curing the layer of curable adhesive shrinks the curable adhesive thereby at least partially removing the curable adhesive from between the least two electrical contacts and the two or more contact pads.

18. The method of claim 17, wherein the curable adhesive flows during the curing.

19. The method of claim 13, wherein an orientation of the micro-device is flipped during disposition of the micro-device on the layer of curable adhesive.

* * * * *

UNITED STATES PATENT AND TRADEMARK OFFICE
CERTIFICATE OF CORRECTION

Page 1 of 1

PATENT NO. : 11,024,608 B2
APPLICATION NO. : 16/039191
DATED : June 1, 2021
INVENTOR(S) : Matthew Meitl et al.

It is certified that error appears in the above-identified patent and that said Letters Patent is hereby corrected as shown below:

In the Specification

In the Parts List (at Column 37 Lines 60-61):
Please replace:
"90 stamp post
92 destination substrate"
With:
--82 stamp post
90 destination substrate--

Signed and Sealed this
Tenth Day of August, 2021

Drew Hirshfeld
*Performing the Functions and Duties of the*
*Under Secretary of Commerce for Intellectual Property and*
*Director of the United States Patent and Trademark Office*